United States Patent
Kyung et al.

(10) Patent No.: US 7,814,393 B2
(45) Date of Patent: *Oct. 12, 2010

(54) APPARATUS AND METHOD FOR CODING/DECODING BLOCK LOW DENSITY PARITY CHECK CODE WITH VARIABLE BLOCK LENGTH

(75) Inventors: Gyu-Bum Kyung, Suwon-si (KR); Dong-Seek Park, Yongin-si (KR); Jae-Yoel Kim, Suwon-si (KR); Sung-Eun Park, Seoul (KR); Seung-Hoon Choi, Suwon-si (KR); Hong-Sil Jeong, Seoul (KR); Chi-Woo Lim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1028 days.

This patent is subject to a terminal disclaimer.

(21) Appl. No.: 11/583,472

(22) Filed: Oct. 19, 2006

(65) Prior Publication Data

US 2007/0101246 A1    May 3, 2007

(30) Foreign Application Priority Data

| Oct. 19, 2005 | (KR) | 2005-0098874 |
| Nov. 17, 2005 | (KR) | 2005-0110471 |
| Dec. 8, 2005 | (KR) | 2005-0119775 |

(51) Int. Cl.
    *H03M 13/00*    (2006.01)

(52) U.S. Cl. .................... 714/758; 714/801

(58) Field of Classification Search ............... 714/758, 714/801
See application file for complete search history.

(56) References Cited

U.S. PATENT DOCUMENTS

| 6,539,367 B1* | 3/2003 | Blanksby et al. ........... 706/14 |
| 6,633,856 B2* | 10/2003 | Richardson et al. ........... 706/15 |
| 6,789,227 B2* | 9/2004 | De Souza et al. ........... 714/804 |
| 6,895,547 B2* | 5/2005 | Eleftheriou et al. ......... 714/801 |
| 6,965,652 B1* | 11/2005 | Burd et al. ................. 375/341 |
| 7,000,174 B2* | 2/2006 | Mantha et al. .............. 714/790 |
| 7,000,177 B1* | 2/2006 | Wu et al. .................... 714/801 |
| 7,072,417 B1* | 7/2006 | Burd et al. .................. 375/295 |
| 7,139,959 B2* | 11/2006 | Hocevar ..................... 714/752 |
| 7,516,391 B2* | 4/2009 | Kyung et al. ................ 714/758 |
| 2003/0014718 A1* | 1/2003 | De Souza et al. ........... 714/804 |
| 2005/0246617 A1* | 11/2005 | Kyung et al. ............... 714/801 |

FOREIGN PATENT DOCUMENTS

| KR | 1020050021108 | 3/2005 |
| KR | 1020050118056 | 12/2005 |

* cited by examiner

*Primary Examiner*—M. Mujtaba K Chaudry
(74) *Attorney, Agent, or Firm*—The Farell Law Firm, LLP

(57) ABSTRACT

Disclosed is a device and method for coding a block low density parity check (LDPC) code having a variable length. The a device and method include receiving an information word; and coding the information word into a block LDPC code according to a first parity check matrix or a second parity check matrix depending on a length to be applied when generating the information word into the block LDPC code.

44 Claims, 33 Drawing Sheets

| $P^a{}_{11}$ | $P^a{}_{12}$ | $P^a{}_{13}$ | $P^a{}_{14}$ | $\cdots$ | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | $\cdots$ | $P^a{}_{2(q-1)}$ | $P^a{}_{2q}$ |
| $P^a{}_{31}$ | $P^a{}_{32}$ | $P^a{}_{33}$ | $P^a{}_{34}$ | $\cdots$ | $P^a{}_{3(q-1)}$ | $P^a{}_{3q}$ |
| $\vdots$ | $\vdots$ | $\vdots$ | $\vdots$ | $\cdots$ | $\vdots$ | $\vdots$ |
| $P^a{}_{p1}$ | $P^a{}_{p2}$ | $P^a{}_{p3}$ | $P^a{}_{p4}$ | $\cdots$ | $P^a{}_{p(q-1)}$ | $P^a{}_{pq}$ |

FIG.4
(PRIOR ART)

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$

$$B^T = \begin{bmatrix} p^{a_1} & 0 & \cdots & p^y & \cdots & 0 \end{bmatrix}$$

$$T = \begin{bmatrix} 1 & 0 & 0 & \cdots & 0 & 0 \\ p^{a_2} & 1 & 0 & \cdots & 0 & 0 \\ 0 & p^{a_3} & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & p^{a_{m-1}} & 1 \end{bmatrix}$$

$$E = \begin{bmatrix} 0 & 0 & \cdots & 0 & 0 & 0 & p^{a_m} \end{bmatrix}$$

$$T^{-1} = \begin{bmatrix} 1 & 0 & 0 & \cdots & 0 & 0 & 0 \\ p^{a_2} & 1 & 0 & \cdots & 0 & 0 & 0 \\ p^{2\sim 3} & p^{a_3} & 1 & \cdots & 0 & 0 & 0 \\ \vdots & \vdots & \vdots & \ddots & \vdots & \vdots & \vdots \\ p^{2\sim(m-2)} & p^{3\sim(m-2)} & p^{4\sim(m-2)} & \cdots & 1 & 0 & 0 \\ p^{2\sim(m-1)} & p^{3\sim(m-1)} & p^{4\sim(m-1)} & \cdots & p^{a_{m-1}} & 1 & 0 \end{bmatrix}$$

APPARATUS AND METHOD FOR CODING/DECODING BLOCK LOW DENSITY PARITY CHECK CODE WITH VARIABLE BLOCK LENGTH

PRIORITY

This application claims the benefit under 35 U.S.C. §119 (a) of applications filed in the Korean Intellectual Property Office on Oct. 19, 2005 and assigned Serial No. 2005-98874, on Nov. 17, 2005 and assigned Serial No. 2005-110471, and on Dec. 8, 2005 and assigned Ser. No. 2005-119775, the contents of which are incorporated herein by reference.

BACKGROUND OF THE INVENTION

1. Field of the Invention

The present invention relates generally to a mobile communication system, and in particular, to an apparatus and method for coding/decoding block low density parity check (LDPC) codes.

2. Description of the Related Art

With the rapid development of mobile communication systems, it is necessary to develop technology capable of transmitting bulk data approximating the capacity of a wired network even in a wireless environment. To meet the increasing demand for a high-speed, high-capacity communication system capable of processing and transmitting various data such as image and radio data beyond the traditional voice-oriented service, it is essential to increase the transmission efficiency of a system using an appropriate channel coding scheme to thereby improve the overall system performance. However, the mobile communication system, because of its characteristics, inevitably generates errors during data transmission due to noise, interference and fading according to channel conditions. The generation of errors causes a loss of a great amount of information data.

In order to prevent the loss of the information data due to the generation of errors, various error control schemes are currently in use and are based in part on channel characteristics to thereby improve the reliability of the mobile communication system. The most typical error control scheme uses error correction codes.

FIG. 1 is a diagram illustrating a structure of a transmitter/receiver in a general mobile communication system. Referring to FIG. 1, a transmitter 100 includes an encoder 111, a modulator 113 and a radio frequency (RF) processor 115, and a receiver 150 includes an RF processor 151, a demodulator 153 and a decoder 155.

In the transmitter 100, transmission information data 'u', if generated, is delivered to the encoder 111. The encoder 111 generates a coded symbol 'c' by coding the information data 'u' with a predetermined coding scheme, and outputs the coded symbol 'c' to the modulator 113. The modulator 113 generates a modulation symbol 's' by modulating the coded symbol 'c' with a predetermined modulation scheme, and outputs the modulation symbol 's' to the RF processor 115. The RF processor 115 RF-processes the modulation symbol 's' output from the modulator 113, and transmits the RF-processed signal over the air via an antenna ANT.

The signal transmitted over the air by the transmitter 100 in this way is received at the receiver 150 via its antenna ANT, and is delivered to the RF processor 151. The RF processor 151 RF-processes the received signal, and outputs the RF-processed signal 'r' to the demodulator 153. The demodulator 153 demodulates the RF-processed signal 'r' output from the RF processor 151 using a demodulation scheme corresponding to the modulation scheme applied in the modulator 113, and outputs the demodulated signal 'x' to the decoder 155. The decoder 155 decodes the demodulated signal 'x' output from the demodulator 153 using a decoding scheme corresponding to the coding scheme applied in the encoder 111, and outputs the decoded signal 'û' as finally decoded information data.

In order for the receiver 150 to decode without errors the information data 'u' transmitted by the transmitter 100, there is a need for a high-performance encoder and decoder. Particularly, because a radio channel environment should be taken into consideration because of the characteristics of a mobile communication system, errors that can be generated due to the radio channel environment should be considered more seriously.

The most typical error correction codes include turbo codes and low density parity check (LDPC) codes.

It is well known that the turbo code is superior in performance gain to a convolutional code that is conventionally used for error correction, during high-speed data transmission. The turbo code is advantageous in that it can efficiently correct an error caused by noise generated in a transmission channel, thereby increasing the reliability of the data transmission. The LDPC code can be decoded using an iterative decoding algorithm based on a sum-product algorithm in a factor graph. Because a decoder for the LDPC code uses the sum-product algorithm-based iterative decoding algorithm, it is less complex than a decoder for the turbo code. In addition, the decoder for the LDPC code is easy to implement with a parallel processing decoder, compared with the decoder for the turbo code.

Shannon's channel coding theorem illustrates that reliable communication is possible only at a data rate not exceeding a channel capacity. However, Shannon's channel coding theorem has proposed no detailed channel coding/decoding method for supporting a data rate up to the maximum channel capacity limit. Generally, although a random code having a very large block size exhibits a performance approximating a channel capacity limit of Shannon's channel coding theorem, when a MAP (Maximum A Posteriori) or ML (Maximum Likelihood) decoding method is used, it is actually impossible to implement the decoding method because of its heavy calculation load.

The turbo code was proposed by Berrou, Glavieux and Thitimajshima in 1993, and exhibits a superior performance that approximates a channel capacity limit of Shannon's channel coding theorem. The proposal of the turbo code triggered active research on iterative decoding and graphical expression of codes, and LDPC codes proposed by Gallager in 1962 have been newly spotlighted in the research. Cycles exist in a factor graph of the turbo code and the LDPC code, and it is well known that iterative decoding in the factor graph of the LDPC code, where cycles exist, is suboptimal. Also, it has been experimentally proven that the LDPC code has excellent performance through iterative decoding. The LDPC code known to have the highest performance ever exhibits performances having a difference of only about 0.04 [dB] at a channel capacity limit of Shannon's channel coding theorem at a bit error rate (BER) of $10^{-5}$, using a block size of $10^7$. In addition, although an LDPC code defined in a Galois Field (GF) with q>2, i.e. GF(q), increases in complexity in its decoding process, it is much superior in performance to a binary code. However, there is no satisfactory theoretical description of successful decoding by an iterative decoding algorithm for the LDPC code defined in GF(q).

The LDPC code, proposed by Gallager, is defined by a parity check matrix in which most elements have a value of 0 and minor elements except the elements having the value of 0 have a non-zero value, e.g., a value of 1. In the following description, it will be assumed that a non-zero value is a value of 1.

For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

An LDPC code in which a weight of each column in the parity check matrix is fixed to 'j' and a weight of each row in the parity check matrix is fixed to 'k' as described above, is called a "regular LDPC code." Herein, the term "weight" refers to the number of elements having a non-zero value among the elements constituting the parity check matrix. Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the case of the irregular LDPC code, because the weight of each column and the weight of each row in the parity check matrix are not fixed, i.e. are irregular, the weight of each column in the parity check matrix and the weight of each row in the parity check matrix must be properly adjusted in order to guarantee the superior performance.

With reference to the diagram of FIG. 2, a description will now be made of a parity check matrix of an (8, 2, 4) LDPC code as an example of an (N, j, k) LDPC code.

Referring to FIG. 2, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code illustrated in FIG. 2 becomes a regular LDPC code.

The parity check matrix of the (8, 2, 4) LDPC code has been described so far with reference to FIG. 2. Next, a factor graph of the (8, 2, 4) LDPC code described in connection with FIG. 2 will be described herein below with reference to the diagram of FIG. 3.

Referring to FIG. 3, a factor graph of the (8, 2, 4) LDPC code is comprised of 8 variable nodes of $x_1$ 300, $x_2$ 302, $x_3$ 304, $x_4$ 306, $x_5$ 308, $x_6$ 310, $x_7$ 312 and $x_8$ 314, and 4 check nodes 316, 318, 320 and 322. When an element having a value of 1, i.e. a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long length, that exhibits performance approximating a channel capacity limit of Shannon's channel coding theorem, such as a turbo code, while continuously increasing a block length of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles on a factor graph of an LDPC code should be considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent performance degradation such as an error floor occurring when too many cycles with a short length exist on the factor graph of the LDPC code.

(2) Efficient coding of an LDPC code should be considered.

It is difficult for the LDPC code to undergo real-time coding compared to a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree distribution on a factor graph of an LDPC code should be considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" on a factor graph of an LDPC code refers to a ratio of the number of nodes having a particular degree to the total number of nodes. It has been proven by Richardson that an LDPC code having a particular degree distribution is superior in performance.

With reference to the diagram of FIG. 4, a description will now be made of a parity check matrix of a general block LDPC code.

Before a description of FIG. 4 is given, it should be noted that the block LDPC code is a new LDPC code for which not only efficient coding but also efficient storage and performance improvement of a parity check matrix were considered, and the block LDPC code is an LDPC code extended by generalizing a structure of a regular LDPC code. Referring to FIG. 4, a parity check matrix of the block LDPC code is divided into a plurality of partial blocks, and a permutation matrix is mapped to each of the partial blocks. In FIG. 4, 'P' represents a permutation matrix having an $N_s \times N_s$ size, and a superscript (or exponent) $a_{pq}$ of the permutation matrix P is either $0 \leq a_{pq} \leq N_s - 1$ or $a_{pq} = \infty$.

In addition, 'p' indicates that a corresponding permutation matrix is located in the $p^{th}$ row of the partial blocks of the parity check matrix, and 'q' indicates that a corresponding permutation matrix is located in the $q^{th}$ column of the partial blocks of the parity check matrix. That is, $P^{a_{pq}}$ represents a permutation matrix located in a partial block where the $p^{th}$ row and the $q^{th}$ column of the parity check matrix comprised of a plurality of partial blocks cross each other. That is, 'p' and 'q' represent the number of rows and the number of columns of partial blocks corresponding to an information part in the parity check matrix, respectively.

FIG. 5 is a diagram illustrating the permutation matrix P of FIG. 4. As illustrated in FIG. 5, the permutation matrix P is a square matrix having an $N_s \times N_s$ size, and each of $N_s$ columns constituting the permutation matrix P has a weight of 1 and each of $N_s$ rows constituting the permutation matrix P also has a weight of 1. Herein, although a size of the permutation matrix P is expressed as $N_s \times N_s$, it will also be expressed as $N_s$ because the permutation matrix P is a square matrix.

In FIG. 4, a permutation matrix P with a superscript $a_{pq}=0$, i.e. a permutation matrix $P^0$, represents an identity matrix $I_{N_s \times N_s}$, and a permutation matrix P with a superscript $a_{pq}=\infty$, i.e. a permutation matrix $P^\infty$, represents a zero matrix. Herein, $I_{N_s \times N_s}$ represents an identity matrix with a size $N_s \times N_s$.

In the entire parity check matrix of the block LDPC code illustrated in FIG. 4, because the total number of rows is $N_s \times p$ and the total number of columns is $N_s \times q$ (for $p \leq q$), when the entire parity check matrix of the LDPC code has a full rank, a coding rate can be expressed as Equation (1) regardless of a size of the partial blocks.

$$R = \frac{N_s \times q - N_s \times p}{N_s \times q} = \frac{q-p}{q} = 1 - \frac{p}{q} \quad (1)$$

If $a_{pq} \neq \infty$ for all p and q, the permutation matrixes corresponding to the partial blocks are not zero matrixes, and the partial blocks constitute a regular LDPC code in which the weight value of each column and the weight value of each row in each of the permutation matrixes corresponding to the partial blocks are p and q, respectively. Herein, each of permutation matrixes corresponding to the partial blocks will be referred to as a "partial matrix."

Because (p−1) dependent rows exist in the entire parity check matrix, a coding rate is greater than the coding rate calculated by Equation (1). In the case of the block LDPC code, if a weight position of a first row of each of the partial matrixes constituting the entire parity check matrix is determined, the weight positions of the remaining ($N_s$−1) rows can be determined. Therefore, the required size of a memory is reduced to $1/N_s$ as compared with the case where the weights are irregularly selected to store information on the entire parity check matrix.

As described above, as cycles in the factor graph of the LDPC code become longer, the performance efficiency of the LDPC code increases.

In contrast, as cycles in the factor graph of the LDPC code become shorter, an error correction capability of the LDPC code decreases because performance degradation such as an error floor occurs. That is, when there are many cycles with a short length in a factor graph of the LDPC code, information on a particular node belonging to the cycle with a short length, starting therefrom, returns after a small number of iterations. As the number of iterations increases, the information returns to the corresponding node more frequently, so that the information cannot be correctly updated, thereby causing a deterioration in an error correction capability of the LDPC code.

With reference to the diagram of FIG. 6, a description will now be made of a cycle structure of a block LDPC code, of which a parity check matrix is comprised of 4 partial matrixes. Before a description of FIG. 6 is given, it should be noted that the block LDPC code is a new LDPC code for which not only efficient coding but also efficient storage and performance improvement of a parity check matrix were considered. The block LDPC code is also an LDPC code extended by generalizing a structure of a regular LDPC code. A parity check matrix of the block LDPC code illustrated in FIG. 6 is comprised of 4 partial blocks, a diagonal line represents a position where the elements having a value of 1 are located, and the portions other than the diagonal-lined portions represent positions where the elements having a value of 0 are located. In addition, 'P' represents the same permutation matrix as the permutation matrix described in conjunction with FIG. 5.

In order to analyze a cycle structure of the block LDPC code illustrated in FIG. 6, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix $P^a$.

An element having a value of 1 in a partial matrix $P^b$, located in the same row as the 0-point, will be referred to as a "1-point." For the same reason as the 0-point, the 1-point is located in an $(i+b)^{th}$ column of the partial matrix $P^b$.

Next, an element having a value of 1 in a partial matrix $P^c$, located in the same column as the 1-point, will be referred to as a "2-point." Because the partial matrix $P^c$ is a matrix acquired by shifting respective columns of an identity matrix I to the right with respect to a modulo $N_s$ by c, the 2-point is located in an $(i+b-c)^{th}$ row of the partial matrix $P^c$.

In addition, an element having a value of 1 in a partial matrix $P^d$, located in the same row as the 2-point, will be referred to as a "3-point." The 3-point is located in an $(i+b-c+d)^{th}$ column of the partial matrix $P^d$.

Finally, an element having a value of 1 in the partial matrix $P^a$, located in the same column as the 3-point, will be referred to as a "4-point." The 4-point is located in an $(i+b-c+d-a)^{th}$ row of the partial matrix $P^a$.

In the cycle structure of the LDPC code illustrated in FIG. 6, if a cycle with a length of 4 exists, the 0-point and the 4-point are located in the same position. That is, a relation between the 0-point and the 4-point is defined by Equation (2)

$$i \cong i+b-c+d-a \pmod{N_s}$$

or $$i+a \cong i+b-c+d \pmod{N_s} \quad (2)$$

Equation (2) can be rewritten as Equation (3)

$$a+c \cong b+d \pmod{N_s} \quad (3)$$

As a result, when the relationship of Equation (3) is satisfied, a cycle with a length 4 is generated. Generally, when a 0-point and a 4p-point are first identical to each other, a relation of $i \cong i+p(b-c+d-e) \pmod{N_s}$ is given, and the following relation shown in Equation (4) is satisfied.

$$p(a-b+c-d) \cong 0 \pmod{N_s} \quad (4)$$

In other words, if a positive integer having a minimum value among the positive integers satisfying Equation (4) for a given a, b, c and d is defined as 'p', a cycle with a length of 4p becomes a cycle having a minimum length in the cycle structure of the block LDPC code illustrated in FIG. 6.

In conclusion, as described above, for $(a-b+c-d) \neq 0$, if gcd $(N_s, a-b+c-d)=1$ is satisfied, then $p=N_s$. Herein, the gcd $(N_s, a-b+c-d)$ is the function for calculating the "greatest common divisor" of the integers $N_s$ and $a-b+c-d$. Therefore, a cycle with a length of $4N_s$ becomes a cycle with a minimum length.

A Richardson-Urbanke technique will be used as a coding technique for the block LDPC code. Because the Richardson-Urbanke technique is used as a coding technique, coding complexity can be minimized as the form of a parity check matrix becomes similar to the form of a full lower triangular matrix.

With reference to the diagram of FIG. 7, a description will now be made of a parity check matrix having a form similar to the form of the full lower triangular matrix.

The parity check matrix illustrated in FIG. 7 is different from the parity check matrix having a form of the full lower triangular matrix in the form of the parity part. In FIG. 7, a superscript (or exponent) $a_{pq}$ of the permutation matrix P of an information part is either $0 \leq a_{pq} \leq N_s-1$ or $a_{pq}=\infty$, as described above. A permutation matrix P with a superscript $a_{pq}=0$, i.e. a permutation matrix $P^0$, of the information part represents an identity matrix $I_{N_s \times N_s}$, and a permutation matrix P with a superscript $a_{pq}=\infty$, i.e. a permutation matrix $P^\infty$, represents a zero matrix. In. FIG. 7, 'p' represents the number of rows of partial blocks mapped to the information part, and 'q' represents the number of columns of partial blocks mapped to the parity part. Also, superscripts $a_p$, x and y of the permutation matrixes P mapped to the parity part represent exponents of the permutation matrix P. However, for convenience of explanation, the different superscripts $a_p$, x and y are used to distinguish the parity part from the information part. That is, in FIG. 7, $P^{a_1}$, and $P^{a_p}$ are also permutation matrixes, and the superscripts $a_1$ to $a_p$ are sequentially indexed to partial matrixes located in a diagonal part of the parity part. In addition, $P^x$ and $P^y$ are also permutation matrixes, and for convenience of explanation, they are indexed in a different way to distinguish the parity part from the information part. If a block length of a block LDPC code having the parity check matrix illustrated in FIG. 7 is assumed to be N, the coding complexity of the block LDPC code linearly increases with respect to the block length N (0(N)).

The biggest problem of the LDPC code having the parity check matrix of FIG. 7 is that if a length of a partial block is defined as $N_s$, $N_s$ check nodes whose degrees are always 1 in a factor graph of the block LDPC code are generated. The check nodes with a degree of 1 cannot affect the performance improvement based on iterative decoding. As such, a standard irregular LDPC code based on the Richardson-Urbanke technique does not include a check node with a degree of 1. Therefore, a parity check matrix of FIG. 7 will be assumed as a basic parity check matrix in order to design a parity check matrix such that it enables efficient coding while not including a check node with a degree of 1. In the parity check matrix of FIG. 7 comprised of the partial matrixes, the selection of a partial matrix is a very important factor for a performance improvement of the block LDPC code, so that finding an appropriate selection criterion for the partial matrix also becomes a very important factor.

A description will now be made of a method for designing the parity check matrix of the block LDPC code based on the foregoing block LDPC code.

In order to facilitate a method of designing a parity check matrix of the block LDPC code and a method for coding the block LDPC code, the parity check matrix illustrated in FIG. 7 is assumed to be formed with 6 partial matrixes as illustrated in FIG. 8.

FIG. 8 is a diagram illustrating the parity check matrix of FIG. 7, which is divided into 6 partial blocks. Referring to FIG. 8, a parity check matrix of the block LDPC code illustrated in FIG. 7 is divided into an information part 's', a first parity part $p_1$, and a second parity part $p_2$. The information part 's' represents a part of the parity check matrix, mapped to an actual information word during the process of coding a block LDPC code, like the information part described in conjunction with FIG. 7, but for the convenience of explanation, the information part 's' is represented by different reference letters. The first parity part $p_1$ and the second parity part $p_2$ represent a part of the parity check matrix, mapped to an actual parity during the process of coding the block LDPC code, like the parity part described in conjunction with FIG. 7, and the parity part is divided into two parts.

Partial matrixes A and C correspond to partial blocks A (802) and C (804) of the information part 's', partial matrixes B and D correspond to partial blocks B(806) and D(808) of the first parity part $p_1$, and partial matrixes T and E correspond to partial blocks T(810) and E(812) of the second parity part $p_2$. Although the parity check matrix is divided into 7 partial blocks in FIG. 8, it should be noted that '0' is not a separate partial block and because the partial matrix T corresponding to the partial block T (810) has a full lower triangular form, a region where zero matrixes are arranged on the basis of a diagonal is represented by '0'. A process of simplifying a coding method using the partial matrixes of the information part 's', the first parity part $p_1$ and the second parity part $p_2$ will be described later with reference to FIG. 10.

The partial matrixes of FIG. 8 will now be described herein below with reference to FIG. 9.

FIG. 9 is a diagram illustrating a transpose matrix of the partial matrix B shown in FIG. 8, the partial matrix E, the partial matrix T, and an inverse matrix of the partial matrix T, in the parity check matrix of FIG. 7.

Referring to FIG. 9, a partial matrix $B^T$ represents a transpose matrix of the partial matrix B, and a partial matrix $T^{-1}$ represents an inverse matrix of the partial matrix T. $P^{(k_1 \sim k_2)}$ represents $$\prod_{i=k_i}^{k_2} P^{a_i} = P^{\sum_{i=k_i}^{k_2} a_i}.$$

The permutation matrixes illustrated in FIG. 9, for example, $P^{a_1}$, may be an identity matrix. As described above, if a superscript of the permutation matrix, i.e. $a_1$ is 0, the $P^{a_1}$ will be an identity matrix. Also, if a superscript of the permutation matrix, i.e. $a_1$, increases by a predetermined value, the permutation matrix is cyclic shifted by the predetermined value, so the permutation matrix $P^{a_1}$ will be an identity matrix.

FIG. 10 is a flowchart illustrating a procedure for generating a parity check matrix of a general block LDPC code. Before a description of FIG. 10 is given, it should be noted that in order to generate a block LDPC code, a codeword size and a coding rate of a block LDPC code to be generated must be determined, and a size of a parity check matrix must be determined according to the determined codeword size and coding rate. If a codeword size of the block LDPC code is represented by N and a coding rate is represented by R, a size of a parity check matrix becomes $N(1-R) \times N$. Actually, the procedure for generating a parity check matrix of a block LDPC code illustrated in FIG. 10 is performed only once, because the parity check matrix is initially generated to be suitable for a situation of a communication system, and thereafter, the generated parity check matrix is used.

Referring to FIG. 10, in step 1011, a controller divides a parity check matrix with the size $N(1-R) \times N$ into a total of p×q blocks, including p blocks in a horizontal axis and q blocks in a vertical axis, and then proceeds to step 1013. Because each of the blocks has a size of $N_s \times N_s$, the parity check matrix is comprised of $N_s \times p$ columns and $N_s \times q$ rows. In step 1013, the controller classifies the p×q blocks divided from the parity check matrix into an information part 's', a first parity part $p_1$, and a second parity part $p_2$, and then proceeds to steps 1015 and 1021.

In step 1015, the controller separates the information part 's' into non-zero blocks, or non-zero matrixes, and zero blocks, or zero matrixes according to the degree of distribution for guaranteeing a good performance of the block LDPC code, and then proceeds to step 1017. Because the degree of distribution for guaranteeing a good performance of the block LDPC code has been described above, a detailed description thereof will omitted herein. In step 1017, the controller determines the permutation matrixes $P^{1_{pq}}$ such that a minimum cycle length of a block cycle should be maximized as described above in the non-zero matrix portions in blocks having a low degree from among the blocks determined according to the degree distribution for guaranteeing a good performance of the block LDPC code, and then proceeds to step 1019. The permutation matrixes $P^{a_{pq}}$ should be determined taking into consideration the block cycles of not only the information part 's' but also the first parity part $p_1$ and the second parity part $p_2$.

In step 1019, the controller randomly determines the permutation matrixes $P^{a_{pq}}$ in the non-zero matrix portions in the blocks having a high degree among the blocks determined according to the degree distribution for guaranteeing a good performance of the block LDPC code, and then ends the procedure. Even when the permutation matrixes $P^{a_{pq}}$ to be applied to the non-zero matrix portions in the blocks having a high degree are determined, the permutation matrixes $P^{a_{pq}}$ must be determined by such that a minimum cycle length of a block cycle is maximized, and the permutation matrixes $P^{a_{pq}}$ are determined considering the block cycles of not only the information part 's' but also the first parity part $p_1$ and the second parity part $p_2$. An example of the permutation matrixes $P^{a_{pq}}$ arranged in the information part 's' of the parity check matrix is illustrated in FIG. 7.

In step 1021, the controller divides the first parity part $p_1$ and the second parity part $p_2$ into 4 partial matrixes B, T, D and E, and then proceeds to step 1023. In step 1023, the controller inputs the non-zero permutation matrixes $P^y$ and $P^{a_1}$ to 2 partial blocks among the partial blocks constituting the partial matrix B, and then proceeds to step 1025. The structure for inputting the non-zero permutation matrixes $P^y$ and $P^{a_1}$ to 2 partial blocks among the partial blocks constituting the partial matrix B has been described with reference to FIG. 9.

In step 1025, the controller inputs the identity matrixes I to the diagonal partial blocks of the partial matrix T, inputs the particular permutation matrixes $P^{a_2}, P^{a_3}, \ldots, P^{a_{m-1}}$ to $(i, i+1)^{th}$ partial blocks under the diagonal components of the partial matrix T, and then proceeds to step 1027. The structure for inputting the identity matrixes I to the diagonal partial blocks of the partial matrix T and inputting the particular permutation matrixes $P^{a_2}, P^{a_3}, \ldots, P^{a_{m-1}}$ to $(i, i+1)^{th}$ partial blocks under the diagonal components of the partial matrix T has been described with reference to FIG. 9.

In step 1027, the controller inputs a permutation matrix $P^x$ to the partial matrix D, and then proceeds to step 1029. In step 1029, the controller inputs a permutation matrix $P^{a_m}$ to only the last partial block in the partial matrix E, and then ends the procedure. The structure for inputting the 2 permutation matrixes $P^{a_m}$ to only the last partial block among the partial blocks constituting the partial matrix E has been described with reference to FIG. 9.

SUMMARY OF THE INVENTION

As described above, it is known that LDPC codes, together with turbo codes, have high performance gain during high-speed data transmission and effectively correct errors caused by noise generated in a transmission channel, contributing to an increase in the reliability of the data transmission. However, LDPC codes are disadvantageous in terms of coding rate, because LDPC codes have a relatively high coding rate, and are limited in terms of coding rate. Among the currently available LDPC codes, the major LDPC codes have a coding rate of ½ and only minor LDPC codes have a coding rate of ⅓. The limitation in the coding rate exerts a fatal influence on the high-speed, high-capacity data transmission. Of course, although a degree of distribution representing the best performance can be calculated using a density evolution scheme in order to implement a relatively low coding rate for LDPC codes, it is difficult to implement an LDPC code having a degree distribution representing the best performance due to various restrictions, such as a cycle structure in a factor graph and hardware implementation.

It is, therefore, an object of the present invention to provide an apparatus and method for coding/decoding an LDPC code having a variable block length in a mobile communication system;

It is another object of the present invention to provide an apparatus and method for coding/decoding an LDPC code having a variable block length, and a coding complexity which is minimized, in a mobile communication system.

According to one aspect of the present invention, there is provided an apparatus for transmitting a signal in a communication system using an LDPC code. The apparatus includes a controller for determining the number of '0's to be inserted in information data according to a first coding rate to be applied when generating the information data into an LDPC code, and determining the number of '0's to be removed from the LDPC code, a '0' inserter for inserting '0' in the information data under the control of the controller, an LDPC encoder for generating the LDPC code by encoding the '0'-inserted signal according to a first parity check matrix, and a '0' remover for removing the inserted '0' from the LDPC code.

According to another aspect of the present invention, there is provided a method for coding a block low density parity check (LDPC) code having a variable length. The method includes receiving an information word, coding the information word into a block LDPC code based on one of a first parity check matrix and a second parity check matrix depending on a length to be applied when generating the information word into the block LDPC code, wherein additional parity check matrices, based on the form of each of the first parity check matrix and the second parity check matrix, are generated by permutation of each of the first parity check matrix and the second parity check matrix.

According to another aspect of the present invention, there is provided an apparatus for decoding a block low density parity check (LDPC) code having a variable length. The apparatus includes a receiver for receiving a signal, a decoder for selecting one of a first parity check matrix and a second parity check matrix according to a length of a block LDPC code to be decoded, and decoding the received signal according to the selected parity check matrix thereby detecting the block LDPC code, wherein additional parity check matrices, based on the form of each of the first parity check matrix and the second parity check matrix, are generated by permutation of each of the first parity check matrix and the second parity check matrix.

According to another aspect of the present invention, there is provided a method for decoding a block low density parity check (LDPC) code having a variable length. The method includes receiving a signal, selecting one of a first parity check matrix and a second parity check matrix according to a length of a block LDPC code to be decoded, and decoding the received signal according to the selected parity check matrix thereby detecting the block LDPC code, wherein additional parity check matrices, based on the form of each of the first parity check matrix and the second parity check matrix, are generated by permutation of each of the first parity check matrix and the second parity check matrix.

BRIEF DESCRIPTION OF THE DRAWINGS

The above and other objects, features and advantages of the present invention will become more apparent from the following detailed description when taken in conjunction with the accompanying drawings in which:

FIG. 4 is a diagram illustrating a parity check matrix of a general block LDPC code;

FIG. 5 is a diagram illustrating the permutation matrix P of FIG. 4;

Figure 7:
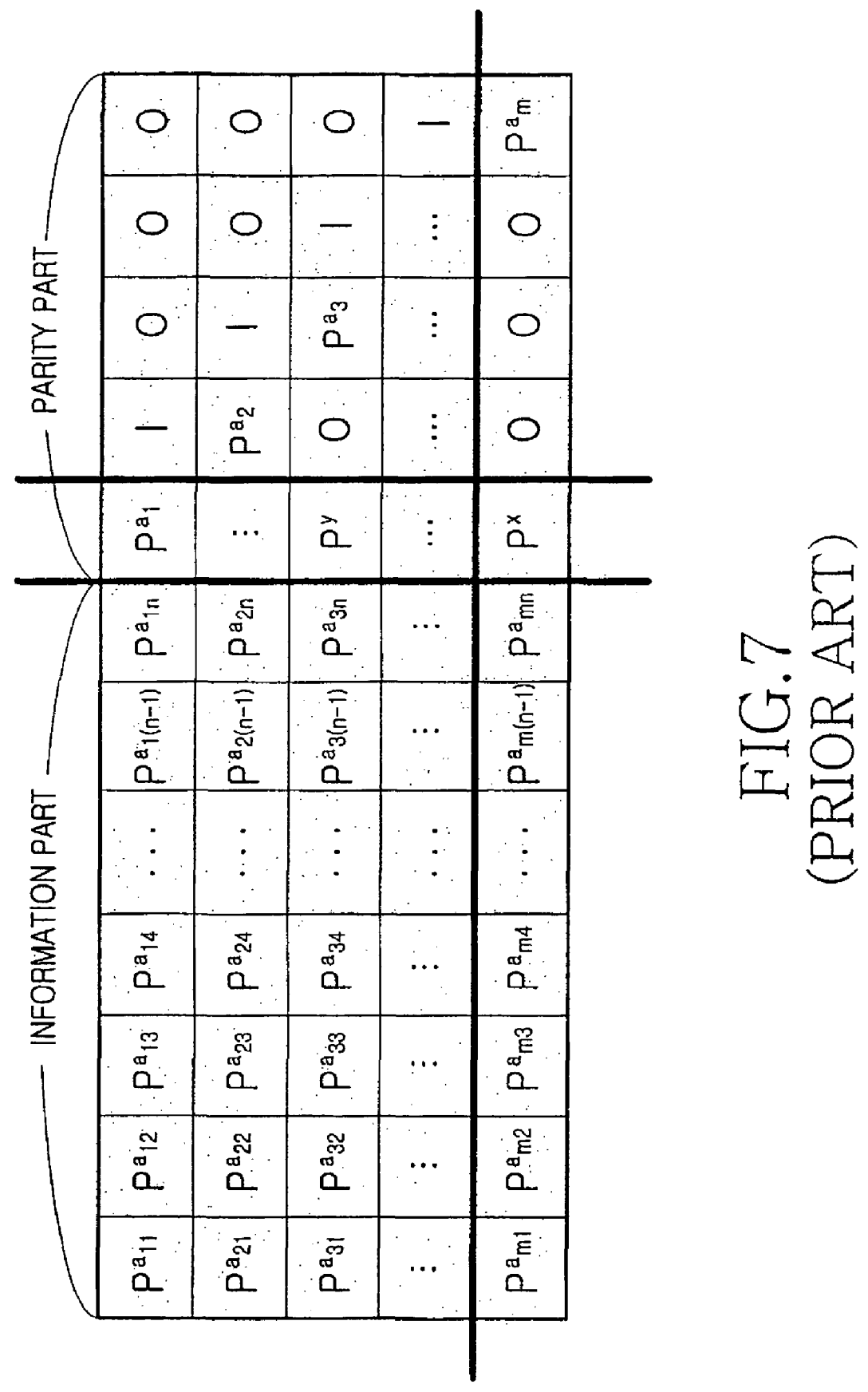

FIG. 7 is a diagram illustrating a parity check matrix having a form similar to the form of a full lower triangular matrix;

FIG. 9 is a diagram illustrating a transpose matrix of a partial matrix B shown in FIG. 8, a partial matrix E, a partial matrix T, and an inverse matrix of the partial matrix T;

FIG. 14 is a diagram illustrating a parity check matrix of a variable-length block LDPC code according to a fourth embodiment of the present invention;

FIG. 18 is a diagram illustrating a parity check matrix of a variable-length block LDPC code according to a fifth embodiment of the present invention;

FIG. 20 is a diagram illustrating a parity check matrix of a variable-length block LDPC code according to a seventh embodiment of the present invention;

FIG. 21 is a diagram illustrating a parity check matrix of a variable-length block LDPC code according to a eighth embodiment of the present invention;

FIG. 25 is a diagram illustrating a parity check matrix of a variable-length block LDPC code according to a twelfth embodiment of the present invention;

FIG. 28 is a diagram illustrating a parity check matrix of a variable-length block LDPC code according to a fifteenth embodiment of the present invention;

FIG. 30 is a diagram illustrating a parity check matrix of a variable-length block LDPC code according to a seventeenth embodiment of the present invention;

FIG. 31 is a diagram illustrating a parity check matrix of a variable-length block LDPC code according to a eighteenth embodiment of the present invention;

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for the sake of clarity and conciseness.

Figures 1, 2:
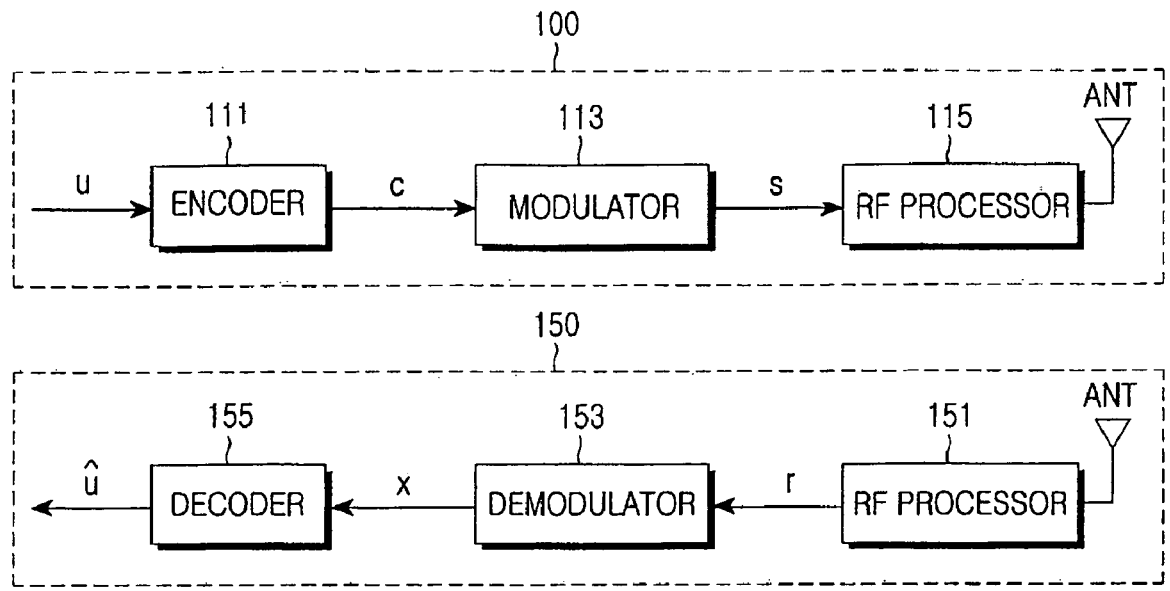
FIG. 1 is a block diagram illustrating a structure of a transmitter/receiver in a general mobile communication system.
FIG. 2 is a diagram illustrating a parity check matrix of a general (8, 2, 4) LDPC code.
Figure 3:
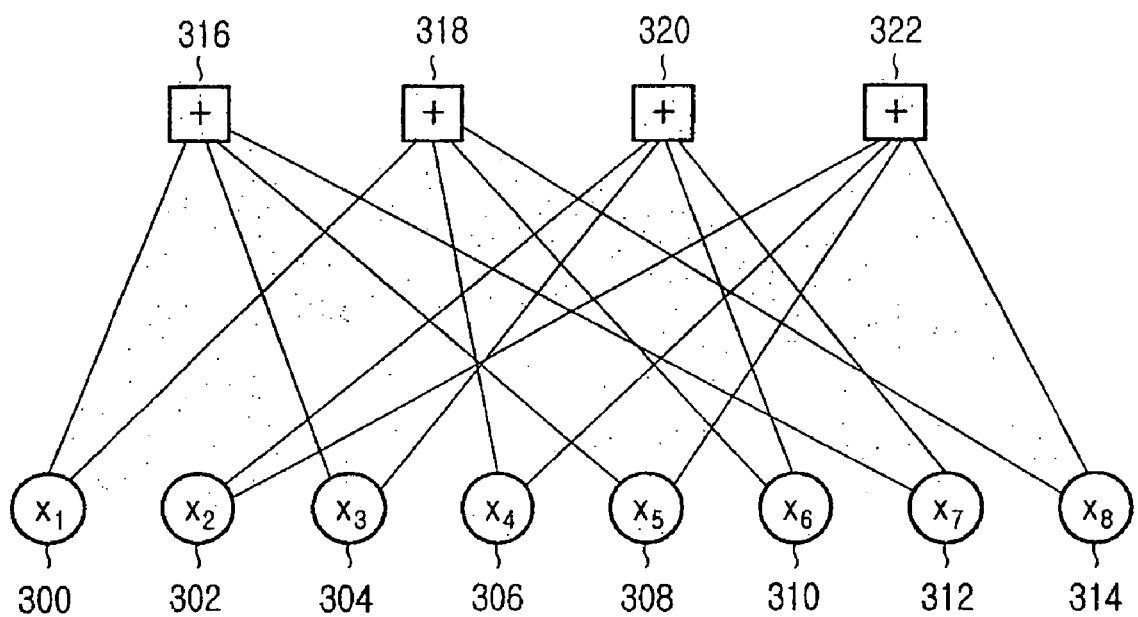
FIG. 3 is a diagram illustrating a factor graph of the (8, 2, 4) LDPC code of FIG. 2.
Figure 6:
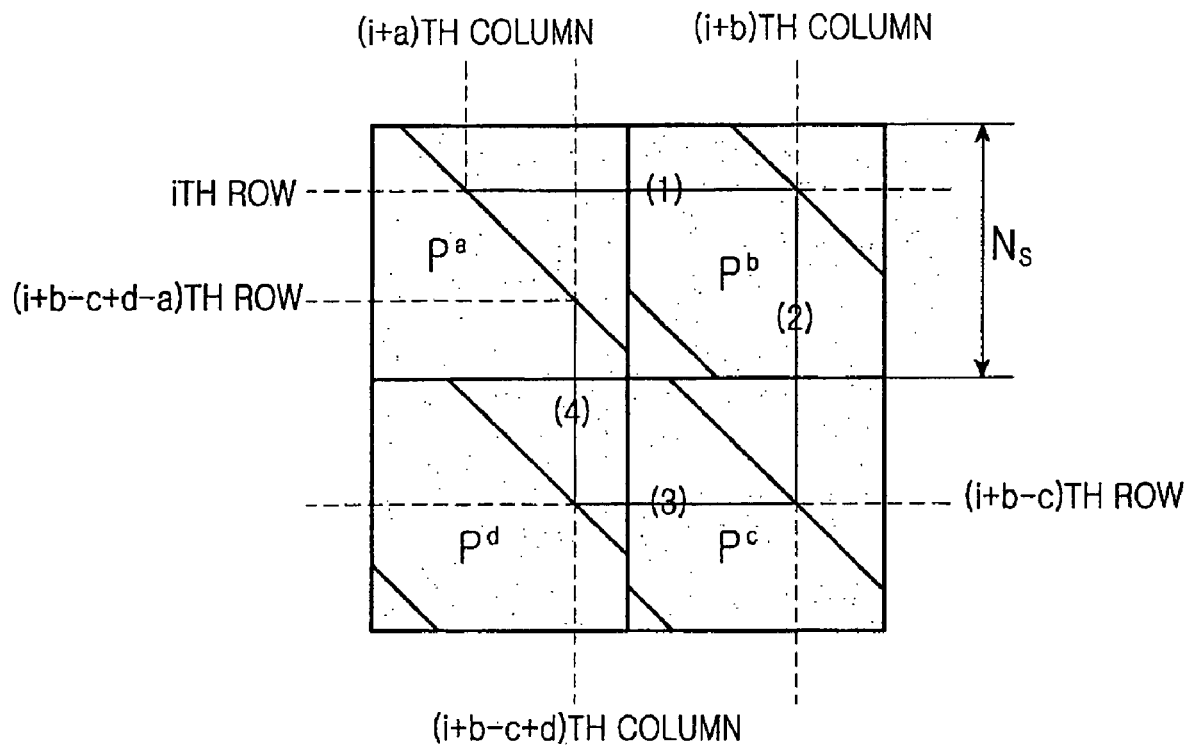
FIG. 6 is a diagram illustrating a cycle structure of a block LDPC code of which a parity check matrix is comprised of 4 partial matrixes.

The present invention provides an apparatus and method for coding and decoding a block low density parity check (LDPC) code having a variable length (a variable-length block LDPC code). That is, the present invention provides an apparatus and method for coding and decoding a variable-length block LDPC code in which a length of a minimum cycle in a factor graph of a block LDPC code is maximized, the coding complexity of the block LDPC code is minimized, a degree distribution in the factor graph of the block LDPC code has an optimal value of 1, and the variable block lengths are supported. Although not separately described herein, the coding and decoding apparatus for a variable-length block LDPC code according to the present invention can be applied to the transmitter/receiver described with reference to FIG. 1.

The next generation mobile communication system has evolved into a packet service communication system, and the packet service communication system, which is a system for transmitting burst packet data to a plurality of mobile stations, has been designed to be suitable for high-capacity data transmission. In order to increase the data throughput, a Hybrid Automatic Retransmission reQuest (HARQ) scheme and an Adaptive Modulation and Coding (AMC) scheme have been proposed. As the HARQ scheme and the AMC scheme support a variable coding rate, there is a need for block LDPC codes having various block lengths.

The design of the variable-length block LDPC code, like the design of a general LDPC code, is implemented through the design of a parity check matrix. However, in a mobile communication system, in order to provide a variable-length block LDPC code with one coder-decoder (CODEC), i.e. in order to provide block LDPC codes having various block lengths, the parity check matrix should include parity check matrixes capable of representing block LDPC codes having different block lengths. A description will now be made of a parity check matrix of a block LDPC code providing a variable block length.

First, a block LDPC code having a minimum length required in the system is designed for a desired coding rate. In the parity check matrix, if $N_s$ (indicating a size of its partial matrix) is increased, a block LDPC code having a long block length is generated. The "partial matrix," as described above, refers to a permutation matrix corresponding to each of partial blocks obtained by dividing the parity check matrix into a plurality of partial blocks. Assuming that the block LDPC code is extended in such a manner that a block LDPC code with a short length is first designed and then a block LDPC code with a long length is designed because an increase in the size $N_s$ of the partial matrix leads to a modification in the cycle structure, the exponents of the permutation matrixes of the parity check matrix are selected such that a cycle length should be maximized. Herein, a size of the partial matrix being $N_s$ means that the partial matrix is a square matrix having a size of $N_s \times N_s$, and for convenience of description, the size of the partial matrix is represented by $N_s$.

For example, assuming that a partial block size of a basic block LDPC code is $N_s=2$, when it is desired to extend the basic block LDPC code with $N_s=2$ to a block LDPC code with $N_s=4$, which is 2 times longer in length than the basic block LDPC code, a partial matrix, an exponent of which is 0, in a permutation matrix, can select a value of 0 or 2 if its length increases from $N_s=2$ to $N_s=4$. Among the two values, a value capable of maximizing the cycle should be selected. Likewise, in a block LDPC code with $N_s=2$, a partial matrix with an exponent of 1 can select a value of 1 or 3 if its length increases from $N_s=2$ to $N_s=4$.

As described above, it is possible to design a block LDPC code having maximum performance for each block length by designing a block LDPC code using the basic block LDPC code while increasing a value $N_s$. In addition, one random block LDPC code among block LDPC codes having various lengths can be defined as a basic block LDPC code, contributing to an increase in memory efficiency. A description will now be made of a method for generating a parity check matrix of the variable-length block LDPC code. The present invention provides 4 types of parity check matrixes for the variable-length block LDPC code according to coding rates, and the coding rates taken into consideration in the present invention include ½, ⅔, ¾ and ⅚.

Figure 8:
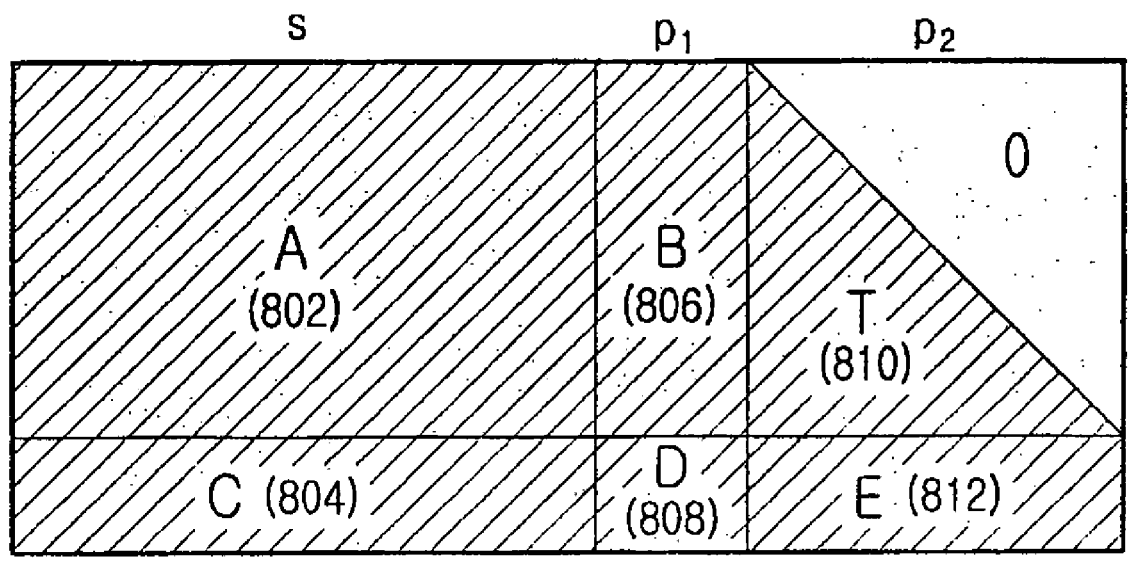
FIG. 8 is a diagram illustrating the parity check matrix of FIG. 7 which is divided into 6 partial blocks.
Figure 10:
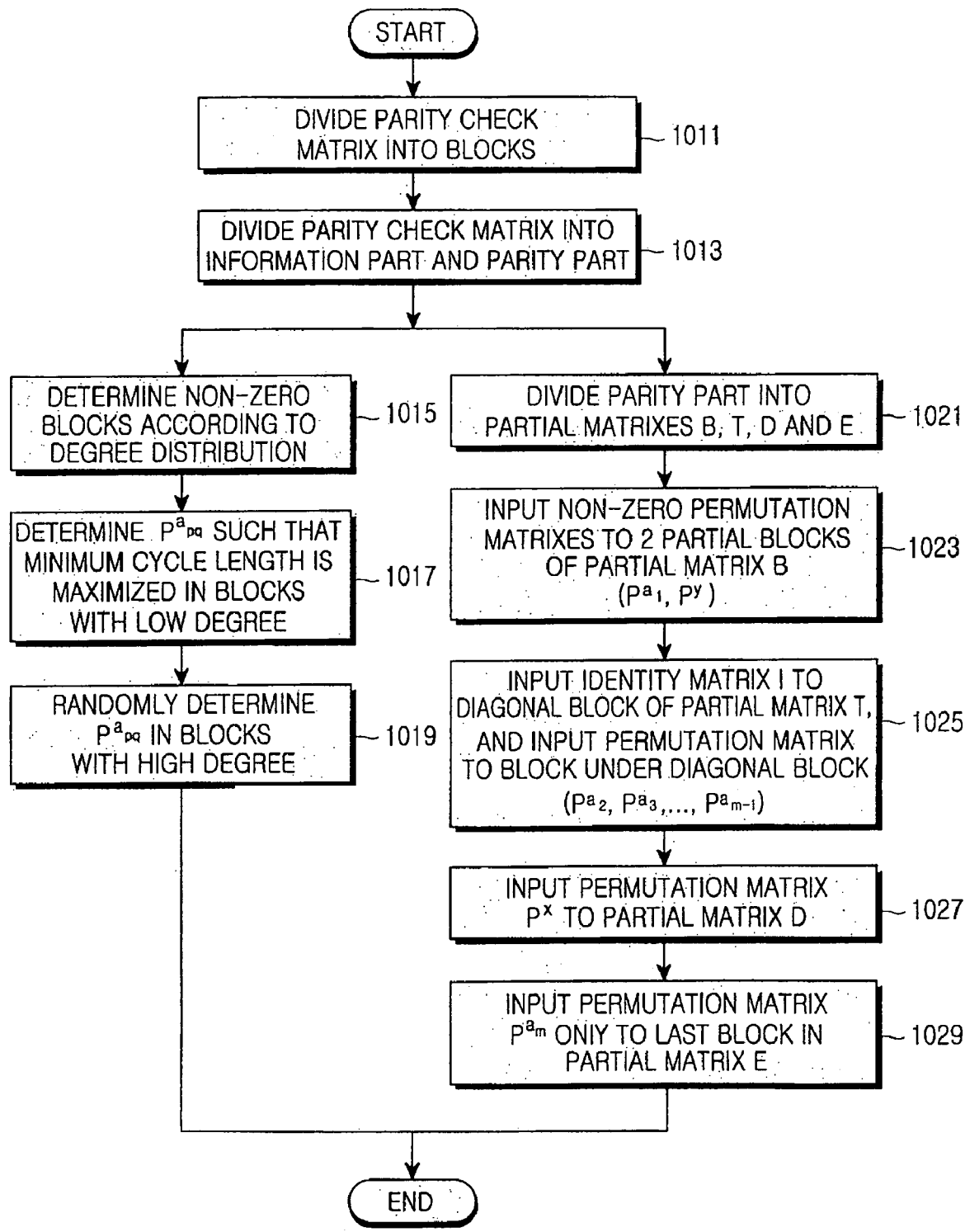
FIG. 10 is a flowchart illustrating a procedure for generating a parity check matrix of a general block LDPC code.

Before a description of the parity check matrixes of the variable-length block LDPC code for the coding rates ½, ⅔, ¾ and ⅚ is given, a process of coding a variable-length block LDPC code using a parity check matrix designed in the present invention will now be described with reference to the flowchart of FIG. 15. Before a description of FIG. 15 is given, it is assumed that a parity check matrix for the variable-length block LDPC code is comprised of 6 partial matrixes as described above with reference to FIG. 8.

Figure 15:
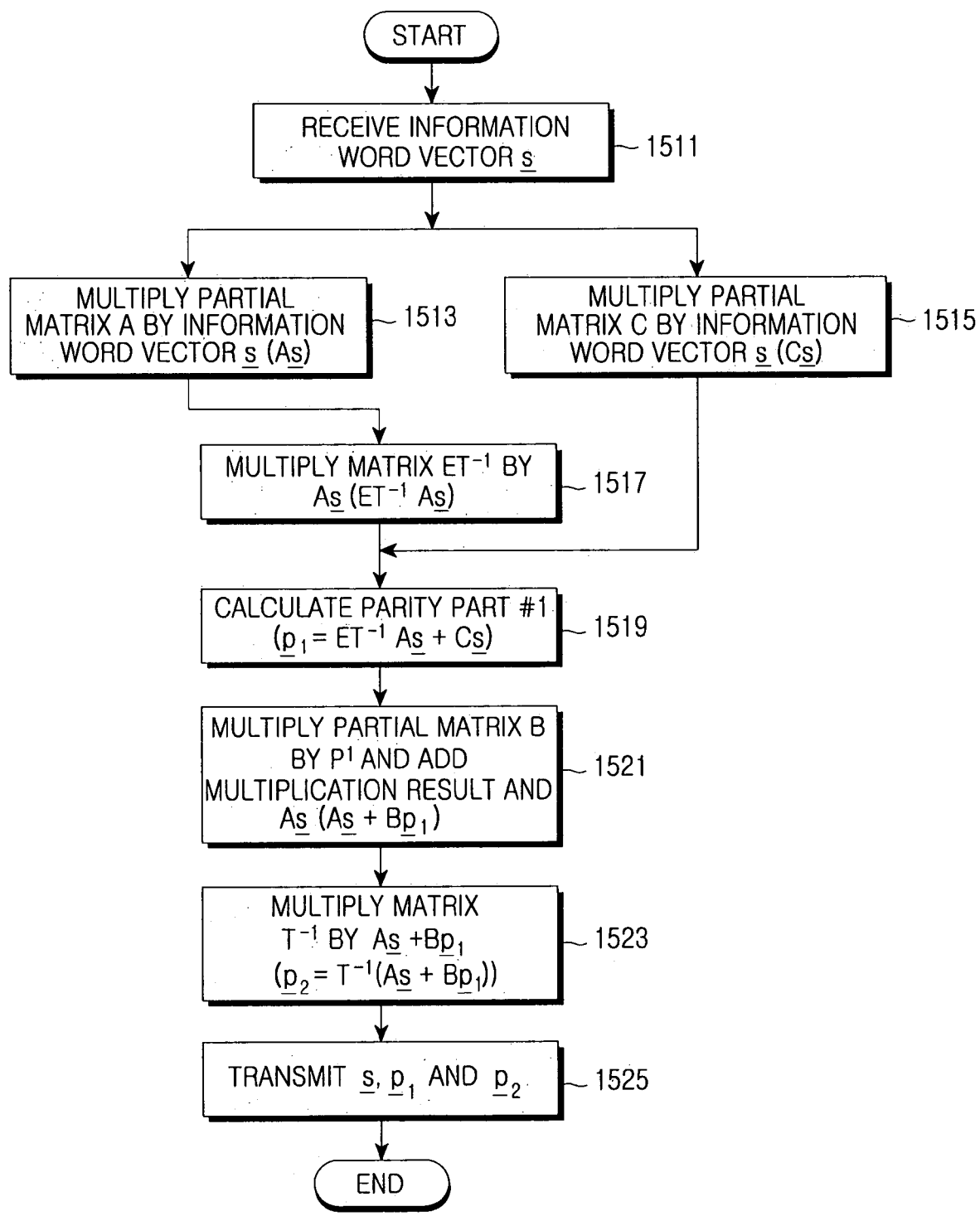
FIG. 15 is a flowchart illustrating a process of coding a variable-length block LDPC code according to the present invention.

Referring to FIG. 15, in step 1511, a controller (not shown) receives an information word vector 's' to be coded into the variable-length block LDPC code, and then proceeds to steps 1513 and 1515. It is assumed herein that a length of the information word vector 's' received to be coded into the block LDPC code is k. In step 1513, the controller matrix-multiplies the received information word vector 's' by a partial matrix A of the parity check matrix (A$\underline{s}$), and then proceeds to step 1517. Herein, because the number of elements having a value of 1 located in the partial matrix A is much less than the number of elements having a value of 0, the matrix multiplication (A$\underline{s}$) of the information word vector $\underline{s}$ and the partial matrix A of the parity check matrix can be achieved with a relatively small number of sum-product operations. In addition, in the partial matrix A, because the position where elements having a value of 1 are located can be expressed as exponential multiplication of a position of a non-zero block and a permutation matrix of the block, the matrix multiplication can be performed with a very simple operation as compared with a random parity check matrix. In step 1515, the controller performs matrix multiplication (C$\underline{s}$) on a partial matrix C of the parity check matrix and the information word vector 's', and then proceeds to step 1519.

In step 1517, the controller performs matrix multiplication ($ET^{-1}A\underline{s}$) on the matrix multiplication result (A$\underline{s}$) of the information word vector 's' and the partial matrix A of the parity check matrix, and a matrix $ET^{-1}$, and then proceeds to step 1519. Herein, because the number of elements having a value of 1 in the matrix $ET^{-1}$ is very small as described above, if an exponent of a permutation matrix of the block is given, the matrix multiplication can be simply performed. In step 1519, the controller calculates a first parity vector $\underline{P}_1$ by adding the $ET^{-1}A\underline{s}$ and the C$\underline{s}$ ($\underline{P}_1 = ET^{-1}A\underline{s} + C\underline{s}$), and then proceeds to step 1521. Herein, the addition operation is an exclusive OR (XOR) operation, and its result becomes 0 for an operation between bits having the same value and 1 for an operation between bits having different values. That is, the process up to step 1519 is a process for calculating the first parity vector $\underline{P}_1$.

In step 1521, the controller multiplies a partial matrix B of the parity check matrix by the first parity vector $\underline{P}_1$ (B$\underline{P}_1$), adds the multiplication result (B$\underline{P}_1$) to the A$\underline{s}$ (A$\underline{s}$+B$\underline{P}_1$), and then proceeds to step 1523. If the information word vector 's' and the first parity vector $\underline{P}_1$ are given, they are multiplied by an inverse matrix $T^{-1}$ of a partial matrix T of the parity check matrix to calculate a second parity vector $\underline{P}_2$. Therefore, in step 1523, the controller multiplies the calculation result (A$\underline{s}$+B$\underline{P}_1$) of step 1521 by the inverse matrix $T^{-1}$ of the partial matrix T to calculate the second parity vector $\underline{P}_2$ ($\underline{P}_2 = T^{-1}(A\underline{s}+B\underline{P}_1)$), and then proceeds to step 1525. As described above, if the information word vector 's' of a block LDPC code to be coded is given, the first parity vector $\underline{P}_1$ and the second parity vector $\underline{P}_2$ can be calculated, and as a result, all codeword vectors can be obtained. In step 1525, the controller generates a codeword vector 'c' using the information word vector 's', the first parity vector $\underline{P}_1$ and the second parity vector $\underline{P}_2$, and transmits the generated codeword vector 'c'.

Figure 16:
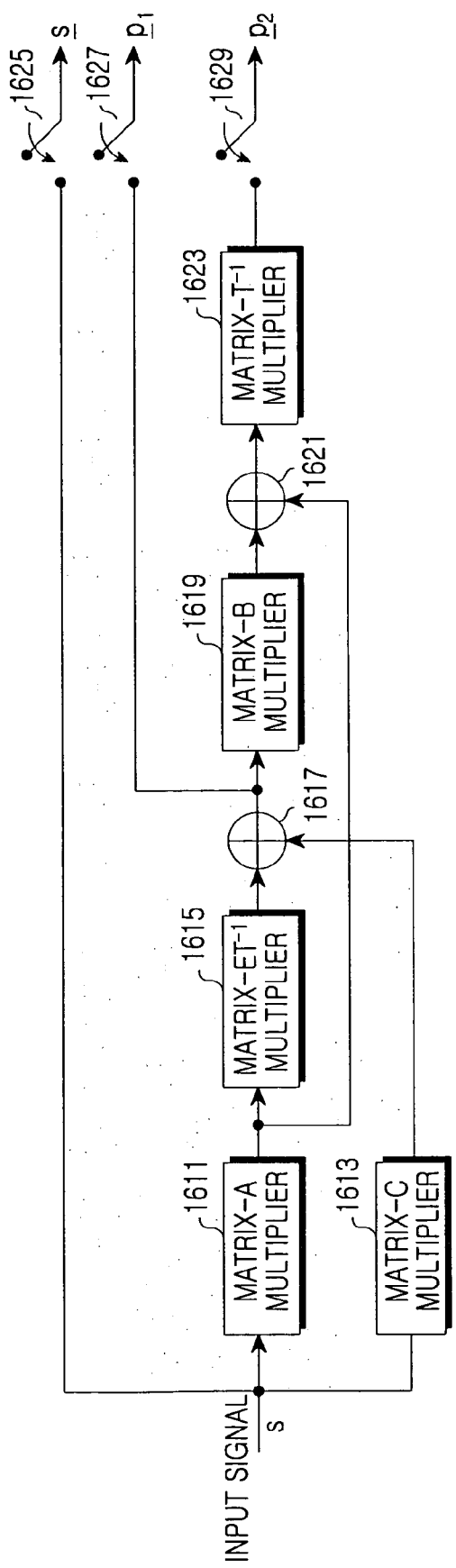
FIG. 16 is a block diagram illustrating an internal structure of an apparatus for coding a variable-length block LDPC code according to the present invention.

Next, with reference to the block diagram of FIG. 16, a description will be made of an internal structure of an apparatus for coding a variable-length block LDPC code according to the embodiments of the present invention. Referring to FIG. 16, the apparatus for coding a variable-length block LDPC code includes a matrix-A multiplier 1611, matrix-C multiplier 1613, a matrix-ET$^{-1}$ multiplier 1615, an adder 1617, a matrix-B multiplier 1619, an adder 1621, a matrix T$^{-1}$ multiplier 1623, and switches 1625, 1627 and 1629.

If an input signal, i.e. a length-k information word vector '$\underline{s}$' to be coded into a variable-length block LDPC code, is received, the received length-k information word vector '$\underline{s}$' is input to the switch 1625, the matrix-A multiplier 1611 and the matrix-C multiplier 1613. The matrix-A multiplier 1611 multiplies the information word vector '$\underline{s}$' by a partial matrix A of the full parity check matrix, and outputs the multiplication result to the matrix-ET$^{-1}$ multiplier 1615 and the adder 1621. The matrix-C multiplier 1613 multiplies the information word vector '$\underline{s}$' by a partial matrix C of the full parity check matrix, and outputs the multiplication result to the adder 1617. The matrix-ET$^{-1}$ multiplier 1615 multiplies the signal output from the matrix-A multiplier 1611 by a partial matrix ET$^{-1}$ of the full parity check matrix, and outputs the multiplication result to the adder 1617.

The adder 1617 adds the signal output from the matrix-ET$^{-1}$ calculator 1615 to the signal output from the matrix-C multiplier 1613, and outputs the addition result to the matrix-B multiplier 1619 and the switch 1627. Herein, the adder 1617 performs an XOR operation on a bit-by-bit basis. For example, if a length-3 vector of $x=(x_1, x_2, x_3)$ and a length-3 vector of $y=(y_1, y_2, y_3)$ are input to the adder 1617, the adder 1617 outputs a length-3 vector of $z=(x_1 \oplus y_1, x_2 \oplus y_2, x_3 \oplus y_3)$ by XORing the length-3 vector of $x=(x_1, x_2, x_3)$ and the length-3 vector of $y=(y_1, y_2, y_3)$. Herein, the $\oplus$ operation represents the XOR operation, a result of which becomes 0 for an operation between bits having the same value, and 1 for an operation between bits having different values. The signal output from the adder 1617 becomes a first parity vector $\underline{P}_1$.

The matrix-B multiplier 1619 multiplies the signal output from the adder 1617, i.e. the first parity vector $\underline{P}_1$, by a partial matrix B of the full parity check matrix, and outputs the multiplication result to the adder 1621. The adder 1621 adds the signal output from the matrix-B multiplier 1619 to the signal output from the matrix-A multiplier 1611, and outputs the addition result to the matrix-T$^{-1}$ multiplier 1623. The adder 1621, like the adder 1617, performs an XOR operation on the signal output from the matrix-B multiplier 1619 and the signal output from the matrix-A multiplier 1611, and outputs the XOR operation result to the matrix-T$^{-1}$ multiplier 1623.

The matrix-T$^{-1}$ multiplier 1623 multiplies the signal output from the adder 1621 by an inverse matrix T$^{-1}$ of a partial matrix T of the full parity check matrix, and outputs the multiplication result to the switch 1629. The output of the matrix-T$^{-1}$ multiplier 1623 becomes a second parity vector $\underline{P}_2$. Each of the switches 1625, 1627 and 1629 is switched on only at its transmission time to transmit its associated signal. The switch 1625 is switched on at a transmission time of the information word vector '$\underline{s}$', the switch 1627 is switched on at a transmission time of the first parity vector $\underline{P}_1$, and the switch 1629 is switched on at a transmission time of the second parity vector $\underline{P}_2$.

Because the present invention should be able to generate a variable-length block LDPC code, each of the matrixes used in the coding apparatus of FIG. 16 for a variable-length block LDPC code is changed each time a parity check matrix of the variable-length block LDPC code is changed, as will be described with reference to FIG. 17. Therefore, although not separately illustrated in FIG. 16, the controller modifies the matrixes used in the coding apparatus for the variable-length block LDPC code as the parity check matrix of the variable-length block LDPC code changes.

A description has been made of a method for generating a variable-length block LDPC code taking efficient coding into consideration. As described above, the variable-length block LDPC code, because of its structural characteristics, is superior in terms of the efficiency of a memory for storing the parity check matrix-related information, and enables the efficient coding by properly selecting partial matrixes from the parity check matrix. However, as the parity check matrix is generated on a per-block basis, randomness decreases, and the decrease in randomness may cause performance degradation of the block LDPC code. That is, because an irregular block LDPC code is superior in performance to a regular block LDPC code as described above, it is very important to properly select partial matrixes from the full parity check matrix in a process of designing a block LDPC code.

Figure 11:
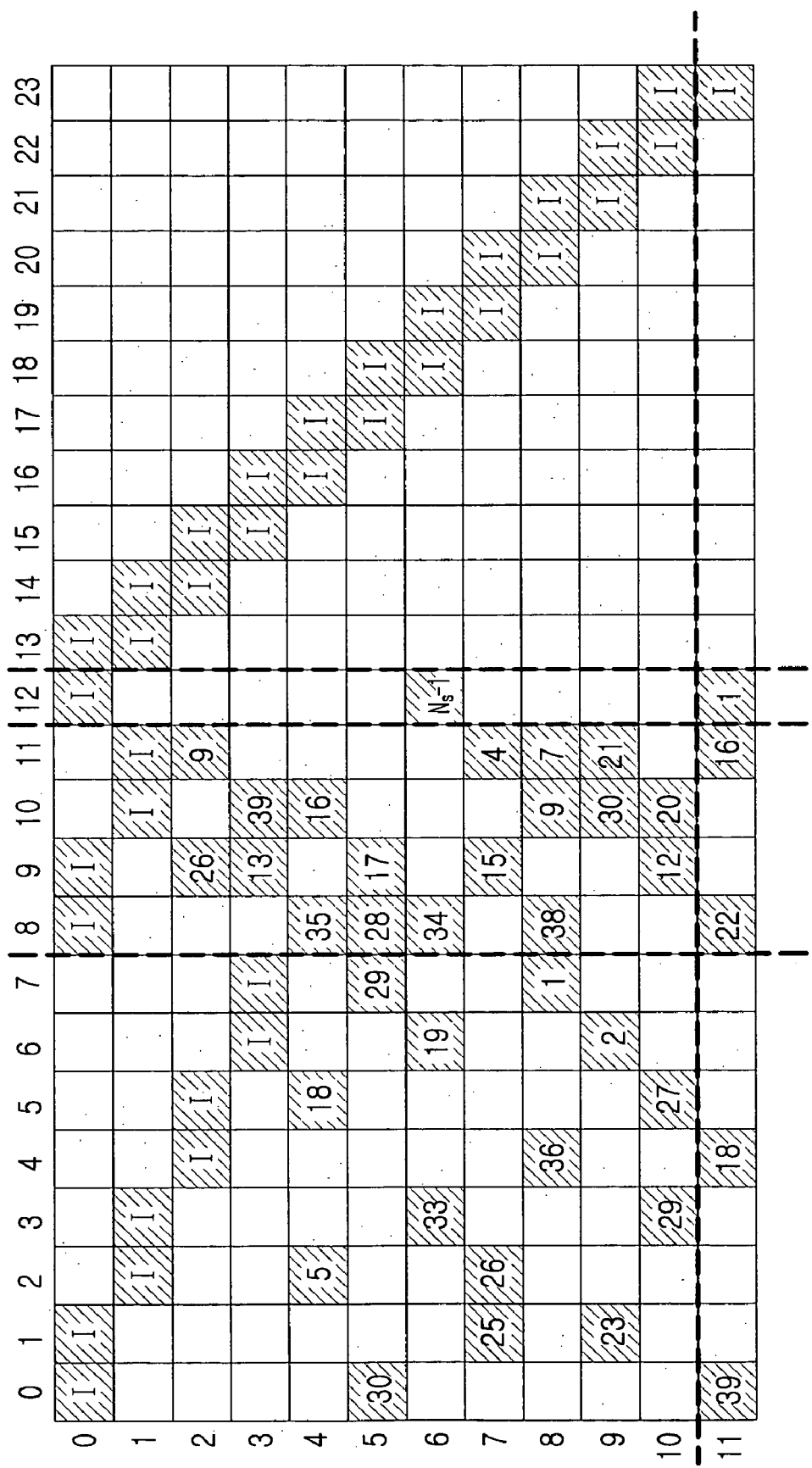
FIG. 11 is a diagram illustrating a parity check matrix of a variable-length block LDPC code according to a first embodiment of the present invention.

With reference to FIG. 11, a description will now be made of a detailed method for generating a variable-length block LDPC code for a coding rate of ½.

FIG. 11 is a diagram illustrating a parity check matrix of a variable-length block LDPC code according to a first embodiment of the present invention. Before a description of FIG. 11 is given, it should be noted that the first embodiment of the present invention provides a parity check matrix of a variable-length block LDPC code for a coding rate of ½. Referring to FIG. 11, if it is assumed that a possible size $N_s$ of partial matrixes is 4, 8, 12, 16, 20, 24, 28, 32, 36 and 40, it is possible to generate a block LDPC code having a length of 96, 192, 288, 384, 480, 576, 672, 768, 864 and 960 using the parity check matrix illustrated in FIG. 11. A value written in each of partial blocks, i.e. partial matrixes, illustrated in FIG. 11 represents an exponent value of a corresponding permutation matrix. Herein, the parity check matrix of the variable-length block LDPC code is comprised of a plurality of partial blocks, and partial matrixes individually corresponding to the partial blocks constitute the permutation matrix. For example, if the parity check matrix of the variable-length block LDPC code is comprised of p×q partial blocks, i.e. if the number of rows of partial blocks in the parity check matrix for the variable-length block LDPC code is 'p' and the number of columns of partial blocks in the parity check matrix for the variable-length block LDPC code is 'q', permutation matrixes constituting the parity check matrix of the variable-length block LDPC code can be expressed as $P^{a_{pq}}$, and a superscript $a_{pq}$ of a permutation matrix P is either $0 \leq a_{pq} \leq N_s-1$ or $a_{pq}=\infty$. That is, the permutation matrix $P^{a_{pq}}$ represents a permutation matrix located in a partial block where a $p^{th}$ row and a $q^{th}$ column of the parity check matrix of the variable-length block LDPC code comprised of a plurality of partial blocks cross each other. Therefore, an exponent value of a permutation matrix illustrated in FIG. 11 is given as $a_{pq}$, and by performing a modulo-$N_s$ operation (where $N_s$ corresponds to a size of the partial matrix) on the exponent value of the permutation matrix, it is possible to calculate a permutation matrix's exponent value of the parity check matrix for the variable-length block LDPC code having the $N_s$ value. If a result value obtained by performing a modulo-$N_s$ operation on an exponent of a permutation matrix is 0, the corresponding permutation matrix becomes an identity matrix.

To assist in a detailed description of the present invention, a definition of the following parameters will be given.

A parity check matrix of a variable-length block LDPC code illustrated in FIG. 11 is referred to as a "mother matrix," the number of non-zero permutation matrixes among the partial matrixes, i.e. the permutation matrixes, constituting the mother matrix is defined as L, the exponents of the L non-zero permutation matrixes among the permutation matrixes constituting the mother matrix are represented by $a_1$, $a_2, \ldots, a_L$, and a size of the permutation matrixes constituting the mother matrix is assumed to be $N_s$. Because the number of non-zero permutation matrixes among the permutation matrixes constituting the mother matrix is L, an exponent of a first permutation matrix becomes $a_1$, an exponent of a second permutation matrix becomes $a_2$, and in this manner, an exponent of the last permutation matrix becomes $a_L$.

Unlike the mother matrix, a parity check matrix to be newly generated is referred to as a "child matrix," the number of non-zero permutation matrixes among the partial matrixes, i.e. the permutation matrixes, constituting the child matrix is defined as L, a size of the permutation matrixes constituting the child matrix is defined as $N_s'$, and the exponents of the permutation matrixes constituting the child matrix are represented by $a_1', a_2', \ldots, a_L'$. Because the number of non-zero permutation matrixes among the permutation matrixes constituting the child matrix is L, an exponent of a first permutation matrix becomes $a_1'$, an exponent of a second permutation matrix becomes $a_2'$, and in this manner, an exponent of the last permutation matrix becomes $a_L'$.

Using Equation (5) below, it is possible to generate a child matrix having a variable block length by selecting a size $N_s'$ of the permutation matrixes constituting a child matrix to be generated from one mother matrix.

$$a_i' = a_i \bmod N_s' \text{ (for } 1 \leq i \leq L) \tag{5}$$

Next, with reference to FIG. 12, a description will be made of a detailed method for generating a variable-length block LDPC code for a coding rate of ⅔.

Figure 12:
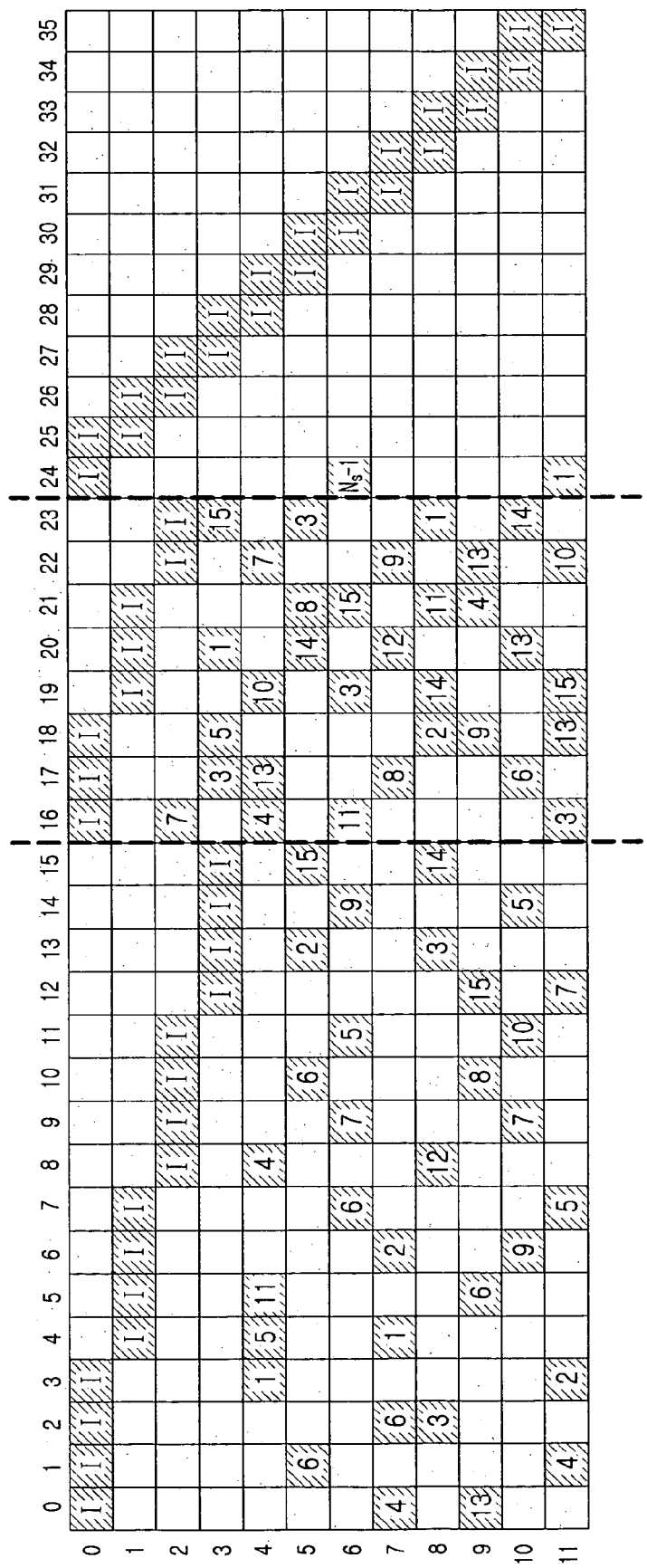
FIG. 12 is a diagram illustrating a parity check matrix of a variable-length block LDPC code according to a second embodiment of the present invention.

FIG. 12 is a diagram illustrating a parity check matrix of a variable-length block LDPC code according to a second embodiment of the present invention. Before a description of FIG. 12 is given, it should be noted that the second embodiment of the present invention provides a parity check matrix of a variable-length block LDPC code for a coding rate of ⅔. Referring to FIG. 12, if it is assumed that a possible size $N_s$ of partial matrixes is 8 and 16, it is possible to generate a block LDPC code having a length of 288 and 576 using the parity check matrix illustrated in FIG. 12. A value written in each of the partial blocks, i.e. the partial matrixes, illustrated in FIG. 12 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix's exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 13, a description will be made of a detailed method for generating a variable-length block LDPC code for a coding rate of ¾.

Figure 13:
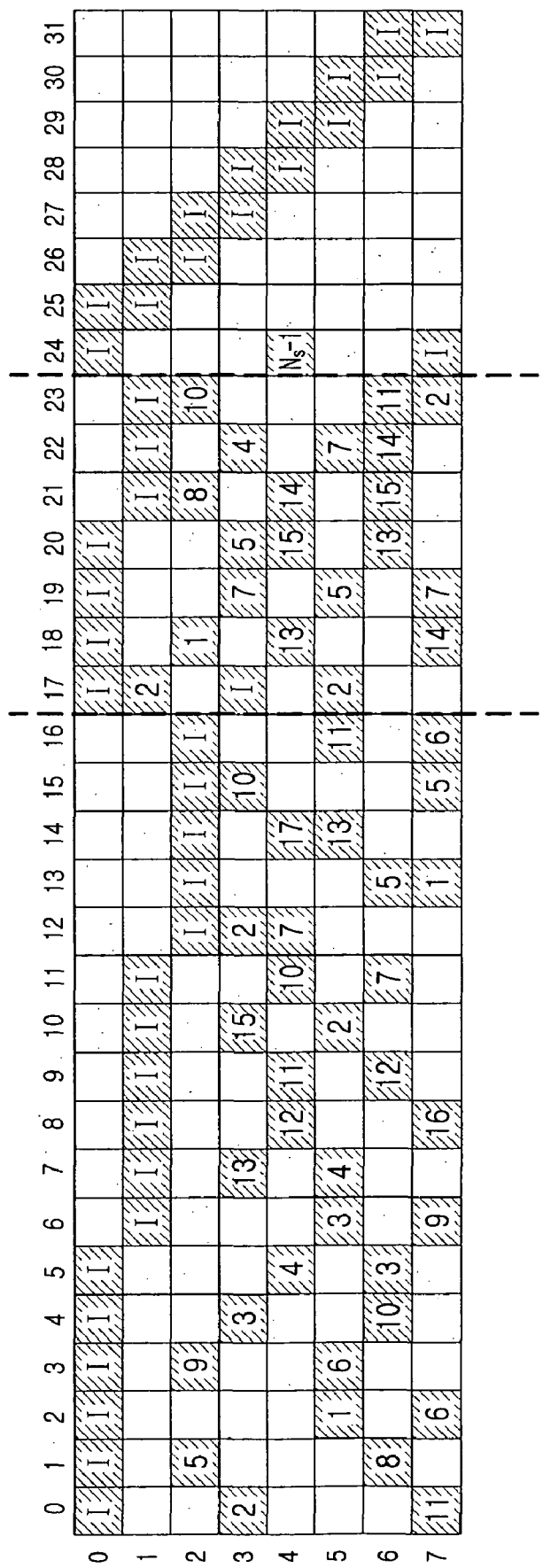
FIG. 13 is a diagram illustrating a parity check matrix of a variable-length block LDPC code according to a third embodiment of the present invention.

FIG. 13 is a diagram illustrating a parity check matrix of a variable-length block LDPC code according to a third embodiment of the present invention. Before a description of FIG. 13 is given, it should be noted that the third embodiment of the present invention provides a parity check matrix of a variable-length block LDPC code for a coding rate of ¾. Referring to FIG. 13, if it is assumed that a possible size $N_s$ of partial matrixes is 3, 6, 9, 12, 15 and 18, it is possible to generate a block LDPC code having a variable length of 96, 192, 288, 384, 480 and 576 using the parity check matrix illustrated in FIG. 13. A value written in each of the partial blocks, i.e. the partial matrixes, illustrated in FIG. 13 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix's exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 14, a description will be made of a detailed method for generating a variable-length block LDPC code for a coding rate of ⅚.

Figure 14:
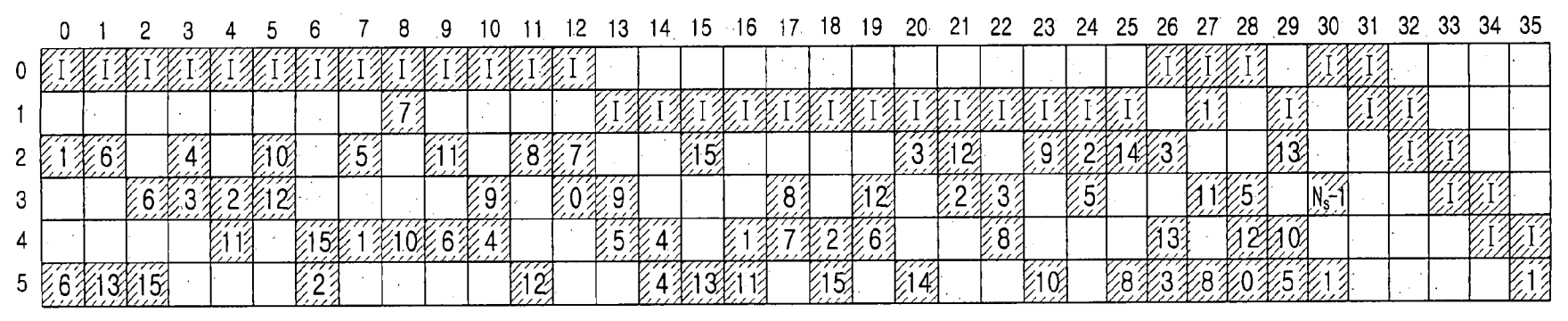

FIG. 14 is a diagram illustrating a parity check matrix of a variable-length block LDPC code according to a fourth embodiment of the present invention. Before a description of FIG. 14 is given, it should be noted that the fourth embodiment of the present invention provides a parity check matrix of a variable-length block LDPC code for a coding rate of ⅚. Referring to FIG. 14, if it is assumed that a possible size $N_s$ of partial matrixes is 8 and 16, it is possible to generate a block LDPC code having a length of 288 and 576 using the parity check matrix illustrated in FIG. 14. A value written in each of the partial blocks, i.e. the partial matrixes, illustrated in FIG. 14 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix's exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 18, a description will be made of a detailed method for generating a variable-length block LDPC code for a coding rate of ½.

Figure 18:
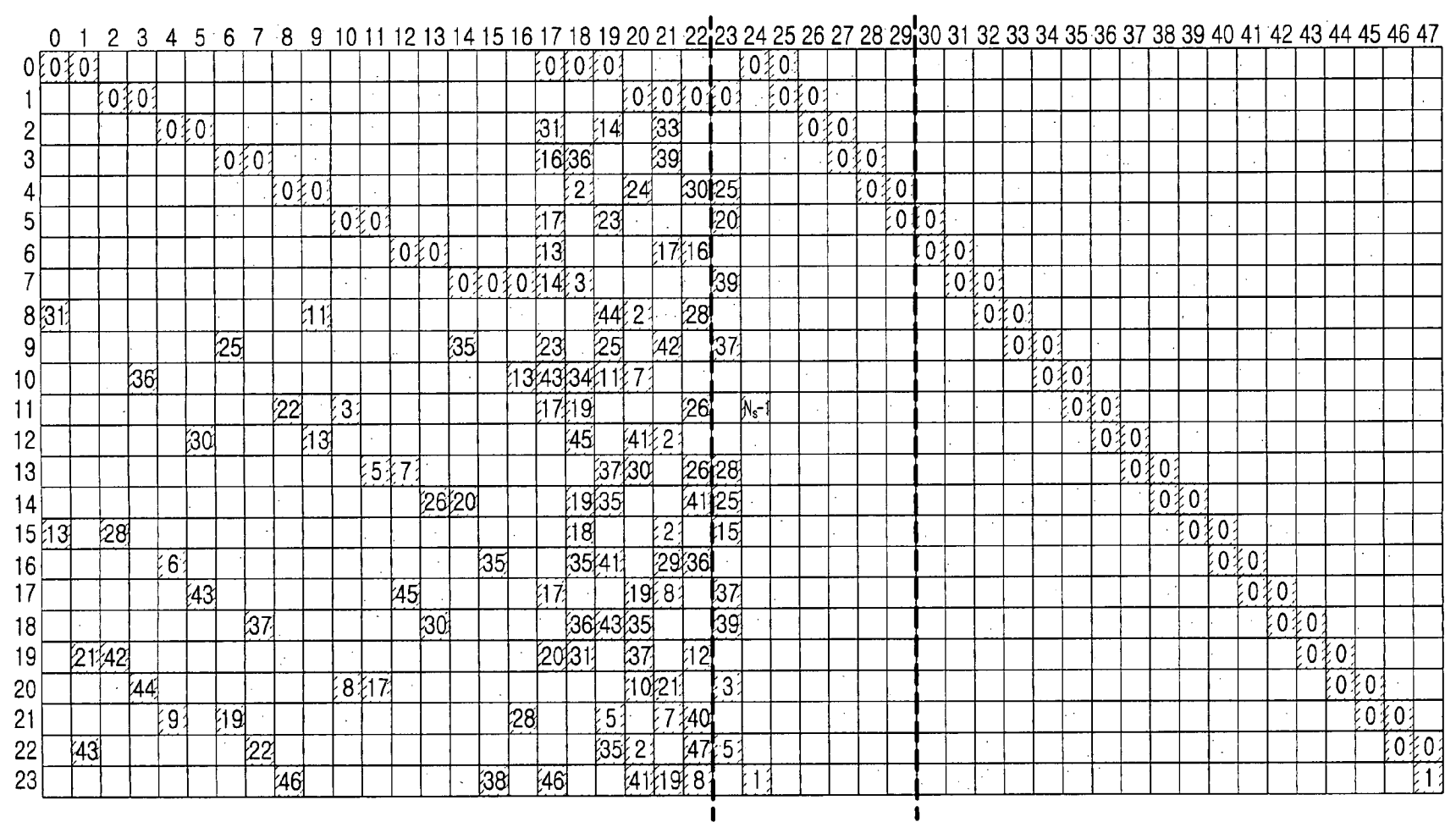

FIG. 18 is a diagram illustrating a parity check matrix of a variable-length block LDPC code according to a fifth embodiment of the present invention. Before a description of FIG. 18 is given, it should be noted that the fifth embodiment of the present invention provides a parity check matrix of a variable-length block LDPC code for a coding rate of ½. Referring to FIG. 18, it is possible to generate a block LDPC code of length of $48N_s$ according to a sixe of $N_s$ of a partial matrix, using the parity check matrix illustrated in FIG. 18. A value written in each of the partial blocks, i.e. the partial matrixes, illustrated in FIG. 18 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 19, a description will be made of a detailed method for generating a variable-length block LDPC code for a coding rate of ⅔.

Figure 19:
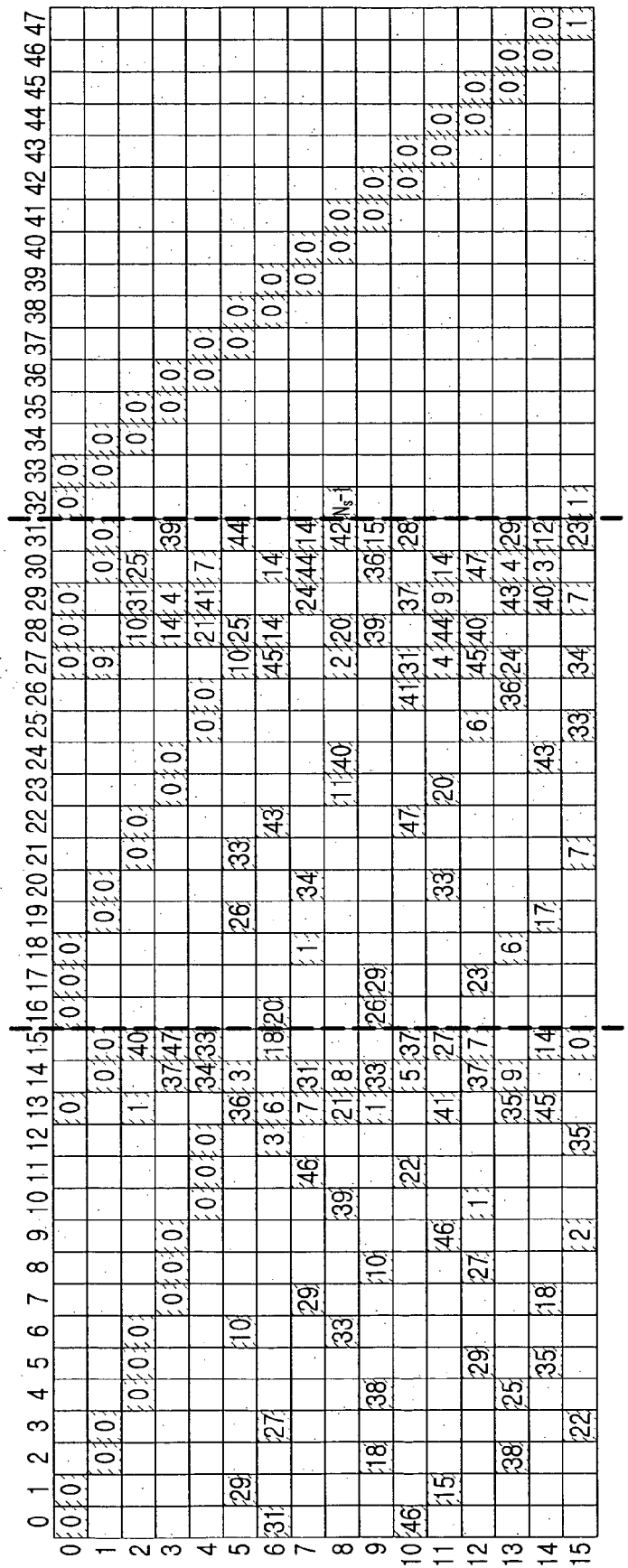
FIG. 19 is a diagram illustrating a parity check matrix of a variable-length block LDPC code according to a sixth embodiment of the present invention.

FIG. 19 is a diagram illustrating a parity check matrix of a variable-length block LDPC code according to a sixth embodiment of the present invention. Before a description of FIG. 19 is given, it should be noted that the sixth embodiment of the present invention provides a parity check matrix of a variable-length block LDPC code for a coding rate of ⅔. Referring to FIG. 19, it is possible to generate a block LDPC code of length of $48N_s$ according to a size of $N_s$ of a partial matrix, using the parity check matrix illustrated in FIG. 19. A value written in each of the partial blocks, i.e. the partial matrixes, illustrated in FIG. 19 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 20, a description will be made of a detailed method for generating a variable-length block LDPC code for a coding rate of ¾.

Figure 20:
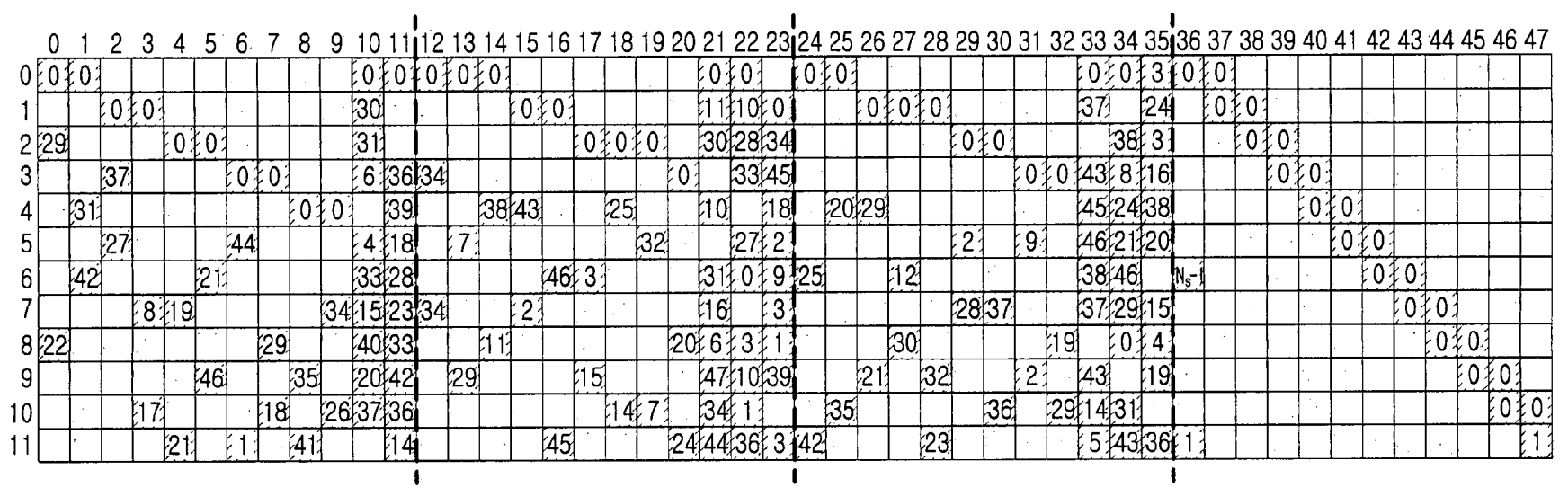

FIG. 20 is a diagram illustrating a parity check matrix of a variable-length block LDPC code according to a seventh embodiment of the present invention. Before a description of FIG. 20 is given, it should be noted that the seventh embodiment of the present invention provides a parity check matrix of a variable-length block LDPC code for a coding rate of ¾. Referring to FIG. 20, it is possible to generate a block LDPC code of length of $48N_s$ according to a size of $N_s$ of a partial matrix, using the parity check matrix illustrated in FIG. 20. A value written in each of the partial blocks, i.e. the partial matrixes, illustrated in FIG. 20 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 21, a description will be made of a detailed method for generating a variable-length block LDPC code for a coding rate of ¾.

Figure 21:
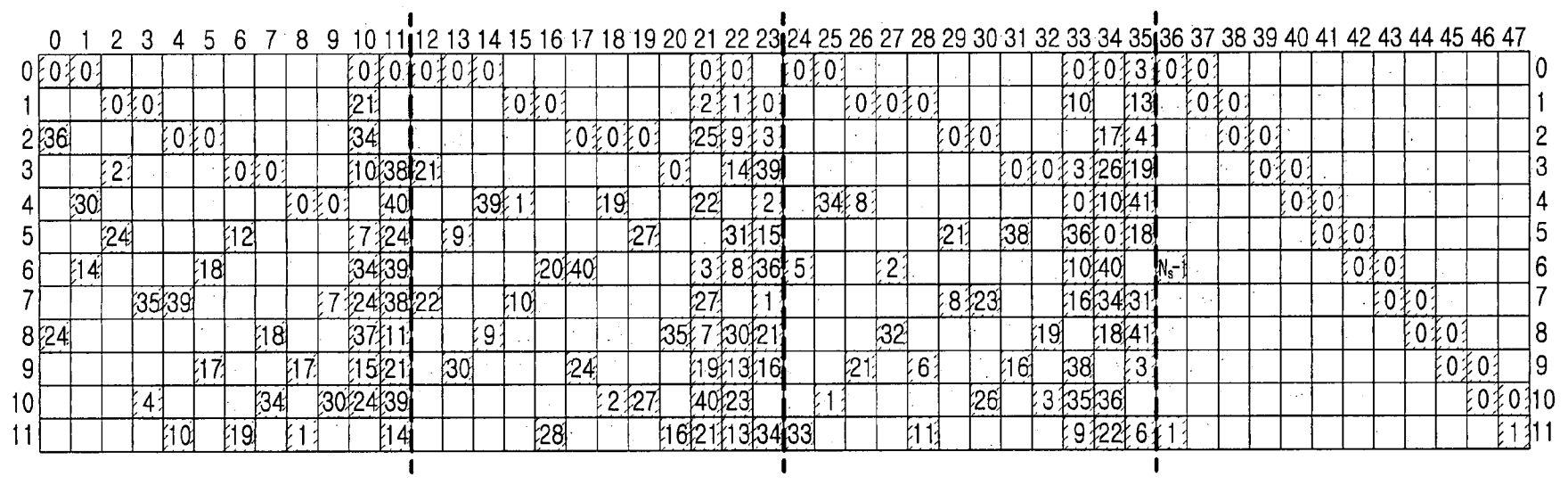

FIG. 21 is a diagram illustrating a parity check matrix of a variable-length block LDPC code according to a eighth embodiment of the present invention. Before a description of FIG. 21 is given, it should be noted that the eighth embodiment of the present invention provides a parity check matrix of a variable-length block LDPC code for a coding rate of ¾. Referring to FIG. 21, it is possible to generate a block LDPC code of length of $48N_s$ according to a size of $N_s$ of a partial matrix, using the parity check matrix illustrated in FIG. 21. A value written in each of the partial blocks, i.e. the partial matrixes, illustrated in FIG. 21 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 22, a description will be made of a detailed method for generating a variable-length block LDPC code for a coding rate of ½.

Figure 22:
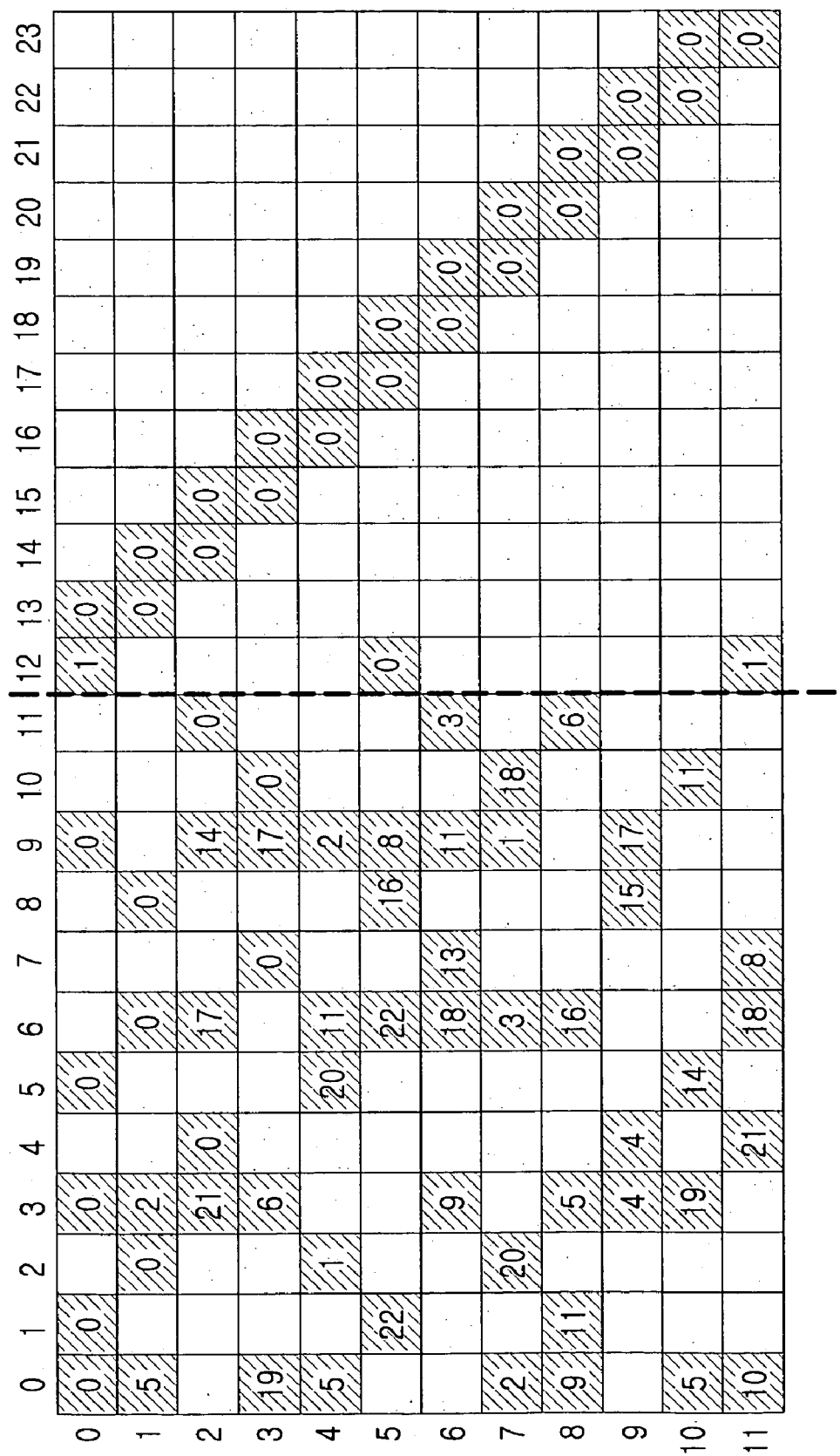
FIG. 22 is a diagram illustrating a parity check matrix of a variable-length block LDPC code according to a ninth embodiment of the present invention.

FIG. 22 is a diagram illustrating a parity check matrix of a variable-length block LDPC code according to a ninth embodiment of the present invention. Before a description of FIG. 22 is given, it should be noted that the ninth embodiment of the present invention provides a parity check matrix of a variable-length block LDPC code for a coding rate of ½. Referring to FIG. 22, it is possible to generate a block LDPC code of length of $24N_s$ according to a size of $N_s$ of a partial matrix, using the parity check matrix illustrated in FIG. 22. A value written in each of the partial blocks, i.e. the partial matrixes, illustrated in FIG. 22 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 23, a description will be made of a detailed method for generating a variable-length block LDPC code for a coding rate of ½.

Figure 23:
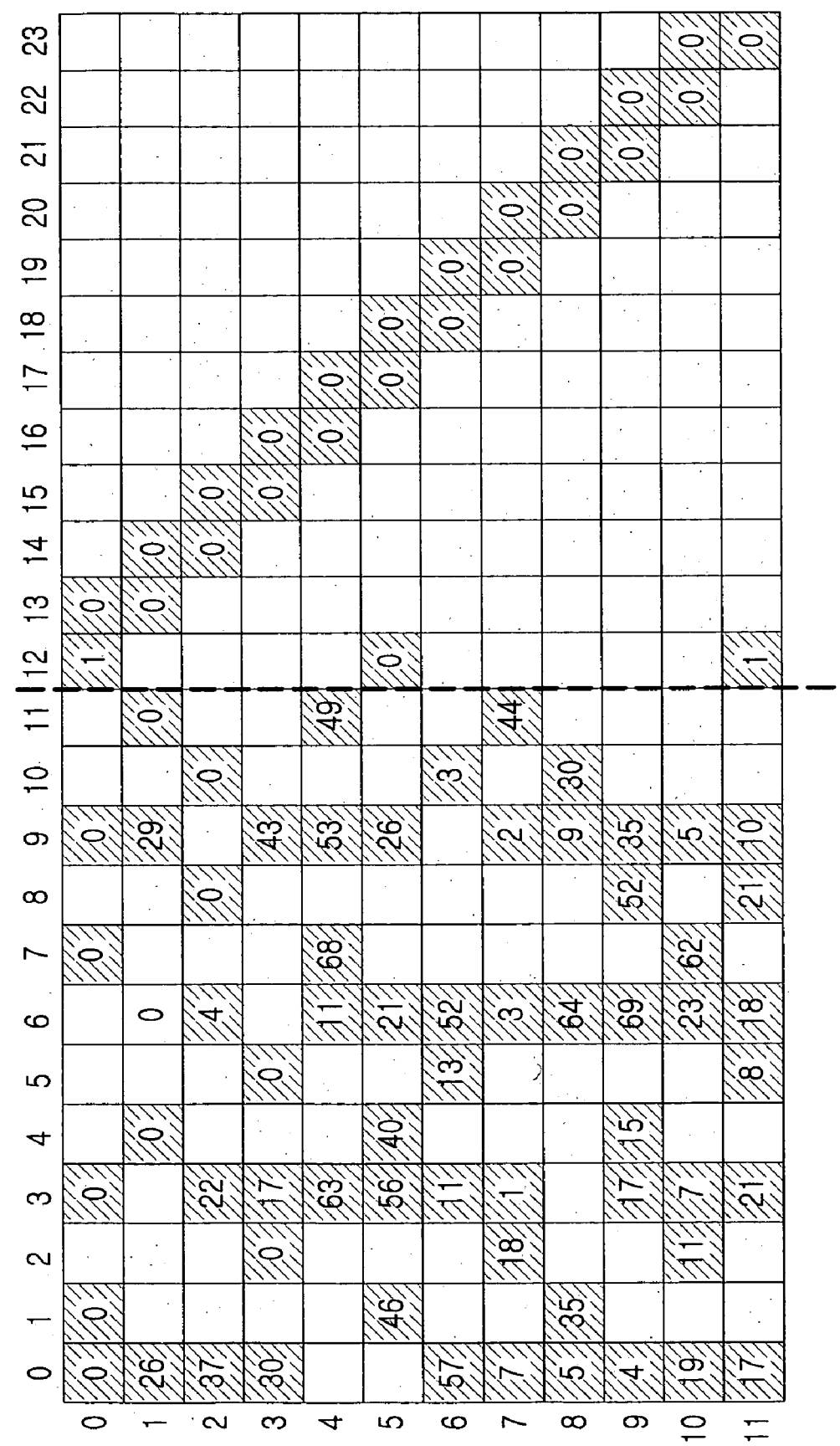
FIG. 23 is a diagram illustrating a parity check matrix of a variable-length block LDPC code according to a tenth embodiment of the present invention.

FIG. 23 is a diagram illustrating a parity check matrix of a variable-length block LDPC code according to a tenth embodiment of the present invention. Before a description of FIG. 23 is given, it should be noted that the tenth embodiment of the present invention provides a parity check matrix of a variable-length block LDPC code for a coding rate of ½. Referring to FIG. 23, it is possible to generate a block LDPC code of length of $24N_s$ according to a size of $N_s$ of a partial matrix, using the parity check matrix illustrated in FIG. 23. A value written in each of the partial blocks, i.e. the partial matrixes, illustrated in FIG. 23 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 24, a description will be made of a detailed method for generating a variable-length block LDPC code for a coding rate of ⅔.

Figure 24:
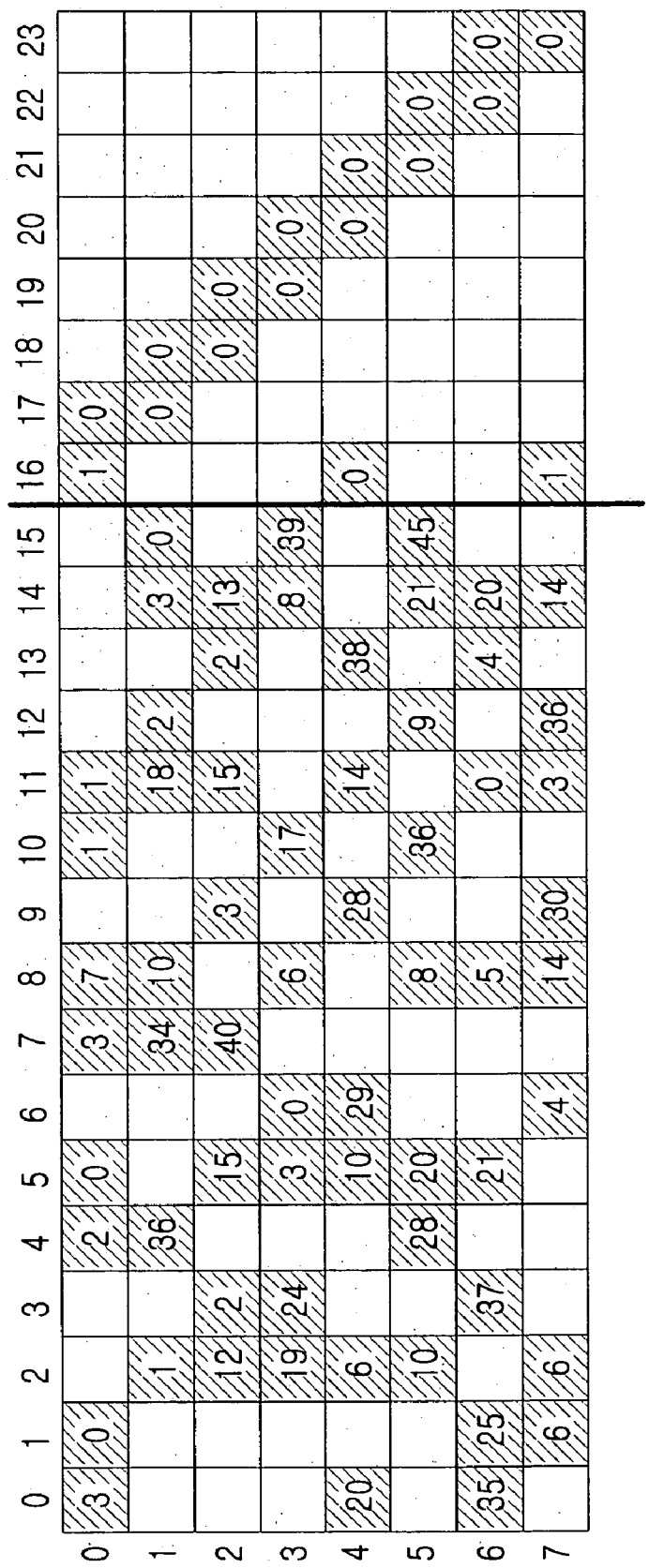
FIG. 24 is a diagram illustrating a parity check matrix of a variable-length block LDPC code according to a eleventh embodiment of the present invention.

FIG. 24 is a diagram illustrating a parity check matrix of a variable-length block LDPC code according to a eleventh embodiment of the present invention. Before a description of FIG. 24 is given, it should be noted that the eleventh embodiment of the present invention provides a parity check matrix of a variable-length block LDPC code for a coding rate of ⅔. Referring to FIG. 24, it is possible to generate a block LDPC code of length of $24N_s$ according to a size of $N_s$ of a partial matrix, using the parity check matrix illustrated in FIG. 24. A value written in each of the partial blocks, i.e. the partial matrixes, illustrated in FIG. 24 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 25, a description will be made of a detailed method for generating a variable-length block LDPC code for a coding rate of ⅔.

Figure 25:
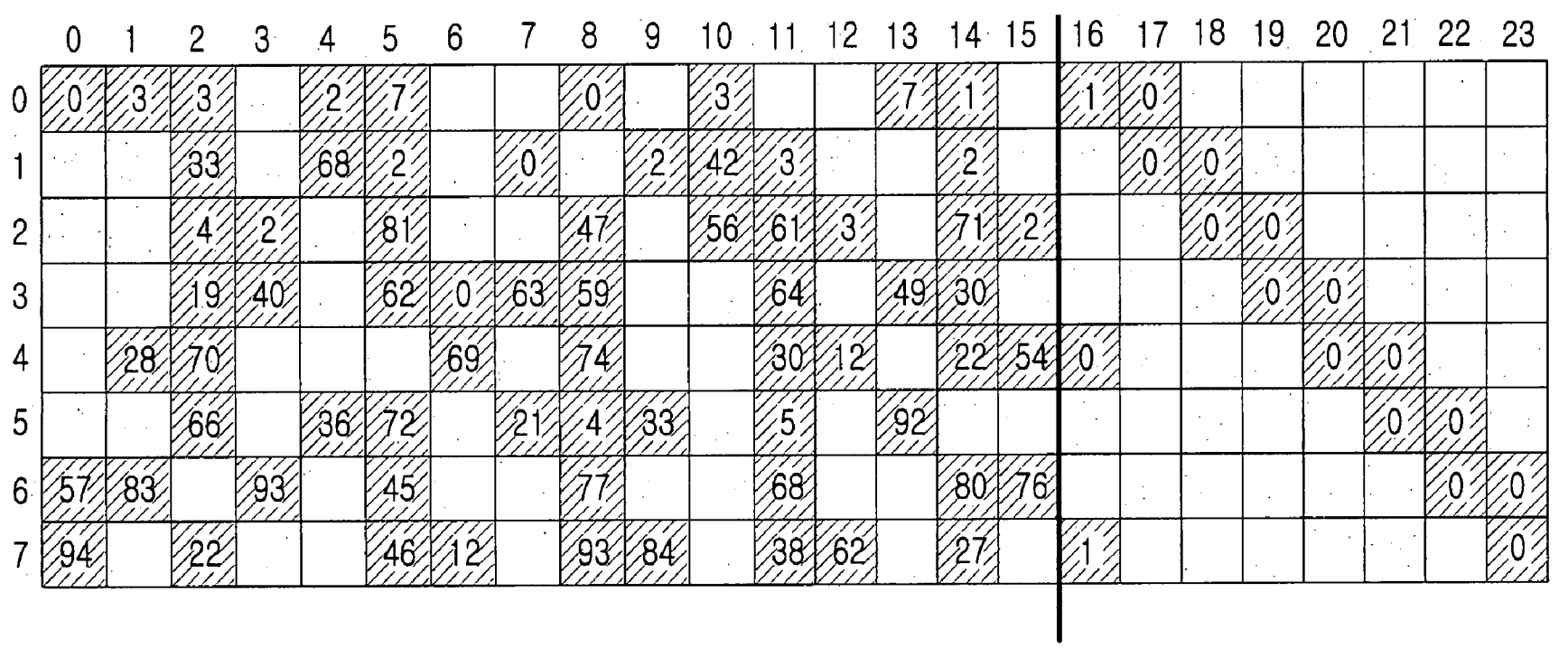

FIG. 25 is a diagram illustrating a parity check matrix of a variable-length block LDPC code according to a twelfth embodiment of the present invention. Before a description of FIG. 25 is given, it should be noted that the twelfth embodiment of the present invention provides a parity check matrix of a variable-length block LDPC code for a coding rate of ⅔. Referring to FIG. 25, it is possible to generate a block LDPC code of length of $24N_s$ according to a size of $N_s$ of a partial matrix, using the parity check matrix illustrated in FIG. 25. A value written in each of the partial blocks, i.e. the partial matrixes, illustrated in FIG. 25 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 26, a description will be made of a detailed method for generating a variable-length block LDPC code for a coding rate of ½.

Figure 26:
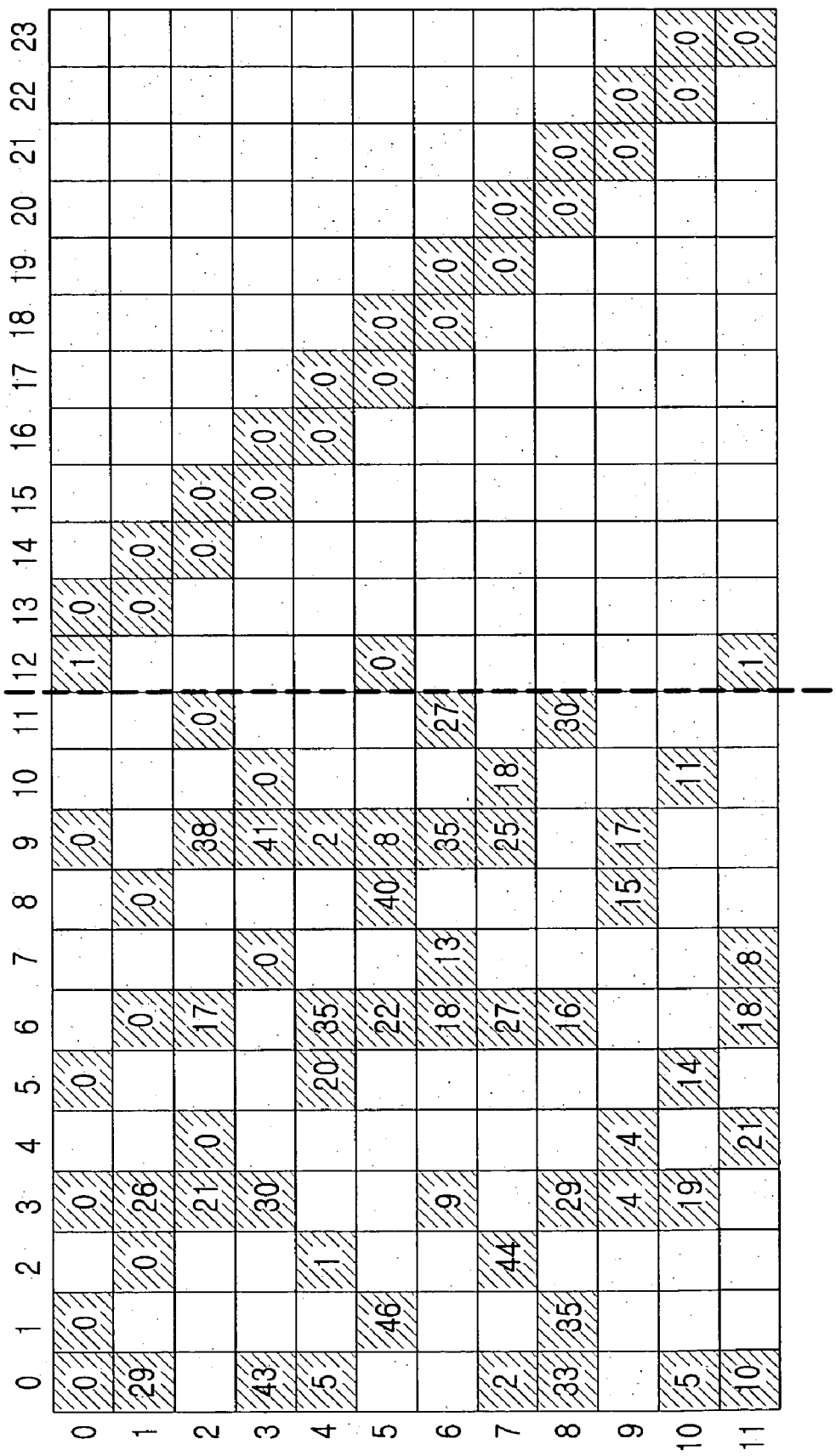
FIG. 26 is a diagram illustrating a parity check matrix of a variable-length block LDPC code according to a thirteenth embodiment of the present invention.

FIG. 26 is a diagram illustrating a parity check matrix of a variable-length block LDPC code according to a thirteenth embodiment of the present invention. Before a description of FIG. 26 is given, it should be noted that the thirteenth embodiment of the present invention provides a parity check matrix of a variable-length block LDPC code for a coding rate of ½. Referring to FIG. 26, it is possible to generate a block LDPC code of length of $24N_s$ according to a size of $N_s$ of a partial matrix, using the parity check matrix illustrated in FIG. 26. A value written in each of the partial blocks, i.e. the partial matrixes, illustrated in FIG. 26 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 27, a description will be made of a detailed method for generating a variable-length block LDPC code for a coding rate of ½.

Figure 27:
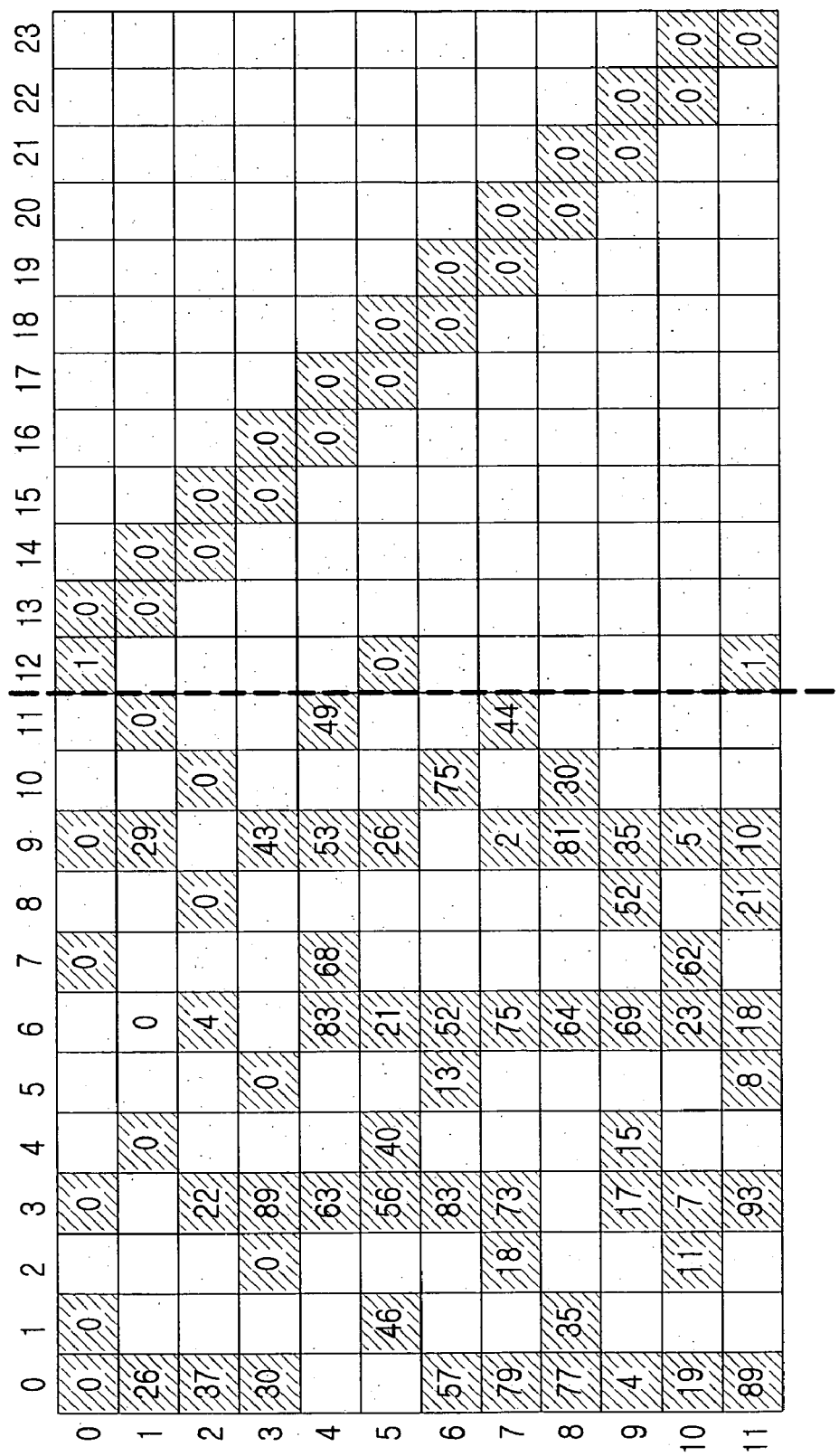
FIG. 27 is a diagram illustrating a parity check matrix of a variable-length block LDPC code according to a fourteenth embodiment of the present invention.

FIG. 27 is a diagram illustrating a parity check matrix of a variable-length block LDPC code according to a fourteenth embodiment of the present invention. Before a description of FIG. 27 is given, it should be noted that the fourteenth embodiment of the present invention provides a parity check matrix of a variable-length block LDPC code for a coding rate of ½. Referring to FIG. 27, it is possible to generate a block LDPC code of length of $24N_s$ according to a size of $N_s$ of a partial matrix, using the parity check matrix illustrated in FIG. 27. A value written in each of the partial blocks, i.e. the partial matrixes, illustrated in FIG. 27 represents an exponent value of a corresponding permutation matrix. Therefore, by performing a modulo-$N_s$ operation (where $N_s$ corresponds to a size of the partial matrix) on the exponent value of the permutation matrix; it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 28, a description will be made of a detailed method for generating a variable-length block LDPC code for a coding rate of ⅔.

Figure 28:
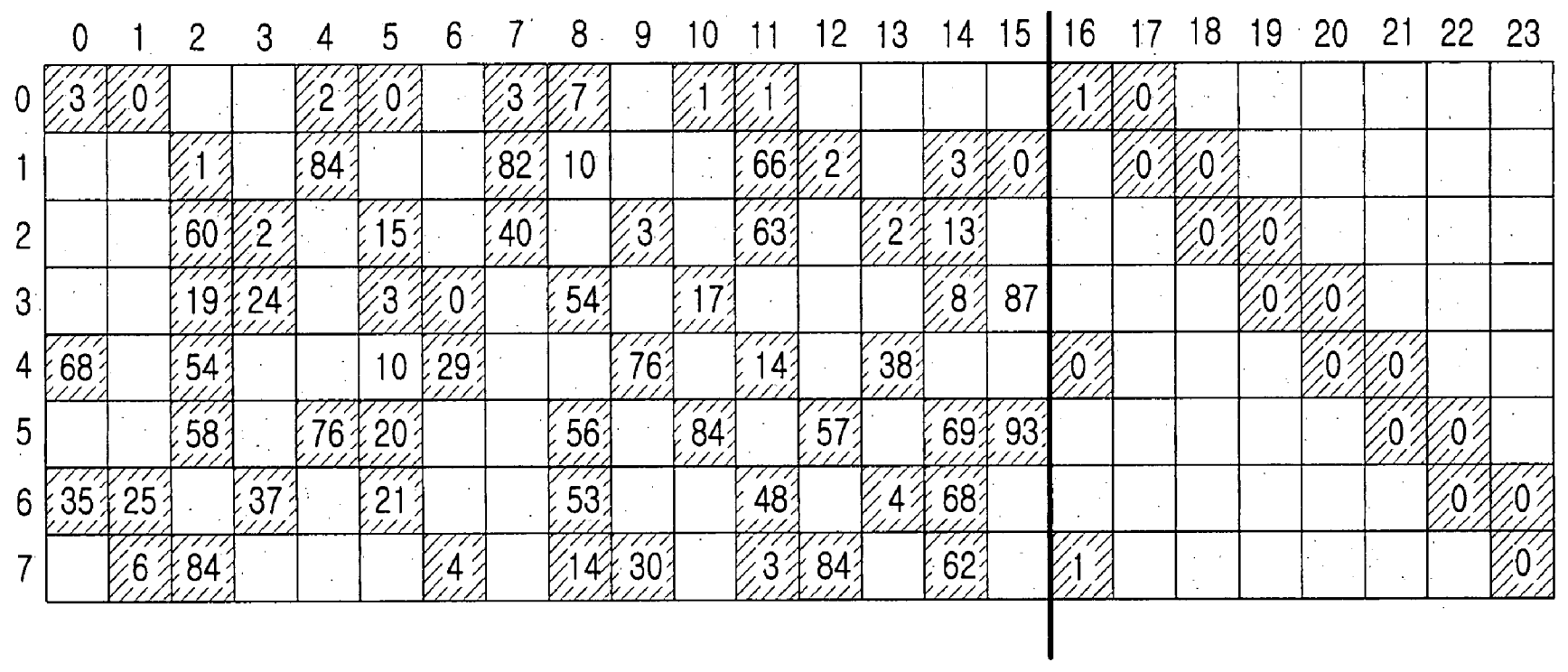

FIG. 28 is a diagram illustrating a parity check matrix of a variable-length block LDPC code according to a fifteenth embodiment of the present invention. Before a description of FIG. 28 is given, it should be noted that the fifteenth embodiment of the present invention provides a parity check matrix of a variable-length block LDPC code for a coding rate of ⅔. Referring to FIG. 28, it is possible to generate a block LDPC code of length of $24N_s$ according to a size of $N_s$ of a partial matrix, using the parity check matrix illustrated in FIG. 28. A value written in each of the partial blocks, i.e. the partial matrixes, illustrated in FIG. 28 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 29, a description will be made of a detailed method for generating a variable-length block LDPC code for a coding rate of ½.

Figure 29:
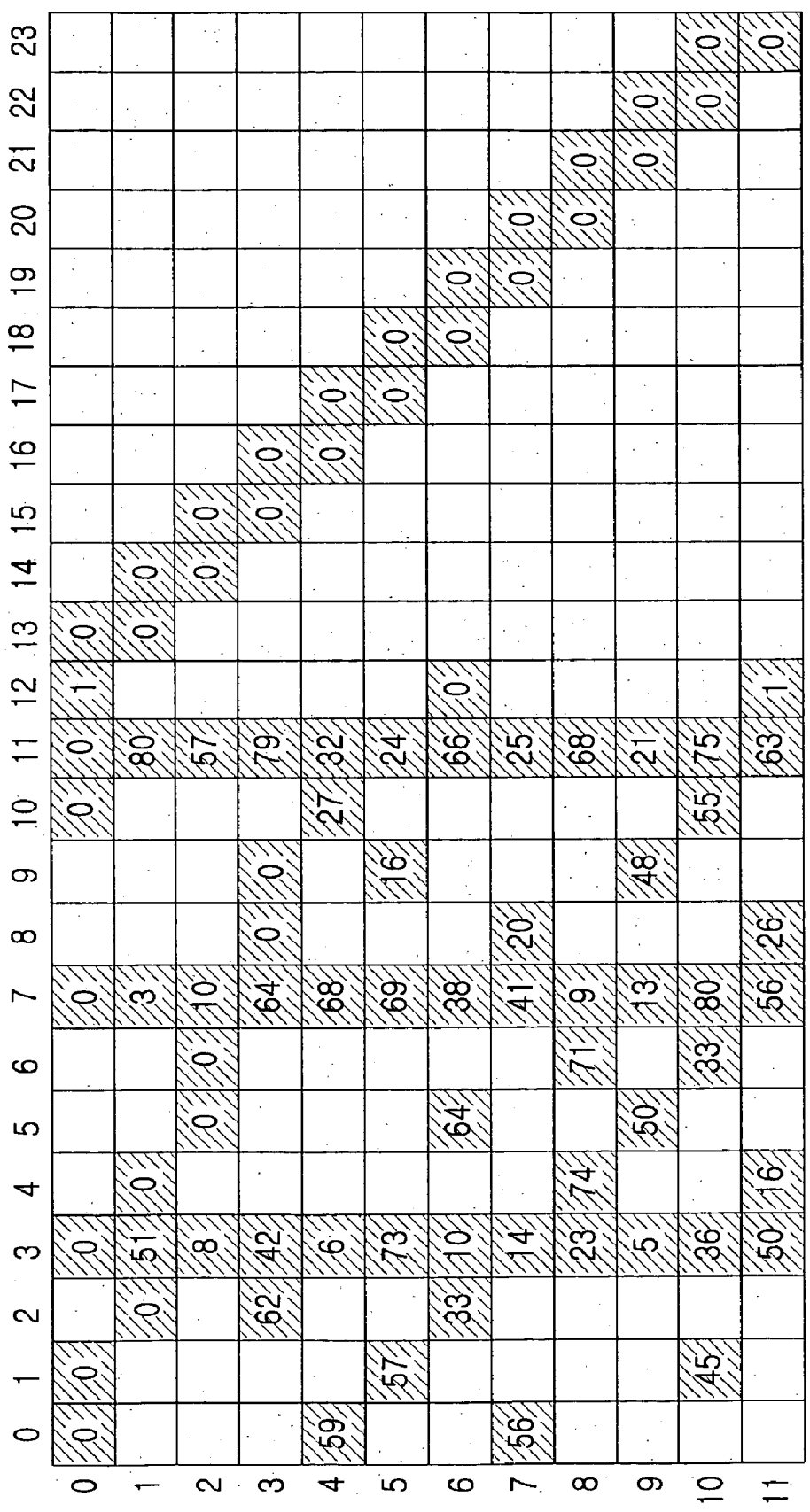
FIG. 29 is a diagram illustrating a parity check matrix of a variable-length block LDPC code according to a sixteenth embodiment of the present invention.

FIG. 29 is a diagram illustrating a parity check matrix of a variable-length block LDPC code according to a sixteenth embodiment of the present invention. Before a description of FIG. 29 is given, it should be noted that the sixteenth embodiment of the present invention provides a parity check matrix of a variable-length block LDPC code for a coding rate of ½. Referring to FIG. 29, it is possible to generate a block LDPC code of length of $24N_s$ according to a size of $N_s$ of a partial matrix, using the parity check matrix illustrated in FIG. 29. A value written in each of the partial blocks, i.e. the partial matrixes, illustrated in FIG. 29 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 30, a description will be made of a detailed method for generating a variable-length block LDPC code for a coding rate of ½.

Figure 30:
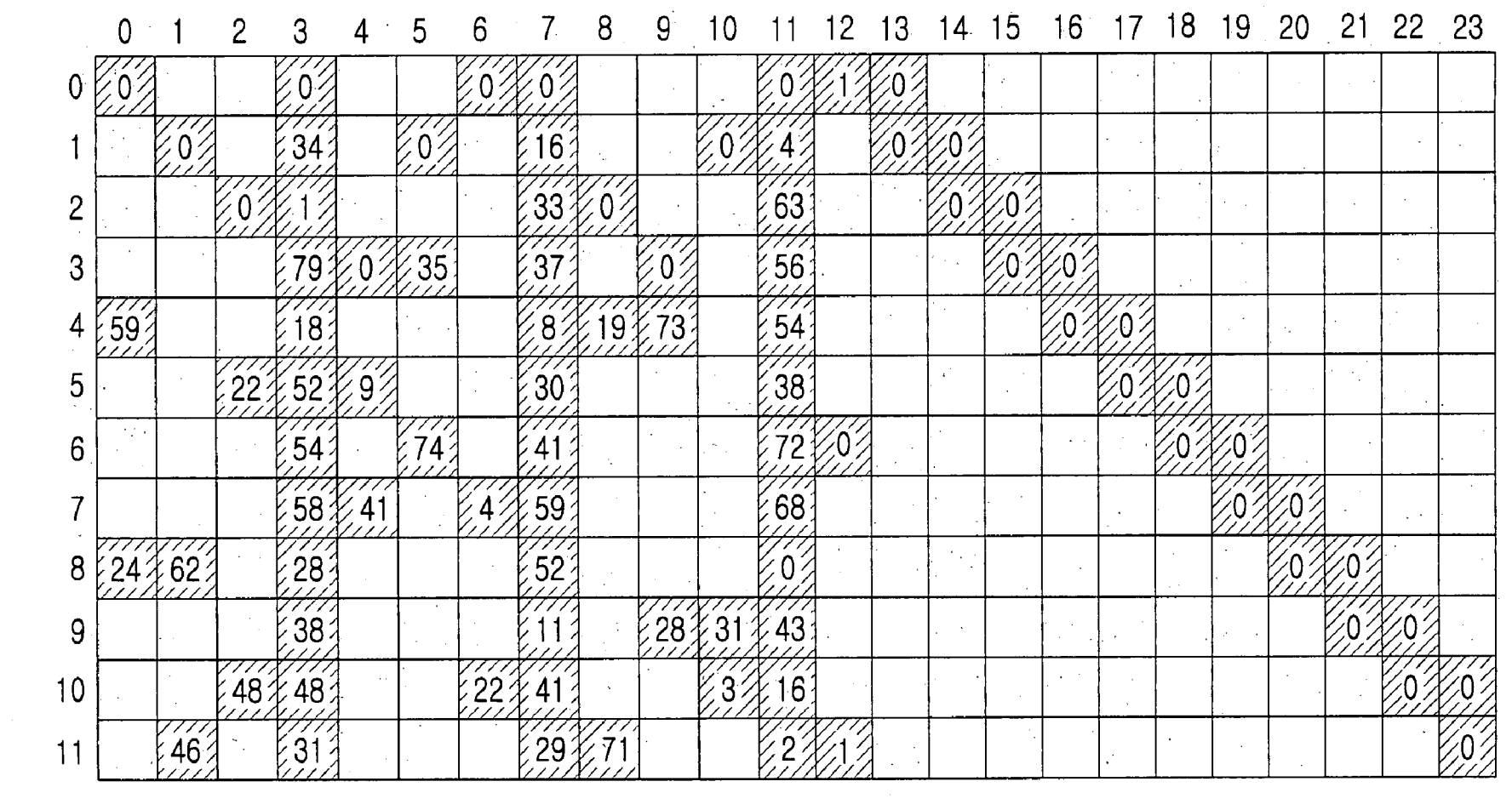

FIG. 30 is a diagram illustrating a parity check matrix of a variable-length block LDPC code according to a seventeenth embodiment of the present invention. Before a description of FIG. 30 is given, it should be noted that the seventeenth embodiment of the present invention provides a parity check matrix of a variable-length block LDPC code for a coding rate of ½. Referring to FIG. 30, it is possible to generate a block LDPC code of length of $24N_s$ according to a size of $N_s$ of a partial matrix, using the parity check matrix illustrated in FIG. 30. A value written in each of the partial blocks, i.e. the partial matrixes, illustrated in FIG. 30 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 31, a description will be made of a detailed method for generating a variable-length block LDPC code for a coding rate of ½.

Figure 31:
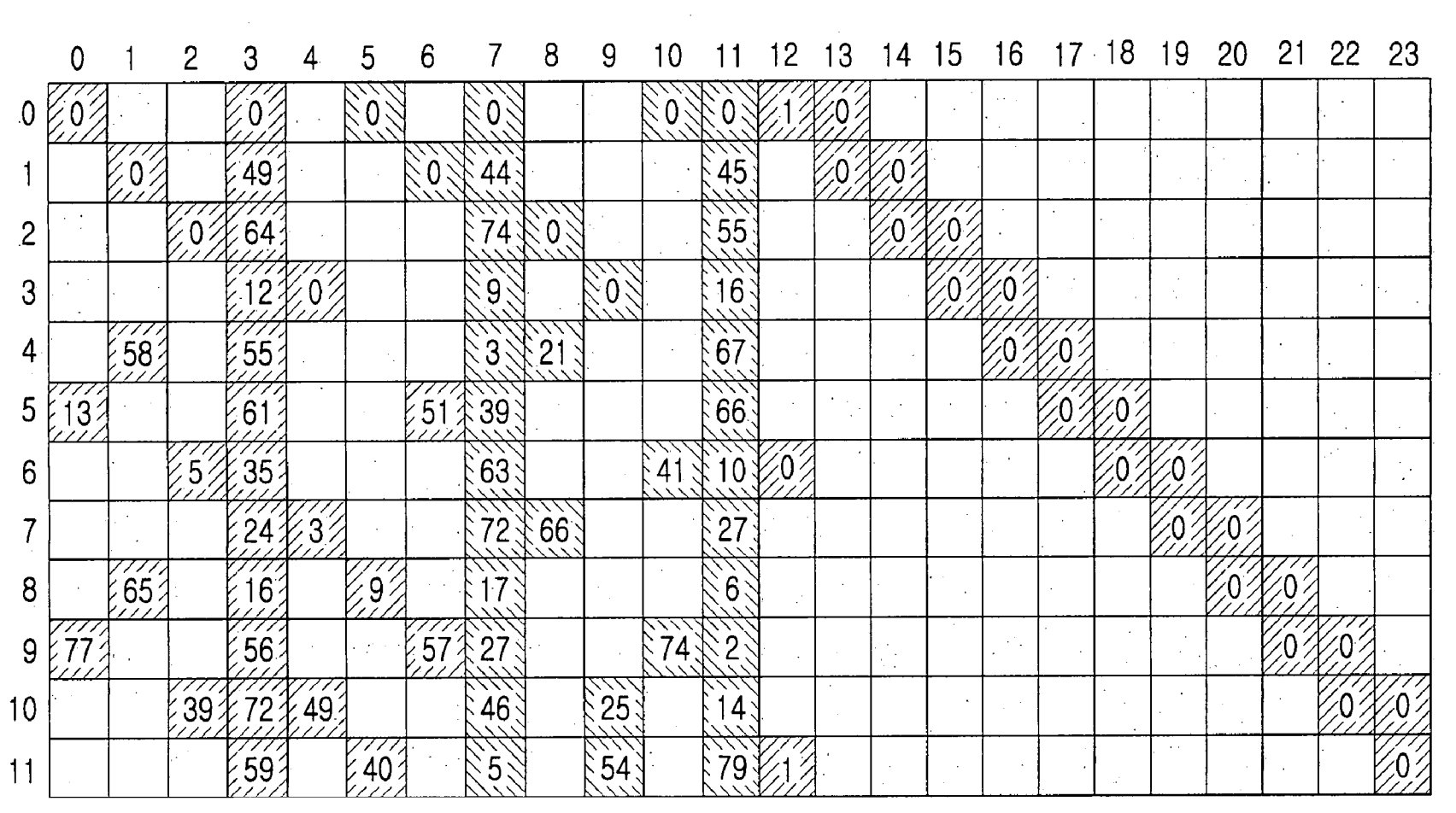

FIG. 31 is a diagram illustrating a parity check matrix of a variable-length block LDPC code according to a eighteenth embodiment of the present invention. Before a description of FIG. 31 is given, it should be noted that the eighteenth embodiment of the present invention provides a parity check matrix of a variable-length block LDPC code for a coding rate of ½. Referring to FIG. 31, it is possible to generate a block LDPC code of length of $24N_s$ according to a size of $N_s$ of a partial matrix, using the parity check matrix illustrated in FIG. 31. A value written in each of the partial blocks, i.e. the partial matrixes, illustrated in FIG. 31 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 32, a description will be made of a detailed method for generating a variable-length block LDPC code for a coding rate of ½.

Figure 32:
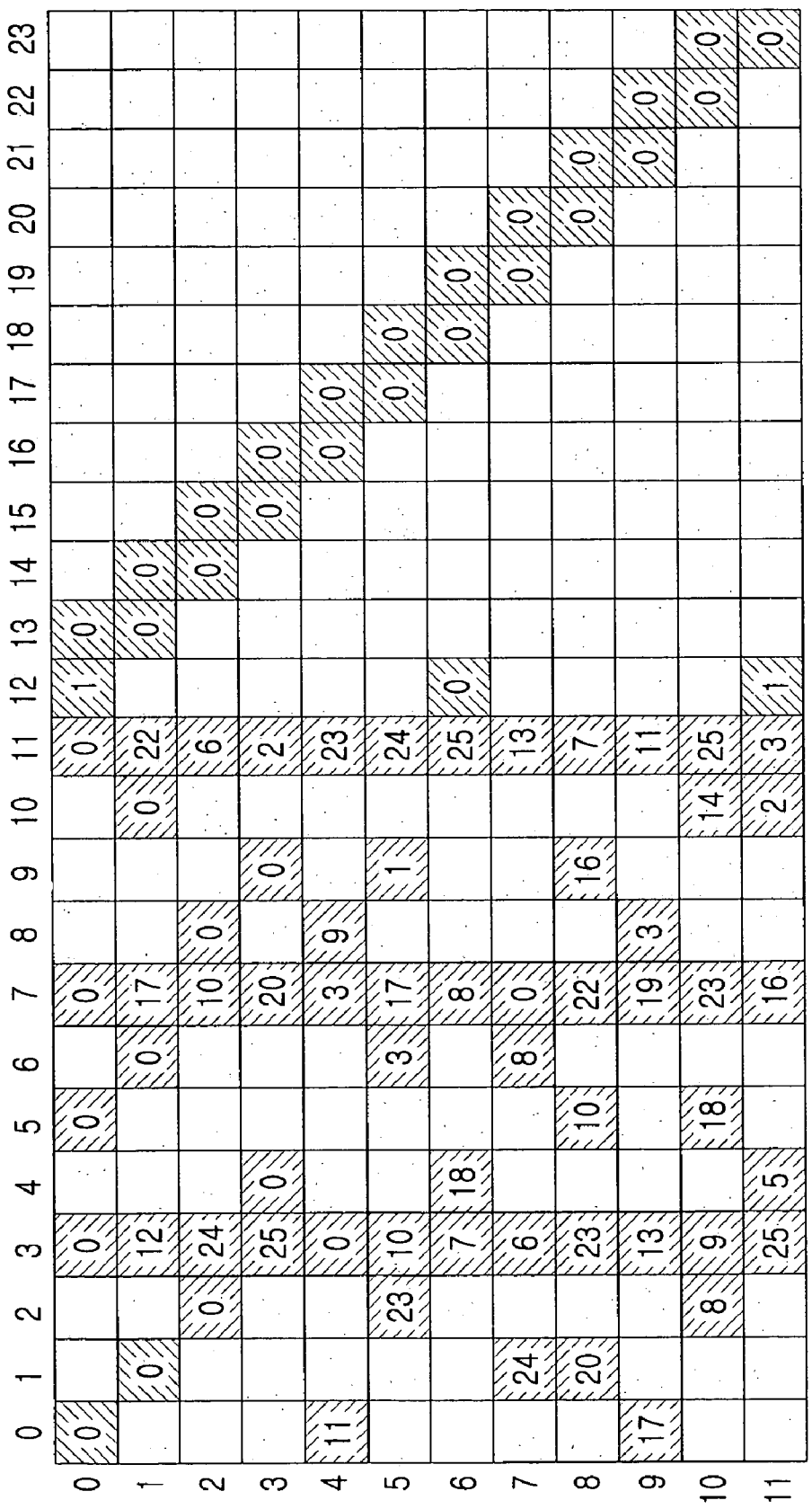
FIG. 32 is a diagram illustrating a parity check matrix of a variable-length block LDPC code according to a nineteenth embodiment of the present invention.

FIG. 32 is a diagram illustrating a parity check matrix of a variable-length block LDPC code according to a nineteenth embodiment of the present invention. Before a description of FIG. 32 is given, it should be noted that the nineteenth embodiment of the present invention provides a parity check matrix of a variable-length block LDPC code for a coding rate of ½. Referring to FIG. 32, it is possible to generate a block LDPC code of length of $24N_s$ according to a size of $N_s$ of a partial matrix, using the parity check matrix illustrated in FIG. 32. A value written in each of the partial blocks, i.e. the partial matrixes, illustrated in FIG. 32 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 33, a description will be made of a detailed method for generating a variable-length block LDPC code for a coding rate of ½.

Figure 33:
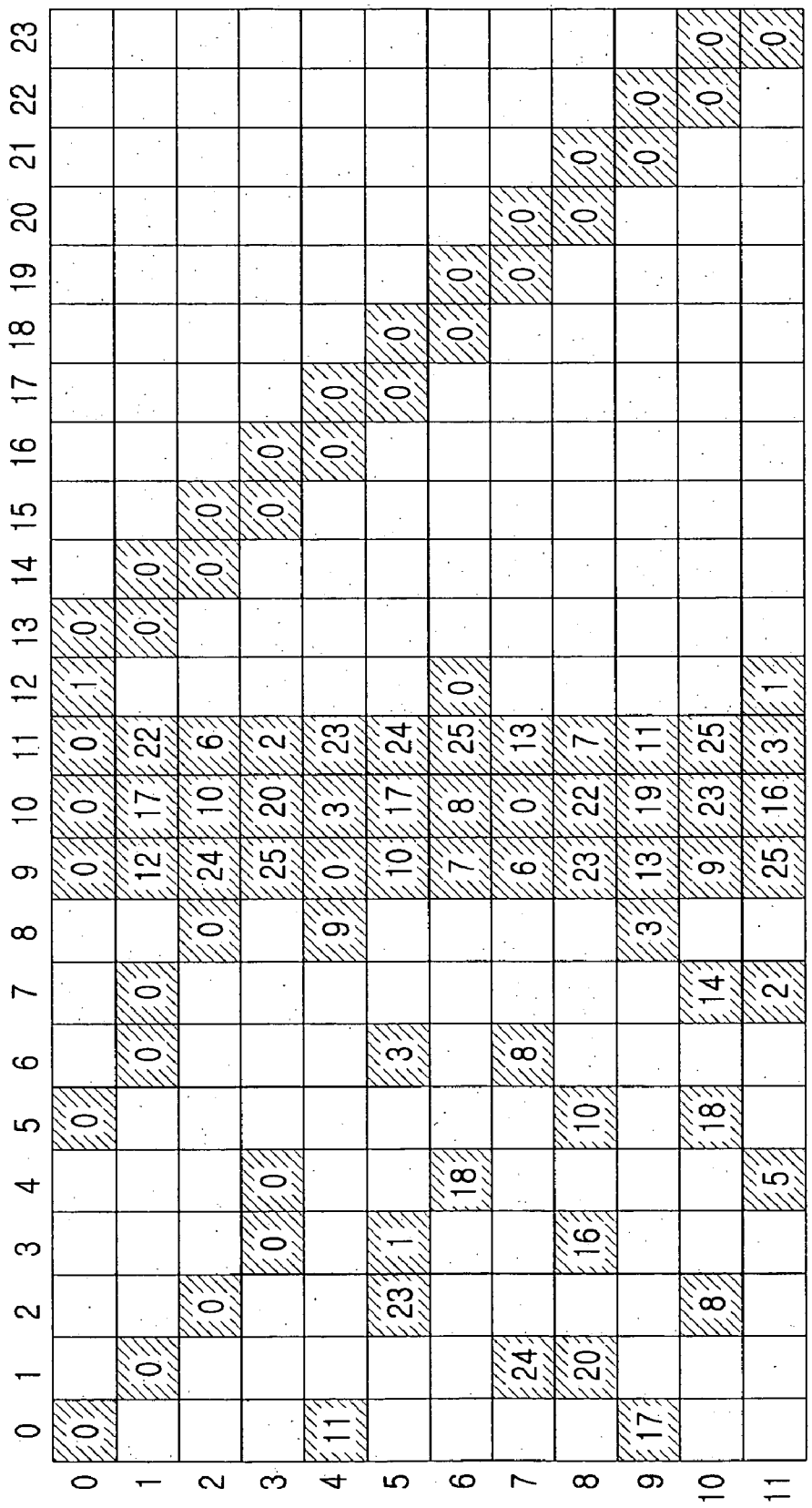
FIG. 33 is a diagram illustrating a parity check matrix of a variable-length block LDPC code according to a twentieth embodiment of the present invention.

FIG. 33 is a diagram illustrating a parity check matrix of a variable-length block LDPC code according to a twentieth embodiment of the present invention. Before a description of FIG. 33 is given, it should be noted that the twentieth embodiment of the present invention provides a parity check matrix of a variable-length block LDPC code for a coding rate of ½. Referring to FIG. 33, it is possible to generate a block LDPC code of length of $24N_s$ according to a size of $N_s$ of a partial matrix, using the parity check matrix illustrated in FIG. 33. A value written in each of the partial blocks, i.e. the partial matrixes, illustrated in FIG. 33 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 34, a description will be made of a detailed method for generating a variable-length block LDPC code for a coding rate of ½.

Figure 34:
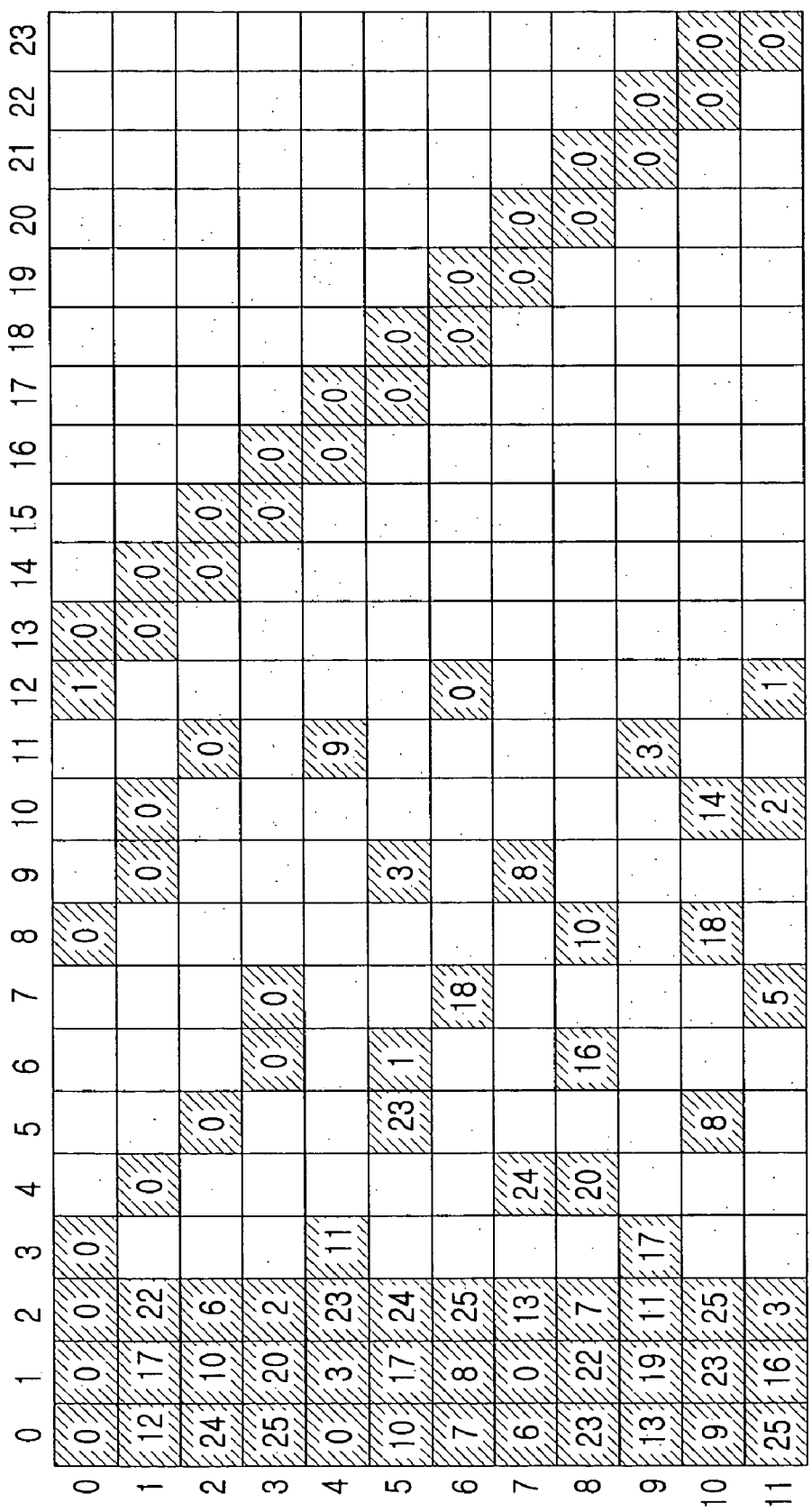
FIG. 34 is a diagram illustrating a parity check matrix of a variable-length block LDPC code according to a twenty-first embodiment of the present invention.

FIG. 34 is a diagram illustrating a parity check matrix of a variable-length block LDPC code according to a twenty-first embodiment of the present invention. Before a description of FIG. 34 is given, it should be noted that the twenty-first embodiment of the present invention provides a parity check matrix of a variable-length block LDPC code for a coding rate of ½. Referring to FIG. 34, it is possible to generate a block LDPC code of length of $24N_s$ according to a size of $N_s$ of a partial matrix, using the parity check matrix illustrated in FIG. 34. A value written in each of the partial blocks, i.e. the partial matrixes, illustrated in FIG. 34 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Next, with reference to FIG. 35, a description will be made of a detailed method for generating a variable-length block LDPC code for a coding rate of ½.

Figure 35:
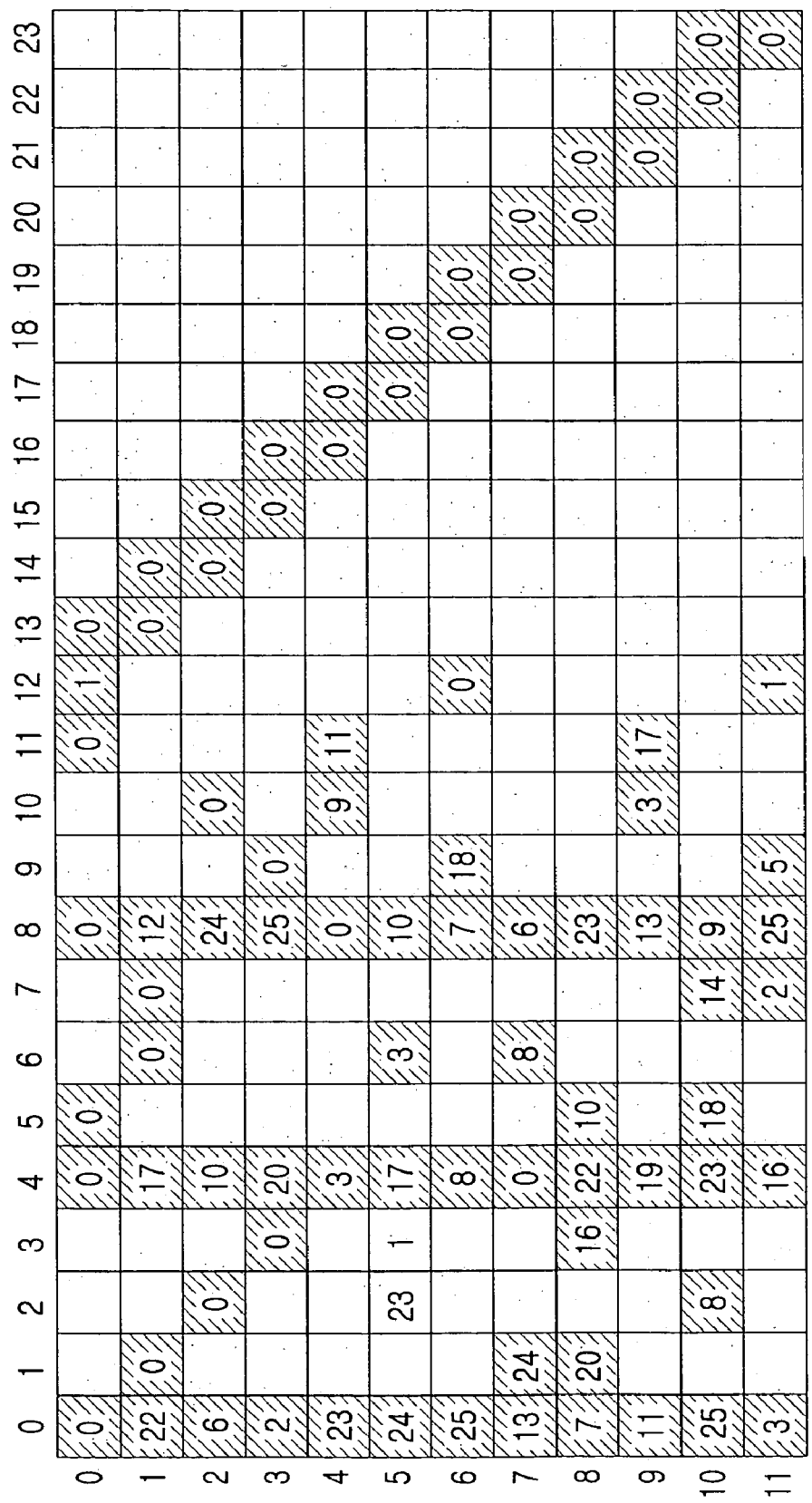
FIG. 35 is a diagram illustrating a parity check matrix of a variable-length block LDPC code according to a twenty-second embodiment of the present invention.

FIG. 35 is a diagram illustrating a parity check matrix of a variable-length block LDPC code according to a twenty-second embodiment of the present invention. Before a description of FIG. 35 is given, it should be noted that the twenty-second embodiment of the present invention provides a parity check matrix of a variable-length block LDPC code for a coding rate of ½. Referring to FIG. 35, it is possible to generate a block LDPC code of length of $24N_s$ according to a size of $N_s$ of a partial matrix, using the parity check matrix illustrated in FIG. 35. A value written in each of the partial blocks, i.e. the partial matrixes, illustrated in FIG. 35 represents an exponent value of a corresponding permutation matrix. Therefore, by performing a modulo-$N_s$ operation (where $N_s$ corresponds to a size of the partial matrix) on the exponent value of the permutation matrix, it is possible to calculate a permutation matrix exponent value of the parity check matrix for the block LDPC code having the $N_s$ value. If a result value obtained by performing a modulo-$N_s$ operation on an exponent of a permutation matrix is 0, the corresponding permutation matrix becomes an identity matrix.

Also, it is possible to make other parity check matrices based on the form of the parity check matrices described from the first embodiment of the present invention to the twenty-second embodiment of the present invention, by permutation of the parity check matrices described above for of the present invention.

All of the LDPC-family codes can be decoded in a factor graph using a sub-product algorithm. A decoding scheme of the LDPC code can be roughly divided into a bidirectional transfer scheme and a flow transfer scheme. When a decoding operation is performed using the bidirectional transfer scheme, each check node has a node processor, increasing decoding complexity in proportion to the number of the check nodes. However, because all of the check nodes are simultaneously updated, the decoding speed increases remarkably.

Unlike this, the flow transfer scheme has a single node processor, and the node processor updates information, passing through all of the nodes in a factor graph. Therefore, the flow transfer scheme is lower in decoding complexity, but an increase in size of the parity check matrix, i.e. an increase in number of nodes, causes a decrease in the decoding speed.

However, if a parity check matrix is generated per block like the variable-length block LDPC code having various block lengths according to coding rates, disclosed in the present invention, then a number of node processors equal to the number of blocks constituting the parity check matrix are used. In this case, it is possible to implement a decoder which is lower than the bidirectional transfer scheme in the decoding complexity and higher than the flow transfer scheme in the decoding speed.

Next, with reference to the block diagram of FIG. 17, a description will be made of an internal structure of a decoding apparatus for decoding a variable-length block LDPC code using a parity check matrix according to an embodiment of the present invention.

Figure 17:
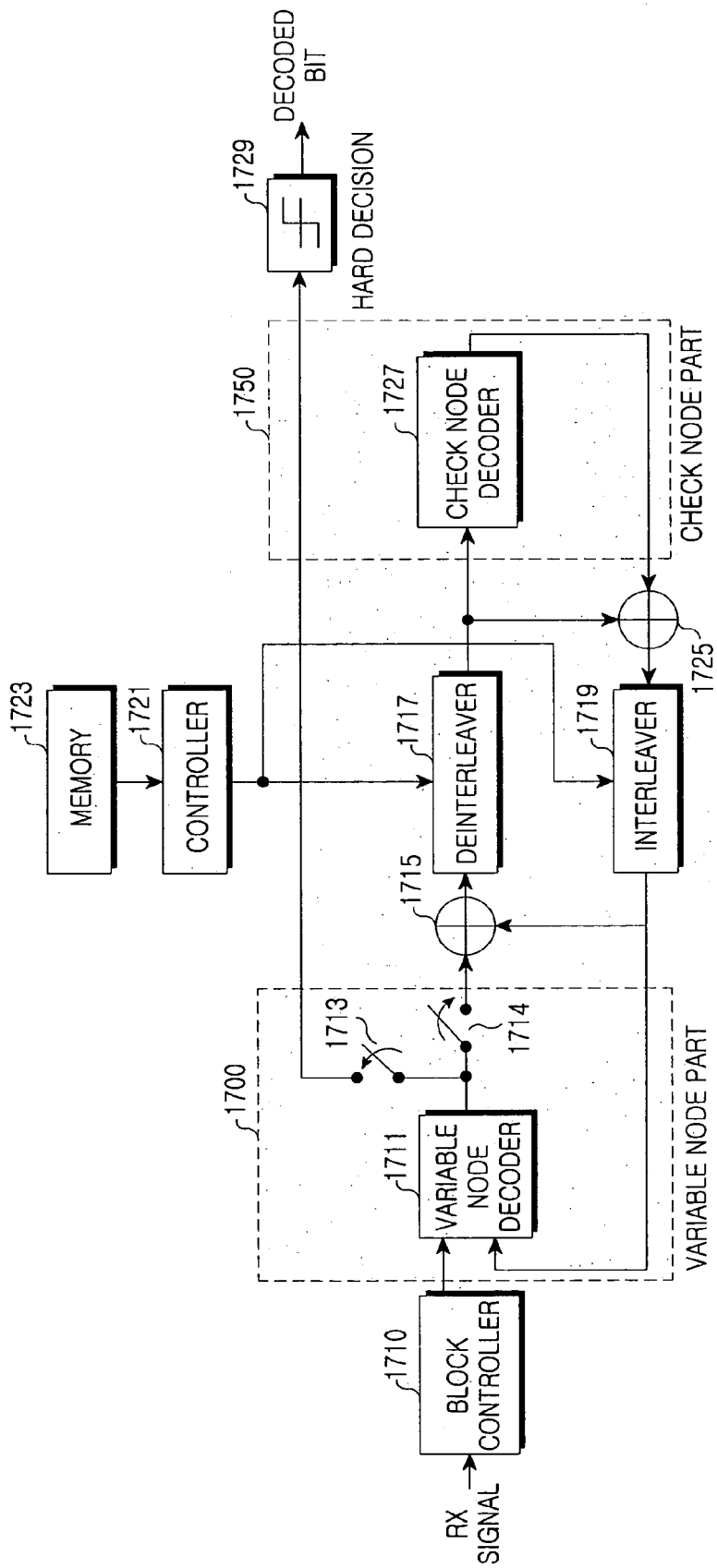
FIG. 17 is a block diagram illustrating an internal structure of an apparatus for decoding a block LDPC code according to the present invention.

Referring to FIG. 17, the decoding apparatus for decoding a variable-length block LDPC code includes a block controller 1710, a variable node part 1700, an adder 1715, a deinterleaver 1717, an interleaver 1719, a controller 1721, a memory 1723, an adder 1725, a check node part 1750, and a hard decider 1729. The variable node part 1700 includes a variable node decoder 1711 and switches 1713 and 1714, and the check node part 1750 includes a check node decoder 1727.

A signal received over a radio channel is input to the block controller 1710. The block controller 1710 determines a block size of the received signal. If there is an information word part punctured in a coding apparatus corresponding to the decoding apparatus, the block controller 1710 inserts '0' into the punctured information word part to adjust the full block size, and outputs the resultant signal to the variable node decoder 1711.

The variable node decoder 1711 calculates probability values of the signal output from the block controller 1710, updates the calculated probability values, and outputs the updated probability values to the switches 1713 and 1714. The variable node decoder 1711 connects the variable nodes according to a parity check matrix previously set in the decoding apparatus for an irregular block LDPC code, and performs an update operation on as many input values and output values as the number of Is connected to the variable nodes. The number of Is connected to the variable nodes is equal to a weight of each of the columns constituting the parity check matrix. An internal operation of the variable node decoder 1711 differs according to a weight of each of the columns constituting the parity check matrix. Except when the switch 1713 is switched on, the switch 1714 is switched on to output the output signal of the variable node decoder 1711 to the adder 1715.

The adder 1715 receives a signal output from the variable node decoder 1711 and an output signal of the interleaver 1719 in a previous iterative decoding process, subtracts the output signal of the interleaver 1719 in the previous iterative decoding process from the output signal of the variable node decoder 1711, and outputs the subtraction result to the deinterleaver 1717. If the decoding process is an initial decoding process, it should be regarded that the output signal of the interleaver 1719 is 0.

The deinterleaver 1717 deinterleaves the signal output from the adder 1715 according to a predetermined deinterleaving scheme, and outputs the deinterleaved signal to the adder 1725 and the check node decoder 1727. The deinterleaver 1717 has an internal structure corresponding to the parity check matrix because an output value for an input value of the interleaver 1719 corresponding to the deinterleaver 1717 is different according to a position of elements having a value of 1 in the parity check matrix.

The adder 1725 receives an output signal of the check node decoder 1727 in a previous iterative decoding process and an output signal of the deinterleaver 1717, subtracts the output signal of the deinterleaver 1717 from the output signal of the check node decoder 1727 in the previous iterative decoding process, and outputs the subtraction result to the interleaver 1719. The check node decoder 1727 connects the check nodes according to a parity check matrix previously set in the decoding apparatus for the block LDPC code, and performs an update operation on a number of input values and output values equal to the number of 1s connected to the check nodes. The number of 1s connected to the check nodes is equal to a weight of each of rows constituting the parity check matrix. Therefore, an internal operation of the check node decoder 1727 is different according to a weight of each of the rows constituting the parity check matrix.

The interleaver 1719, under the control of the controller 1721, interleaves the signal output from the adder 1725 according to a predetermined interleaving scheme, and outputs the interleaved signal to the adder 1715 and the variable node decoder 1711. The controller 1721 reads the interleaving scheme-related information previously stored in the memory 1723, and controls an interleaving scheme of the interleaver 1719 and a deinterleaving scheme of the deinterleaver 1717 according to the read interleaving/deinterleaving scheme information. Because the memory 1723 stores only a mother matrix with which the variable-length block LDPC code can be generated, the controller 1721 reads the mother matrix stored in the memory 1723 and generates the exponents of the permutation matrixes constituting a corresponding child matrix using a size $N_s'$ of a permutation matrix corresponding to a predetermined block size. In addition, the controller 1721 controls an interleaving scheme of the interleaver 1719 and a deinterleaving scheme of the deinterleaver 1717 using the generated child matrix. Likewise, if the decoding process is an initial decoding process, it should be regarded that the output signal of the deinterleaver 1717 is 0.

By iteratively performing the foregoing processes, the decoding apparatus performs error-free reliable decoding. After the iterative decoding is performed a predetermined number of times, the switch 1714 switches off a connection between the variable node decoder 1711 and the adder 1715, and the switch 1713 switches on a connection between the variable node decoder 1711 and the hard decider 1729 to provide the signal output from the variable node decoder 1711 to the hard decider 1729. The hard decider 1729 performs a hard decision on the signal output from the variable node decoder 1711, and outputs the hard decision result, and the output value of the hard decider 1729 becomes a finally decoded value.

As can be appreciated from the foregoing description, the present invention provides a variable-length block LDPC code of which a minimum cycle length is maximized in a mobile communication system, thereby maximizing an error correction capability and thus improving the system performance. In addition, the present invention generates an efficient parity check matrix, thereby minimizing decoding complexity of a variable-length block LDPC code. Moreover, the present invention designs a variable-length block LDPC code such that decoding complexity thereof is in proportion to a block length thereof, thereby enabling efficient coding. In particular, the present invention generates a block LDPC code which is applicable to various coding rates and has various block lengths, thereby contributing to the minimization of hardware complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for coding a block low density parity check (LDPC) code, the method comprising:
   coding an information word into a block LDPC code based on one of a first parity check matrix and a second parity check matrix depending on a length to be applied when generating the information word into the block LDPC code,
   wherein the first parity check matrix is a parity check matrix generated such that the block LDPC code has a predetermined length, and is satisfied with a predetermined coding rate, and
   wherein the first parity check matrix includes a predetermined number of partial blocks, each of the partial blocks having a predetermined size.

2. The method of claim 1, wherein the second parity check matrix is a parity check matrix defined by varying a size of the first parity check matrix.

3. The method of claim 1, wherein a predetermined permutation matrix is mapped to each of the partial blocks on a one-to-one basis.

4. The method of claim 3, wherein the second parity check matrix is a parity check matrix generated by determining exponents of non-zero permutation matrices among permutation matrices of the second parity check matrix according to exponents of non-zero permutation matrices among permutation matrices of the first parity check matrix and a size of partial blocks of the second parity check matrix.

5. The method of claim 3, wherein the second parity check matrix has a relation defined by $$a_i' = a_i \bmod N_s' \text{ (for } 1 \leq i \leq L)$$

where $a_1, a_2, a_L$ denote exponents of L non-zero permutation matrices among permutation matrices of the first parity check matrix, $N_s \times N_s$ ($N_s$) denotes a size of partial blocks of the first parity check matrix, $a_1', a_2', \ldots, a_L'$ denote exponents of L non-zero permutation matrices among permutation matrices of the second parity check matrix, $N_s' \times N_s'$ ($N_s'$) denotes a size of partial blocks of the second parity check matrix, and 'mod' denotes a modulo operation.

6. The method of claim 5, wherein coding the information word into a block LDPC code comprises:
   determining one of the first parity check matrix and the second parity check matrix according to length;
   generating a first signal by multiplying the information word by a first partial matrix of the determined parity check matrix;
   generating a second signal by multiplying the information word by a second partial matrix of the determined parity check matrix;
   generating a third signal by multiplying the first signal by a matrix multiplication of a third partial matrix and an inverse matrix of a fourth partial matrix of the determined parity check matrix;
   generating a fourth signal by adding the second signal to the third signal;
   generating a fifth signal by multiplying the fourth signal by a fifth partial matrix of the determined parity check matrix;
   generating a sixth signal by adding the second signal to the fifth signal;
   generating a seventh signal by multiplying the sixth signal by the inverse matrix of the fourth matrix of the determined parity check matrix; and
   multiplexing the information word, the fourth signal defined as a first parity, and the seventh signal defined as a second parity such that the information word, the first parity and the second parity are mapped to the block LDPC code.

7. The method of claim 6, wherein the first partial matrix and the second partial matrix are partial matrices mapped to an information part associated with an information word in the determined parity check matrix.

8. The method of claim 7, wherein the third partial matrix and the fourth partial matrix are partial matrices mapped to a first parity part associated with a parity, and the fifth partial matrix and the sixth partial matrix are partial matrices mapped to a second parity part associated with the parity.

9. The method of claim 1, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | | | 0 | | 0 | | 0 | | | 0 | 1 | 0 | | | | | | | | | | | |
| 1 | | 0 | | 12 | | | 0 | 17 | | 0 | 22 | | 0 | 0 | | | | | | | | | | |
| 2 | | | 0 | 24 | | | 10 | 0 | | 6 | | | 0 | 0 | | | | | | | | | | |
| 3 | | | | 25 | 0 | | 20 | 0 | | 2 | | | | 0 | 0 | | | | | | | | | |
| 4 | 11 | | | 0 | | | 3 | 9 | | 23 | | | | | 0 | 0 | | | | | | | | |
| 5 | | | 23 | 10 | | | 3 | 17 | 1 | 24 | | | | | | 0 | 0 | | | | | | | |
| 6 | | | 7 | 18 | | | 8 | | | 25 | 0 | | | | | | 0 | 0 | | | | | | |
| 7 | | 24 | 6 | | | 8 | 0 | | | 13 | | | | | | | | 0 | 0 | | | | | |
| 8 | | 20 | 23 | | 10 | | 22 | 16 | | 7 | | | | | | | | | 0 | 0 | | | | |
| 9 | 17 | | 13 | | | | 19 | 3 | | 11 | | | | | | | | | | 0 | 0 | | | |
| 10 | | | 8 | 9 | | 18 | 23 | | | 14 | 25 | | | | | | | | | | 0 | 0 | | |
| 11 | | | | 25 | 5 | | 16 | | | 2 | 3 | 1 | | | | | | | | | | | | 0 |

(60)

where blocks represent the partial blocks, numbers represent exponents of corresponding permutation matrices, and blocks with no number represent partial blocks to which zero matrices are mapped.

10. The method of claim 1, wherein the first parity check matrix is expressed as

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|----|---|---|---|---|---|---|---|---|---|---|----|----|----|----|----|----|----|----|----|----|----|----|----|----|
| 0  | 0 |   |   |   | 0 |   |   |   | 0 | 0 | 0  | 1  | 0  |    |    |    |    |    |    |    |    |    |    |    |
| 1  |   | 0 |   |   |   | 0 | 0 |   | 12| 17| 22 |    | 0  | 0  |    |    |    |    |    |    |    |    |    |    |
| 2  |   |   | 0 |   |   |   |   | 0 | 24| 10| 6  |    |    | 0  | 0  |    |    |    |    |    |    |    |    |    |
| 3  |   |   |   | 0 | 0 |   |   |   | 25| 20| 2  |    |    |    | 0  | 0  |    |    |    |    |    |    |    |    |
| 4  | 11|   |   |   |   |   |   |   | 9 | 0 | 3  | 23 |    |    |    | 0  | 0  |    |    |    |    |    |    |    |
| 5  |   |   | 23| 1 |   |   | 3 |   | 10| 17| 24 |    |    |    |    |    | 0  | 0  |    |    |    |    |    |    |
| 6  |   |   |   |   | 18|   |   |   | 7 | 8 | 25 | 0  |    |    |    |    |    | 0  | 0  |    |    |    |    |    |
| 7  |   | 24|   |   |   |   | 8 |   | 6 | 0 | 13 |    |    |    |    |    |    |    | 0  | 0  |    |    |    |    |
| 8  |   | 20|   | 16|   | 10|   |   | 23| 22| 7  |    |    |    |    |    |    |    |    | 0  | 0  |    |    |    |
| 9  | 17|   |   |   |   |   |   | 3 | 13| 19| 11 |    |    |    |    |    |    |    |    |    | 0  | 0  |    |    |
| 10 |   |   | 8 |   |   | 18|   | 14| 9 | 23| 25 |    |    |    |    |    |    |    |    |    |    | 0  | 0  |    |
| 11 |   |   |   |   | 5 |   |   | 2 | 25| 16| 3  | 1  |    |    |    |    |    |    |    |    |    |    |    | 0  | where blocks represent the partial blocks, numbers represent exponents of corresponding permutation matrices, and blocks with no number represent partial blocks to which zero matrices are mapped.

11. The method of claim 1, wherein the first parity check matrix is expressed as

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|----|---|---|---|---|---|---|---|---|---|---|----|----|----|----|----|----|----|----|----|----|----|----|----|----|
| 0  | 0 | 0 | 0 | 0 |   |   |   |   | 0 |   |    |    | 1  | 0  |    |    |    |    |    |    |    |    |    |    |
| 1  | 12| 17| 22|   | 0 |   |   | 0 | 0 |   |    | 0  | 0  |    |    |    |    |    |    |    |    |    |    |    |
| 2  | 24| 10| 6 |   |   | 0 |   |   |   | 0 |    | 0  | 0  |    |    |    |    |    |    |    |    |    |    |    |
| 3  | 25| 20| 2 |   |   |   | 0 | 0 |   |   |    |    | 0  | 0  |    |    |    |    |    |    |    |    |    |    |
| 4  | 0 | 3 | 23| 11|   |   |   |   |   | 9 |    |    |    | 0  | 0  |    |    |    |    |    |    |    |    |    |
| 5  | 10| 17| 24|   | 23| 1 |   | 3 |   |   |    |    |    |    | 0  | 0  |    |    |    |    |    |    |    |    |
| 6  | 7 | 8 | 25|   |   | 18|   |   |   | 0 |    |    |    |    |    | 0  | 0  |    |    |    |    |    |    |    |
| 7  | 6 | 0 | 13| 24|   |   |   | 8 |   |   |    |    |    |    |    |    | 0  | 0  |    |    |    |    |    |    |
| 8  | 23| 22| 7 |   | 20| 16| 10|   |   |   |    |    |    |    |    |    |    | 0  | 0  |    |    |    |    |    |
| 9  | 13| 19| 11| 17|   |   |   |   |   | 3 |    |    |    |    |    |    |    |    | 0  | 0  |    |    |    |    |
| 10 | 9 | 23| 25|   |   | 8 |   | 18| 14|   |    |    |    |    |    |    |    |    |    | 0  | 0  |    |    |    |
| 11 | 25| 16| 3 |   |   |   | 5 |   | 2 |   | 1  |    |    |    |    |    |    |    |    |    |    |    |    | 0  | where blocks represent the partial blocks, numbers represent exponents of corresponding permutation matrices, and blocks with no number represent partial blocks to which zero matrices are mapped.

12. The method of claim 1, wherein the first parity check matrix is expressed as

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|----|---|---|---|---|---|---|---|---|---|---|----|----|----|----|----|----|----|----|----|----|----|----|----|----|
| 0  | 0 |   |   | 0 | 0 |   | 0 |   |   | 0 |    | 0  | 1  | 0  |    |    |    |    |    |    |    |    |    |    |
| 1  | 22| 0 |   | 17|   | 0 | 0 | 12|   |   |    | 0  | 0  |    |    |    |    |    |    |    |    |    |    |    |
| 2  | 6 |   | 0 | 10|   |   | 24|   | 0 |   |    | 0  | 0  |    |    |    |    |    |    |    |    |    |    |    |
| 3  | 2 |   |   | 20|   |   | 25| 0 |   |   |    |    | 0  | 0  |    |    |    |    |    |    |    |    |    |    |
| 4  | 23|   |   | 3 |   |   | 0 |   | 9 | 11|    |    |    | 0  | 0  |    |    |    |    |    |    |    |    |    |
| 5  | 24| 23| 1 | 17|   | 3 | 10|   |   |   |    |    |    |    | 0  | 0  |    |    |    |    |    |    |    |    |
| 6  | 25|   |   | 8 |   |   | 7 | 18|   | 0 |    |    |    |    |    | 0  | 0  |    |    |    |    |    |    |    |
| 7  | 13| 24|   | 0 |   | 8 | 6 |   |   |   |    |    |    |    |    |    | 0  | 0  |    |    |    |    |    |    |
| 8  | 7 | 20|   | 16| 22| 10| 23|   |   |   |    |    |    |    |    |    |    | 0  | 0  |    |    |    |    |    |
| 9  | 11|   |   | 19|   |   | 13|   | 3 | 17|    |    |    |    |    |    |    |    | 0  | 0  |    |    |    |    |
| 10 | 25|   | 8 | 23| 18| 14| 9 |   |   |   |    |    |    |    |    |    |    |    |    | 0  | 0  |    |    |    |
| 11 | 3 |   |   | 16|   |   | 2 | 25| 5 |   |    | 1  |    |    |    |    |    |    |    |    |    |    |    | 0  | where blocks represent the partial blocks, numbers represent exponents of corresponding permutation matrices, and blocks with no number represent partial blocks to which zero matrices are mapped.

13. An apparatus for coding a block low density parity check (LDPC) code, the apparatus comprising:

an encoder for coding an information word into a block LDPC code based on one of a first parity check matrix and a second parity check matrix depending on a length to be applied when generating the information word into the block LDPC code, wherein the first parity check matrix is a parity check matrix generated such that the block LDPC code has a predetermined length, and is satisfied with a predetermined coding rate, and wherein the first parity check matrix includes a predetermined number of partial blocks, each of the partial blocks having a predetermined size.

14. The apparatus of claim 13, wherein the second parity check matrix is a parity check matrix defined by varying a size of the first parity check matrix.

15. The apparatus of claim 13, wherein a predetermined permutation matrix is mapped to each of the partial blocks on a one-to-one basis.

16. The apparatus of claim 15, wherein the second parity check matrix is a parity check matrix generated by determining exponents of non-zero permutation matrices among permutation matrices of second parity check matrix according to exponents of non-zero permutation matrices among permutation matrices of the first parity check matrix and a size of partial blocks of the second parity check matrix.

17. The apparatus of claim 15, wherein the second parity check matrix has a relation defined by $$a_i' = a_i \bmod N_s' \text{ (for } 1 \leq i \leq L\text{)}$$

where $a_1, a_2, \ldots, a_L$ denote exponents of L non-zero permutation matrices among permutation matrices of the first parity check matrix, $N_s \times N_s$ ($N_s$) denotes a size of partial blocks of the first parity check matrix, $a_1', a_2', \ldots, a_L'$ denote exponents of L non-zero permutation matrices among permutation matrices of the second parity check matrix, $N_s' \times N_s'$ ($N_s'$) denotes a size of partial blocks of the second parity check matrix, and 'mod' denotes a modulo operation.

18. The apparatus of claim 17, wherein the encoder comprises:

a controller for determining one of the first parity check matrix and the second parity check matrix according to length;

a first matrix multiplier for multiplying the information word by a first partial matrix of the determined parity check matrix;

a second matrix multiplier for multiplying the information word by a second partial matrix of the determined parity check matrix;

a third matrix multiplier for multiplying a signal output from the first matrix multiplier by a matrix multiplication of a third partial matrix and an inverse matrix of a fourth partial matrix of the determined parity check matrix;

a first adder for adding a signal output from the second matrix multiplier to a signal output from the third matrix multiplier;

a fourth matrix multiplier for multiplying a signal output from the first adder by a fifth partial matrix of the determined parity check matrix;

a second adder for adding the signal output from the second matrix multiplier to a signal output from the fourth matrix multiplier;

a fifth matrix multiplier for multiplying the signal output from the second matrix multiplier by the inverse matrix of the fourth matrix of the determined parity check matrix; and a plurality of switches for multiplexing the information word, the fourth signal defined as a first parity, and the seventh signal defined as a second parity such that the information word, the first parity and the second parity are mapped to the block LDPC code.

19. The apparatus of claim 18, wherein the first partial matrix and the second partial matrix are partial matrices mapped to an information part associated with an information word in the determined parity check matrix.

20. The apparatus of claim 19, wherein the third partial matrix and the fourth partial matrix are partial matrices mapped to a first parity part associated with a parity, and the fifth partial matrix and the sixth partial matrix are partial matrices mapped to a second parity part associated with the parity.

21. The apparatus of claim 13, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | | 0 | | 0 | | 0 | | | | 0 | 1 | 0 | | | | | | | | | | | |
| 1 | | 0 | 12 | | | 0 | 17 | | | 0 | 22 | | 0 | 0 | | | | | | | | | | |
| 2 | | | 0 | 24 | | | 10 | 0 | | | 6 | | | 0 | 0 | | | | | | | | | |
| 3 | | | | 25 | 0 | | 20 | | 0 | | 2 | | | | 0 | 0 | | | | | | | | |
| 4 | 11 | | | 0 | | | 3 | 9 | | | 23 | | | | | 0 | 0 | | | | | | | |
| 5 | | 23 | 10 | | | 3 | 17 | | 1 | | 24 | | | | | | 0 | 0 | | | | | | |
| 6 | | | 7 | 18 | | | 8 | | | | 25 | 0 | | | | | | 0 | 0 | | | | | |
| 7 | | 24 | 6 | | | 8 | 0 | | | | 13 | | | | | | | | 0 | 0 | | | | |
| 8 | | 20 | 23 | | 10 | | 22 | | 16 | | 7 | | | | | | | | | 0 | 0 | | | |
| 9 | 17 | | 13 | | | | 19 | 3 | | | 11 | | | | | | | | | | 0 | 0 | | |
| 10 | | 8 | 9 | | 18 | | 23 | | | | 14 | 25 | | | | | | | | | | 0 | 0 | |
| 11 | | | 25 | 5 | | | 16 | | | | 2 | 3 | 1 | | | | | | | | | | | 0 | where blocks represent the partial blocks, numbers represent exponents of corresponding permutation matrices, and blocks with no number represent partial blocks to which zero matrices are mapped.

22. The apparatus of claim 13, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | | | | 0 | | | | 0 | 0 | 0 | 1 | 0 | | | | | | | | | | | |
| 1 | | 0 | | | | 0 | 0 | | | 12 | 17 | 22 | | 0 | 0 | | | | | | | | | |
| 2 | | | 0 | | | | | 0 | | 24 | 10 | 6 | | | 0 | 0 | | | | | | | | |
| 3 | | | | 0 | 0 | | | | | 25 | 20 | 2 | | | | 0 | 0 | | | | | | | |
| 4 | 11 | | | | | | | | 9 | 0 | 3 | 23 | | | | | 0 | 0 | | | | | | |
| 5 | | | 23 | 1 | | | 3 | | | 10 | 17 | 24 | | | | | | 0 | 0 | | | | | |
| 6 | | | | | 18 | | | | | 7 | 8 | 25 | 0 | | | | | | 0 | 0 | | | | |
| 7 | | 24 | | | | | 8 | | | 6 | 0 | 13 | | | | | | | | 0 | 0 | | | |
| 8 | | 20 | 16 | 10 | | | | | | 23 | 22 | 7 | | | | | | | | | 0 | 0 | | |
| 9 | 17 | | | | | | | 3 | | 13 | 19 | 11 | | | | | | | | | | 0 | 0 | |
| 10 | | | 8 | | | 18 | | 14 | | 9 | 23 | 25 | | | | | | | | | | | 0 | 0 |
| 11 | | | | 5 | | | 2 | | | 25 | 16 | 3 | 1 | | | | | | | | | | | 0 | where blocks represent the partial blocks, numbers represent exponents of corresponding permutation matrices, and blocks with no number represent partial blocks to which zero matrices are mapped.

23. The apparatus of claim 13, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | 0 | 0 | 0 | | | | 0 | | | | 1 | 0 | | | | | | | | | | | |
| 1 | 12 | 17 | 22 | | 0 | | | | 0 | 0 | | | 0 | 0 | | | | | | | | | | |
| 2 | 24 | 10 | 6 | | | 0 | | | | | 0 | | | 0 | 0 | | | | | | | | | |
| 3 | 25 | 20 | 2 | | | | 0 | 0 | | | | | | | 0 | 0 | | | | | | | | |
| 4 | 0 | 3 | 23 | 11 | | | | | | 9 | | | | | | 0 | 0 | | | | | | | |
| 5 | 10 | 17 | 24 | | | 23 | 1 | | 3 | | | | | | | | 0 | 0 | | | | | | |
| 6 | 7 | 8 | 25 | | | | 18 | | | | 0 | | | | | | | 0 | 0 | | | | | |
| 7 | 6 | 0 | 13 | | 24 | | | | 8 | | | | | | | | | | 0 | 0 | | | | |
| 8 | 23 | 22 | 7 | | 20 | 16 | 10 | | | | | | | | | | | | | 0 | 0 | | | |
| 9 | 13 | 19 | 11 | 17 | | | | 3 | | | | | | | | | | | | | 0 | 0 | | |
| 10 | 9 | 23 | 25 | | | 8 | | 18 | 14 | | | | | | | | | | | | | 0 | 0 | |
| 11 | 25 | 16 | 3 | | | | 5 | | 2 | 1 | | | | | | | | | | | | | | 0 | where blocks represent the partial blocks, numbers represent exponents of corresponding permutation matrices, and blocks with no number represent partial blocks to which zero matrices are mapped.

24. The apparatus of claim 13, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | | | 0 | 0 | | 0 | | | 0 | 1 | 0 | | | | | | | | | | | | |
| 1 | 22 | 0 | | 17 | | 0 | 0 | 12 | | | 0 | 0 | | | | | | | | | | | | |
| 2 | 6 | | 0 | | 10 | | | 24 | 0 | | | 0 | 0 | | | | | | | | | | | |
| 3 | 2 | | | 0 | 20 | | | 25 | 0 | | | | 0 | 0 | | | | | | | | | | |
| 4 | 23 | | | 3 | | | | 0 | 9 | 11 | | | | 0 | 0 | | | | | | | | | |
| 5 | 24 | 23 | 1 | 17 | | 3 | | 10 | | | | | | | 0 | 0 | | | | | | | | |
| 6 | 25 | | | 8 | | | | 7 | 18 | | 0 | | | | | 0 | 0 | | | | | | | |
| 7 | 13 | 24 | | 0 | | 8 | | 6 | | | | | | | | | 0 | 0 | | | | | | |
| 8 | 7 | 20 | | 16 | 22 | 10 | | 23 | | | | | | | | | | 0 | 0 | | | | | |
| 9 | 11 | | | 19 | | | | 13 | | 3 | 17 | | | | | | | | 0 | 0 | | | | |
| 10 | 25 | | 8 | | 23 | 18 | 14 | 9 | | | | | | | | | | | | 0 | 0 | | | |
| 11 | 3 | | | 16 | | | 2 | 25 | 5 | | | 1 | | | | | | | | | | | | 0 | where blocks represent the partial blocks, numbers represent exponents of corresponding permutation matrices, and blocks with no number represent partial blocks to which zero matrices are mapped.

25. A method for decoding a block low density parity check (LDPC) code, the method comprising:

receiving a signal; and decoding the received signal according to one of a first parity check matrix and a second parity check matrix according to a length of a block LDPC code to be decoded thereby detecting the block LDPC code, wherein the first parity check matrix is a parity check matrix generated such that the block LDPC code has a predetermined length, and is satisfied with a predetermined coding rate, and wherein the first parity check matrix includes a predetermined number of partial blocks, each of the partial blocks having a predetermined size.

26. The method of claim 25, wherein the second parity check matrix is a parity check matrix defined by varying a size of the first parity check matrix.

27. The method of claim 25, wherein a predetermined permutation matrix is mapped to each of the partial blocks on a one-to-one basis.

28. The method of claim 27, wherein the second parity check matrix is a parity check matrix generated by determining exponents of non-zero permutation matrices among permutation matrices of the second parity check matrix according to exponents of non-zero permutation matrices among permutation matrices of the first parity check matrix and a size of partial blocks of the second parity check matrix.

29. The method of claim 28, wherein the second parity check matrix has a relation defined by $$a_i' = a_i \bmod N_s' \text{ (for } 1 \leq i \leq L)$$

where $a_1, a_2, \ldots, a_L$, denote exponents of L non-zero permutation matrices among permutation matrices of the first parity check matrix, $N_s \times N_s$ ($N_s$) denotes a size of partial blocks of the first parity check matrix, $a_1', a_2', \ldots, a_L'$ denote exponents of L non-zero permutation matrices among permutation matrices of the second parity check matrix, $N_s' \times N_s'$ ($N_s'$) denotes a size of partial blocks of the second parity check matrix, and 'mod' denotes a modulo operation.

30. The method of claim 29, wherein decoding the received signal according to the determined parity check matrix thereby detecting the block LDPC code comprises:
determining a deinterleaving scheme and an interleaving scheme according to the determined parity check matrix;
detecting probability values of the received signal;
generating a first signal by subtracting a signal generated in a previous decoding process from the probability values of the received signal;
deinterleaving the first signal using the deinterleaving scheme;
detecting probability values from the deinterleaved signal;
generating a second signal by subtracting the deinterleaved signal from probability values of the deinterleaved signal; and
interleaving the second signal using the interleaving scheme, and iterative-decoding the interleaved signal thereby detecting the block LDPC code.

31. The method of claim 25, wherein the first parity check matrix is expressed as

|    | 0  | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 |
|----|----|----|----|----|----|----|----|----|----|----|----|----|----|----|----|----|----|----|----|----|----|----|----|----|
| 0  | 0  |    |    | 0  |    | 0  |    | 0  |    |    | 0  | 1  | 0  |    |    |    |    |    |    |    |    |    |    |    |
| 1  |    | 0  |    | 12 |    | 0  | 17 |    |    | 0  | 22 |    | 0  | 0  |    |    |    |    |    |    |    |    |    |    |
| 2  |    |    | 0  | 24 |    |    |    | 10 | 0  |    | 6  |    |    | 0  | 0  |    |    |    |    |    |    |    |    |    |
| 3  |    |    |    | 25 | 0  |    | 20 |    | 0  |    | 2  |    |    |    | 0  | 0  |    |    |    |    |    |    |    |    |
| 4  | 11 |    |    | 0  |    |    | 3  | 9  |    |    | 23 |    |    |    |    | 0  | 0  |    |    |    |    |    |    |    |
| 5  |    | 23 | 10 |    | 3  | 17 |    | 1  |    |    | 24 |    |    |    |    |    | 0  | 0  |    |    |    |    |    |    |
| 6  |    |    | 7  | 18 |    | 8  |    |    |    |    | 25 | 0  |    |    |    |    |    | 0  | 0  |    |    |    |    |    |
| 7  |    | 24 | 6  |    | 8  | 0  |    |    |    |    | 13 |    |    |    |    |    |    |    | 0  | 0  |    |    |    |    |
| 8  |    | 20 | 23 | 10 |    | 22 | 16 |    |    |    | 7  |    |    |    |    |    |    |    |    | 0  | 0  |    |    |    |
| 9  | 17 |    | 13 |    |    | 19 | 3  |    |    |    | 11 |    |    |    |    |    |    |    |    |    | 0  | 0  |    |    |
| 10 |    | 8  | 9  |    | 18 | 23 |    |    |    |    | 14 | 25 |    |    |    |    |    |    |    |    |    | 0  | 0  |    |
| 11 |    |    | 25 | 5  |    | 16 |    |    |    |    | 2  | 3  | 1  |    |    |    |    |    |    |    |    |    |    | 0  | where blocks represent the partial blocks, numbers represent exponents of corresponding permutation matrices, and blocks with no number represent partial blocks to which zero matrices are mapped.

32. The method of claim 25, wherein the first parity check matrix is expressed as

|    | 0  | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 |
|----|----|----|----|----|----|----|----|----|----|----|----|----|----|----|----|----|----|----|----|----|----|----|----|----|
| 0  | 0  |    |    |    | 0  |    |    |    |    | 0  | 0  | 0  | 1  | 0  |    |    |    |    |    |    |    |    |    |    |
| 1  |    | 0  |    |    |    | 0  | 0  |    |    | 12 | 17 | 22 |    | 0  | 0  |    |    |    |    |    |    |    |    |    |
| 2  |    |    | 0  |    |    |    |    | 0  | 24 | 10 | 6  |    |    |    | 0  | 0  |    |    |    |    |    |    |    |    |
| 3  |    |    |    | 0  | 0  |    |    |    |    | 25 | 20 | 2  |    |    |    | 0  | 0  |    |    |    |    |    |    |    |
| 4  | 11 |    |    |    |    |    |    |    | 9  | 0  | 3  | 23 |    |    |    |    | 0  | 0  |    |    |    |    |    |    |
| 5  |    | 23 | 1  |    |    | 3  |    |    |    | 10 | 17 | 24 |    |    |    |    |    | 0  | 0  |    |    |    |    |    |
| 6  |    |    |    | 18 |    |    |    |    |    | 7  | 8  | 25 | 0  |    |    |    |    |    | 0  | 0  |    |    |    |    |
| 7  |    | 24 |    |    |    | 8  |    |    |    | 6  | 0  | 13 |    |    |    |    |    |    |    | 0  | 0  |    |    |    |
| 8  |    | 20 | 16 |    | 10 |    |    |    |    | 23 | 22 | 7  |    |    |    |    |    |    |    |    | 0  | 0  |    |    |
| 9  | 17 |    |    |    |    |    |    |    | 3  | 13 | 19 | 11 |    |    |    |    |    |    |    |    |    | 0  | 0  |    |
| 10 |    | 8  |    |    | 18 |    | 14 |    |    | 9  | 23 | 25 |    |    |    |    |    |    |    |    |    |    | 0  | 0  |
| 11 |    |    |    | 5  |    |    | 2  |    |    | 25 | 16 | 3  | 1  |    |    |    |    |    |    |    |    |    |    | 0  | where blocks represent the partial blocks, numbers represent exponents of corresponding permutation matrices, and blocks with no number represent partial blocks to which zero matrices are mapped.

33. The method of claim 25, wherein the first parity check matrix is expressed as

|    | 0  | 1  | 2  | 3  | 4  | 5 | 6 | 7 | 8 | 9 | 10 | 11 | 12 | 13 | 14 | 15 | 16 | 17 | 18 | 19 | 20 | 21 | 22 | 23 |
|----|----|----|----|----|----|---|---|---|---|---|----|----|----|----|----|----|----|----|----|----|----|----|----|----|
| 0  | 0  | 0  | 0  | 0  |    |   |   |   | 0 |   |    |    | 1  | 0  |    |    |    |    |    |    |    |    |    |    |
| 1  | 12 | 17 | 22 |    | 0  |   |   | 0 | 0 |   |    | 0  | 0  |    |    |    |    |    |    |    |    |    |    |    |
| 2  | 24 | 10 | 6  |    |    | 0 |   |   | 0 |   |    | 0  | 0  |    |    |    |    |    |    |    |    |    |    |    |
| 3  | 25 | 20 | 2  |    |    |   | 0 | 0 |   |   |    | 0  | 0  |    |    |    |    |    |    |    |    |    |    |    |
| 4  | 0  | 3  | 23 | 11 |    |   |   |   | 9 |   |    |    | 0  | 0  |    |    |    |    |    |    |    |    |    |    |
| 5  | 10 | 17 | 24 |    | 23 | 1 |   | 3 |   |   |    |    |    | 0  | 0  |    |    |    |    |    |    |    |    |    |
| 6  | 7  | 8  | 25 |    |    |   | 18|   |   |   | 0  |    |    |    | 0  | 0  |    |    |    |    |    |    |    |    |
| 7  | 6  | 0  | 13 | 24 |    |   |   | 8 |   |   |    |    |    |    |    | 0  | 0  |    |    |    |    |    |    |    |
| 8  | 23 | 22 | 7  |    | 20 | 16| 10|   |   |   |    |    |    |    |    |    | 0  | 0  |    |    |    |    |    |    |
| 9  | 13 | 19 | 11 | 17 |    |   |   |   |   |   | 3  |    |    |    |    |    |    | 0  | 0  |    |    |    |    |    |
| 10 | 9  | 23 | 25 |    | 8  |   | 18| 14|   |   |    |    |    |    |    |    |    |    | 0  | 0  |    |    |    |    |
| 11 | 25 | 16 | 3  |    |    | 5 |   | 2 | 1 |   |    |    |    |    |    |    |    |    |    |    |    |    |    | 0  | where blocks represent the partial blocks, numbers represent exponents of corresponding permutation matrices, and blocks with no number represent partial blocks to which zero matrices are mapped.

34. The method of claim 25, wherein the first parity check matrix is expressed as

|    | 0  | 1  | 2  | 3  | 4  | 5 | 6 | 7 | 8 | 9 | 10 | 11 | 12 | 13 | 14 | 15 | 16 | 17 | 18 | 19 | 20 | 21 | 22 | 23 |
|----|----|----|----|----|----|---|---|---|---|---|----|----|----|----|----|----|----|----|----|----|----|----|----|----|
| 0  | 0  |    |    |    | 0  | 0 |   |   | 0 |   |    | 0  | 1  | 0  |    |    |    |    |    |    |    |    |    |    |
| 1  | 22 | 0  |    |    | 17 |   | 0 | 0 | 12|   |    |    | 0  | 0  |    |    |    |    |    |    |    |    |    |    |
| 2  | 6  |    | 0  |    | 10 |   |   |   | 24|   | 0  |    | 0  | 0  |    |    |    |    |    |    |    |    |    |    |
| 3  | 2  |    |    | 0  | 20 |   |   |   | 25| 0 |    |    | 0  | 0  |    |    |    |    |    |    |    |    |    |    |
| 4  | 23 |    |    |    | 3  |   |   |   | 0 |   | 9  | 11 |    | 0  | 0  |    |    |    |    |    |    |    |    |    |
| 5  | 24 |    | 23 | 1  | 17 |   | 3 |   | 10|   |    |    |    |    | 0  | 0  |    |    |    |    |    |    |    |    |
| 6  | 25 |    |    |    | 8  |   |   | 7 | 18|   |    | 0  |    |    |    | 0  | 0  |    |    |    |    |    |    |    |
| 7  | 13 | 24 |    |    | 0  |   | 8 | 6 |   |   |    |    |    |    |    |    | 0  | 0  |    |    |    |    |    |    |
| 8  | 7  | 20 |    |    | 16 | 22| 10|   | 23|   |    |    |    |    |    |    |    | 0  | 0  |    |    |    |    |    |
| 9  | 11 |    |    |    | 19 |   |   |   | 13|   | 3  | 17 |    |    |    |    |    |    | 0  | 0  |    |    |    |    |
| 10 | 25 |    | 8  |    | 23 | 18|   | 14| 9 |   |    |    |    |    |    |    |    |    |    | 0  | 0  |    |    |    |
| 11 | 3  |    |    |    | 16 |   |   | 2 | 25| 5 |    |    | 1  |    |    |    |    |    |    |    |    |    |    | 0  | where blocks represent the partial blocks, numbers represent exponents of corresponding permutation matrices, and blocks with no number represent partial blocks to which zero matrices are mapped.

35. An apparatus for decoding a block low density parity check (LDPC) the apparatus comprising:

a receiver for receiving a signal; and a decoder for decoding the received signal according to one of a first parity check matrix and a second parity check matrix according to a length of a block LDPC code to be decoded thereby detecting the block LDPC code, wherein the first parity check matrix is a parity check matrix generated such that the block LDPC code has a predetermined length, and is satisfied with a predetermined coding rate, and wherein the first parity check matrix includes a predetermined number of partial blocks, each of the partial blocks having a predetermined size.

36. The apparatus of claim 35, wherein the second parity check matrix is a parity check matrix defined by varying a size of the first parity check matrix.

37. The apparatus of claim 35, wherein a predetermined permutation matrix is mapped to each of the partial blocks on a one-to-one basis.

38. The apparatus of claim 37, wherein the second parity check matrix is a parity check matrix generated by determining exponents of non-zero permutation matrices among permutation matrices of the second parity check matrix according to exponents of non-zero permutation matrices among permutation matrices of the first parity check matrix and a size of partial blocks of the second parity check matrix.

39. The apparatus of claim 37, wherein the second parity check matrix has a relation defined in the following equation $$a_i' = a_i \bmod N_s' \text{ (for } 1 \leq i \leq L)$$

where $a_1, a_2, \ldots, a_L$ denote exponents of L non-zero permutation matrices among permutation matrices of the first parity check matrix, $N_s \times N_s$ ($N_s$) denotes a size of partial blocks of the first parity check matrix, $a_1', a_2', \ldots, a_L'$ denote exponents of L non-zero permutation matrices among permutation matrices of the second parity check matrix, $N_s' \times N_s'$ ($N_s'$) denotes a size of partial blocks of the second parity check matrix, and 'mod' denotes a modulo operation.

40. The apparatus of claim 39, wherein the decoder comprises:

a first controller for determining the first parity check matrix or the second parity check matrix according to a length of the block LDPC code to be decoded;

a variable node decoder for detecting probability values of a received signal by connecting variable nodes according to a weight of each of columns constituting the determined parity check matrix;

a first adder for subtracting a signal generated in a previous decoding process from a signal output from variable node decoder;

a deinterleaver for deinterleaving a signal output from the first adder using a deinterleaving scheme determined according to the determined parity check matrix;

a check node decoder for detecting probability values of a signal output from the deinterleaver by connecting check nodes according to a weight of each of rows constituting the determined parity check matrix;

a second adder for subtracting a signal output from the deinterleaver from a signal output from the check node decoder;

an interleaver for interleaving a signal output from the second adder using an interleaving scheme determined according to the determined parity check matrix, and outputting the interleaved signal to the variable node decoder and the first adder; and a second controller for controlling the deinterleaving scheme and the interleaving scheme according to the determined parity check matrix.

41. The apparatus of claim 35, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 |   |   | 0 |   | 0 |   | 0 |   |   |   | 0 | 1 | 0 |   |   |   |   |   |   |   |   |   |   |
| 1 |   | 0 |   | 12 |   |   | 0 | 17 |   |   | 0 | 22 |   | 0 | 0 |   |   |   |   |   |   |   |   |   |
| 2 |   |   | 0 | 24 |   |   |   | 10 | 0 |   |   | 6 |   |   | 0 | 0 |   |   |   |   |   |   |   |   |
| 3 |   |   | 25 | 0 |   |   |   | 20 |   | 0 |   | 2 |   |   |   | 0 | 0 |   |   |   |   |   |   |   |
| 4 | 11 |   |   | 0 |   |   |   | 3 | 9 |   |   | 23 |   |   |   |   | 0 | 0 |   |   |   |   |   |   |
| 5 |   |   | 23 | 10 |   |   | 3 | 17 |   | 1 |   | 24 |   |   |   |   |   | 0 | 0 |   |   |   |   |   |
| 6 |   |   | 7 |   | 18 |   |   | 8 |   |   |   | 25 | 0 |   |   |   |   |   | 0 | 0 |   |   |   |   |
| 7 |   | 24 | 6 |   |   |   | 8 | 0 |   |   |   | 13 |   |   |   |   |   |   |   | 0 | 0 |   |   |   |
| 8 |   | 20 | 23 |   |   | 10 |   | 22 |   | 16 |   | 7 |   |   |   |   |   |   |   |   | 0 | 0 |   |   |
| 9 | 17 |   | 13 |   |   |   |   | 19 | 3 |   |   | 11 |   |   |   |   |   |   |   |   |   | 0 | 0 |   |
| 10 |   |   | 8 | 9 |   | 18 |   | 23 |   |   | 14 | 25 |   |   |   |   |   |   |   |   |   |   | 0 | 0 |
| 11 |   |   | 25 | 5 |   |   |   | 16 |   |   | 2 | 3 | 1 |   |   |   |   |   |   |   |   |   |   | 0 | where blocks represent the partial blocks, numbers represent exponents of corresponding permutation matrices, and blocks with no number represent partial blocks to which zero matrices are mapped.

42. The apparatus of claim 35, wherein the first parity check matrix is expressed as

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 |   |   |   | 0 |   |   |   |   | 0 | 0 | 0 | 1 | 0 |   |   |   |   |   |   |   |   |   |   |
| 1 |   | 0 |   |   |   |   | 0 | 0 |   | 12 | 17 | 22 |   | 0 | 0 |   |   |   |   |   |   |   |   |   |
| 2 |   |   | 0 |   |   |   |   | 0 |   | 24 | 10 | 6 |   |   | 0 | 0 |   |   |   |   |   |   |   |   |
| 3 |   |   |   | 0 | 0 |   |   |   |   | 25 | 20 | 2 |   |   |   | 0 | 0 |   |   |   |   |   |   |   |
| 4 | 11 |   |   |   |   |   |   |   | 9 | 0 | 3 | 23 |   |   |   |   | 0 | 0 |   |   |   |   |   |   |
| 5 |   |   | 23 | 1 |   |   | 3 |   |   | 10 | 17 | 24 |   |   |   |   |   | 0 | 0 |   |   |   |   |   |
| 6 |   |   |   |   | 18 |   |   |   |   | 7 | 8 | 25 | 0 |   |   |   |   |   | 0 | 0 |   |   |   |   |
| 7 |   | 24 |   |   |   |   | 8 |   |   | 6 | 0 | 13 |   |   |   |   |   |   |   | 0 | 0 |   |   |   |
| 8 |   | 20 |   | 16 |   | 10 |   |   |   | 23 | 22 | 7 |   |   |   |   |   |   |   |   | 0 | 0 |   |   |
| 9 | 17 |   |   |   |   |   |   |   | 3 | 13 | 19 | 11 |   |   |   |   |   |   |   |   |   | 0 | 0 |   |
| 10 |   |   | 8 |   |   | 18 |   | 14 |   | 9 | 23 | 25 |   |   |   |   |   |   |   |   |   |   | 0 | 0 |
| 11 |   |   |   |   | 5 |   |   | 2 |   | 25 | 16 | 3 | 1 |   |   |   |   |   |   |   |   |   |   | 0 | where blocks represent the partial blocks, numbers represent exponents of corresponding permutation matrices, and blocks with no number represent partial blocks to which zero matrices are mapped.

43. The apparatus of claim 35, wherein the first parity check matrix is expressed as

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|----|---|---|---|---|---|---|---|---|---|---|----|----|----|----|----|----|----|----|----|----|----|----|----|----|
| 0  | 0 | 0 | 0 | 0 |   |   |   |   | 0 |   |    |    | 1  | 0  |    |    |    |    |    |    |    |    |    |    |
| 1  | 12| 17| 22|   | 0 |   |   |   | 0 | 0 |    |    | 0  | 0  |    |    |    |    |    |    |    |    |    |    |
| 2  | 24| 10| 6 |   |   | 0 |   |   |   | 0 |    |    | 0  | 0  |    |    |    |    |    |    |    |    |    |    |
| 3  | 25| 20| 2 |   |   |   | 0 | 0 |   |   |    |    |    | 0  | 0  |    |    |    |    |    |    |    |    |    |
| 4  | 0 | 3 | 23| 11|   |   |   |   |   | 9 |    |    |    |    |    | 0  | 0  |    |    |    |    |    |    |    |
| 5  | 10| 17| 24|   |   | 23| 1 |   |   | 3 |    |    |    |    |    |    | 0  | 0  |    |    |    |    |    |    |
| 6  | 7 | 8 | 25|   |   |   |   | 18|   |   | 0  |    |    |    |    |    |    | 0  | 0  |    |    |    |    |    |
| 7  | 6 | 0 | 13| 24|   |   |   |   | 8 |   |    |    |    |    |    |    |    |    | 0  | 0  |    |    |    |    |
| 8  | 23| 22| 7 | 20|   | 16|   | 10|   |   |    |    |    |    |    |    |    |    |    | 0  | 0  |    |    |    |
| 9  | 13| 19| 11| 17|   |   |   |   |   |   |    |    | 3  |    |    |    |    |    |    |    | 0  | 0  |    |    |
| 10 | 9 | 23| 25|   |   | 8 |   | 18|   | 14|    |    |    |    |    |    |    |    |    |    |    | 0  | 0  |    |
| 11 | 25| 16| 3 |   |   |   | 5 |   |   | 2 |    | 1  |    |    |    |    |    |    |    |    |    |    |    | 0  | where blocks represent the partial blocks, numbers represent exponents of corresponding permutation matrices, and blocks with no number represent partial blocks to which zero matrices are mapped.

44. The apparatus of claim 35, wherein the first parity check matrix is expressed as

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|----|---|---|---|---|---|---|---|---|---|---|----|----|----|----|----|----|----|----|----|----|----|----|----|----|
| 0  | 0 |   |   |   | 0 | 0 |   |   | 0 |   |    | 0  | 1  | 0  |    |    |    |    |    |    |    |    |    |    |
| 1  | 22| 0 |   |   | 17|   | 0 | 0 | 12|   |    |    | 0  | 0  |    |    |    |    |    |    |    |    |    |    |
| 2  | 6 |   | 0 |   | 10|   |   |   | 24|   | 0  |    |    | 0  | 0  |    |    |    |    |    |    |    |    |    |
| 3  | 2 |   |   | 0 | 20|   |   |   | 25| 0 |    |    |    |    | 0  | 0  |    |    |    |    |    |    |    |    |
| 4  | 23|   |   |   | 3 |   |   |   | 0 |   | 9  | 11 |    |    |    | 0  | 0  |    |    |    |    |    |    |    |
| 5  | 24| 23| 1 |   | 17|   | 3 |   | 10|   |    |    |    |    |    |    | 0  | 0  |    |    |    |    |    |    |
| 6  | 25|   |   |   | 8 |   |   |   | 7 | 18|    |    | 0  |    |    |    |    | 0  | 0  |    |    |    |    |    |
| 7  | 13| 24|   |   | 0 |   | 8 |   | 6 |   |    |    |    |    |    |    |    |    | 0  | 0  |    |    |    |    |
| 8  | 7 | 20|   | 16| 22| 10|   | 23|   |   |    |    |    |    |    |    |    |    |    | 0  | 0  |    |    |    |
| 9  | 11|   |   |   | 19|   |   |   | 13|   | 3  | 17 |    |    |    |    |    |    |    |    | 0  | 0  |    |    |
| 10 | 25|   | 8 |   | 23| 18|   | 14| 9 |   |    |    |    |    |    |    |    |    |    |    |    | 0  | 0  |    |
| 11 | 3 |   |   |   | 16|   | 2 | 25| 5 |   |    | 1  |    |    |    |    |    |    |    |    |    |    |    | 0  | where blocks represent the partial blocks, numbers represent exponents of corresponding permutation matrices, and blocks with no number represent partial blocks to which zero matrices are mapped.

* * * * *